US011388358B2

(12) United States Patent
Kobayashi

(10) Patent No.: US 11,388,358 B2
(45) Date of Patent: Jul. 12, 2022

(54) IMAGE CAPTURING APPARATUS, IMAGE CAPTURING SYSTEM, MOVING OBJECT, AND CIRCUIT CHIP

(71) Applicant: CANON KABUSHIKI KAISHA, Tokyo (JP)

(72) Inventor: Hideo Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/143,279

(22) Filed: Sep. 26, 2018

(65) Prior Publication Data

US 2019/0104267 A1 Apr. 4, 2019

(30) Foreign Application Priority Data

Sep. 29, 2017 (JP) ............................ JP2017-192052

(51) Int. Cl.

| | |
|---|---|
| ***H04N 5/369*** | (2011.01) |
| ***H04N 5/378*** | (2011.01) |
| ***G06T 7/55*** | (2017.01) |
| ***H04N 5/361*** | (2011.01) |
| ***H01L 27/146*** | (2006.01) |
| ***H04N 5/365*** | (2011.01) |
| ***H04N 5/3745*** | (2011.01) |

(52) U.S. Cl.

CPC ........... *H04N 5/36963* (2018.08); *G06T 7/55* (2017.01); *H01L 27/14634* (2013.01); *H01L 27/14636* (2013.01); *H04N 5/361* (2013.01); *H04N 5/3658* (2013.01); *H04N 5/378* (2013.01); *H04N 5/37455* (2013.01); *G06T 2207/10028* (2013.01); *G06T 2207/30252* (2013.01); *H01L 27/14603* (2013.01)

(58) Field of Classification Search

CPC . G06T 2207/10028; G06T 2207/30252; G06T 7/55; H01L 27/14603; H01L 27/14634; H01L 27/14636; H04N 5/361; H04N 5/3658; H04N 5/36963; H04N 5/37455; H04N 5/378

See application file for complete search history.

(56) References Cited

U.S. PATENT DOCUMENTS 6,608,296 B1 8/2003 Toyoda
2009/0134433 A1 * 5/2009 Jung ................ H01L 27/14603 257/239

(Continued)

FOREIGN PATENT DOCUMENTS

JP 2010-068056 A 3/2010
JP 2012-257095 A 12/2012

(Continued)

*Primary Examiner* — Mohammed S Rahaman

(74) *Attorney, Agent, or Firm* — Canon U.S.A., Inc. IP Division

(57) ABSTRACT

An image capturing apparatus includes a first chip and a second chip which are laminated together. The first chip includes effective pixels disposed in a first row across a plurality of columns, and an optical black pixel disposed in the first row. The second chip includes an AD conversion unit configured to perform an AD conversion on a signal output from the optical black pixel. The AD conversion unit includes a part overlapping, as seen in plan view, with the optical black pixel.

24 Claims, 25 Drawing Sheets

(56) References Cited

U.S. PATENT DOCUMENTS

| | | | | |
|---|---|---|---|---|
| 2010/0134646 | A1* | 6/2010 | Tamura | H01L 27/14623 348/222.1 |
| 2012/0120293 | A1* | 5/2012 | Mabuchi | H01L 27/14632 348/302 |
| 2013/0107093 | A1* | 5/2013 | Aoki | H04N 5/3745 348/302 |
| 2013/0182161 | A1 | 7/2013 | Nakajima | |
| 2015/0116462 | A1* | 4/2015 | Makabe | B60R 1/002 348/47 |
| 2015/0163421 | A1* | 6/2015 | Shigeta | H04N 5/33 348/164 |
| 2015/0189214 | A1* | 7/2015 | Kurose | H01L 27/14612 250/208.1 |
| 2017/0272678 | A1 | 9/2017 | Sakakibara | |
| 2019/0104272 | A1* | 4/2019 | Izuhara | H04N 5/341 |

FOREIGN PATENT DOCUMENTS

| | | | |
|---|---|---|---|
| JP | 2015-126043 | A | 7/2015 |
| JP | 2015-198273 | A | 11/2015 |
| JP | 2016-052132 | A | 4/2016 |
| JP | 2016-171399 | A | 9/2016 |
| JP | 2017-11492 | A | 1/2017 |
| WO | 00/21284 | A1 | 4/2000 |
| WO | 2016/009832 | A1 | 1/2016 |

* cited by examiner

FROM FIG. 8A

IMAGE CAPTURING APPARATUS, IMAGE CAPTURING SYSTEM, MOVING OBJECT, AND CIRCUIT CHIP

BACKGROUND OF THE INVENTION

Field of the Invention

The present disclosure relates to an image capturing apparatus, an image capturing system, a moving object, and a circuit chip.

Description of the Related Art

An image capturing apparatus is known which includes a plurality of effective pixels arranged along a plurality of rows and a plurality of columns. An example of such an image capturing apparatus is disclosed in Japanese Patent Laid-Open No. 2016-171399. In this example, the image capturing apparatus includes a first chip and a second chip laminated together, wherein the first chip includes a plurality of effective pixels, and the second chip includes an AD conversion unit configured to perform an AD conversion on a signal output from a pixel.

SUMMARY OF THE INVENTION

In an aspect, the present disclosure provides an image capturing apparatus including a first chip and a second chip laminated on the first chip, the first chip including effective pixels disposed in a first row across a plurality of columns and an optical black pixel disposed in the first row, the second chip including an AD conversion unit configured to perform an AD conversion on a signal output from the optical black pixel, the AD conversion unit including a part overlapping, as seen in plan view, with the optical black pixel.

Further features of the present invention will become apparent from the following description of exemplary embodiments with reference to the attached drawings.

DESCRIPTION OF THE EMBODIMENTS

In Japanese Patent Laid-Open No. 2016-171399, nothing is disclosed about an optical black pixel that outputs a noise level, and nothing is described about an optimum layout of an optical black pixel and an AD conversion unit.

The present disclosure provides an image capturing apparatus in which optical black pixels and AD conversion units are disposed at optimum relative locations.

Embodiments are described below with reference to drawings. In the following description, it is assumed that each transistor is of an N-type, unless otherwise noted. However, in the embodiments described below, the transistor type is not limited to the N-type, but P-type transistors may be used as required. In this case, potentials of gates, sources, and drains of transistors may be different from those described in the following embodiments. For example, for a transistor functioning as a switch, the potential applied to the gate thereof may be reversed in terms of high and low levels as opposed to those described in the following embodiments.

First Embodiment

Overall Configuration of Image Capturing Apparatus

Figure 1:
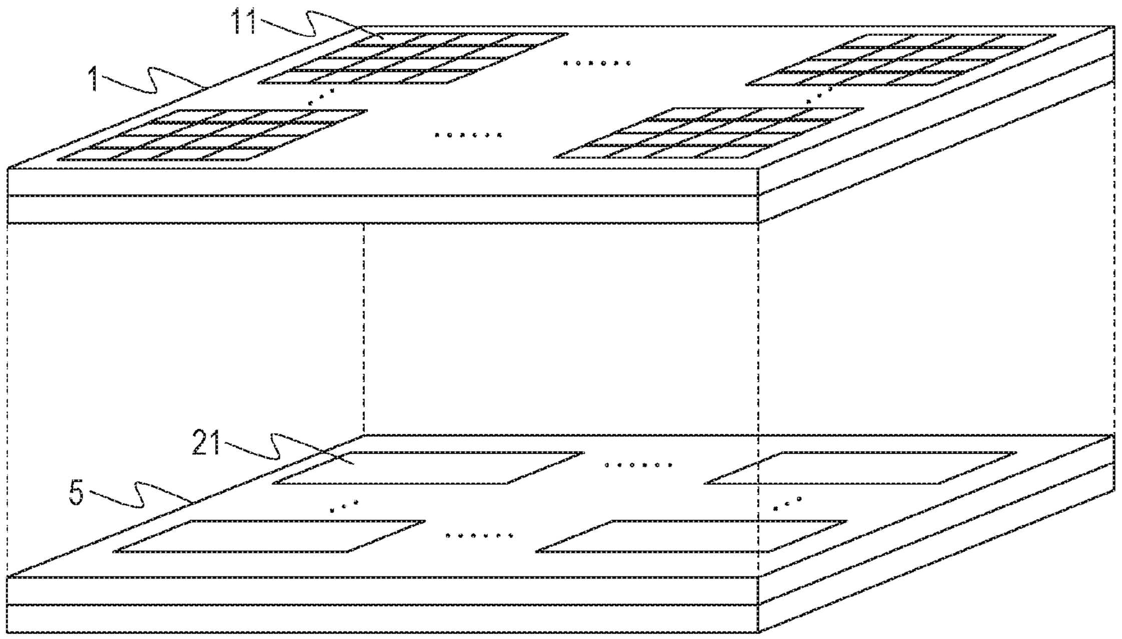
FIG. 1 is a diagram illustrating a configuration of an image capturing apparatus.

FIG. 1 is a diagram illustrating a first chip 1 and a second chip 5 included in an image capturing apparatus according to a first embodiment. The first chip 1 is a pixel chip including a pixel array in which pixels 11 are arranged along a plurality of rows and a plurality of columns. The second chip 5 is a circuit chip including signal processing circuits 21 arranged along a plurality of rows and a plurality of columns. Although only pixels 11 and the signal processing circuits 21 are shown here, other elements including control lines for controlling the pixels 11 and signal lines for transmitting signals output from the pixels 11 are also disposed as required on the first chip 1. Furthermore, drive circuits such as a vertical scanning circuit, a timing generator, and the like are disposed as required on the first chip 1 or the second chip 5.

Pixel Layout in Pixel Array

Figure 2:
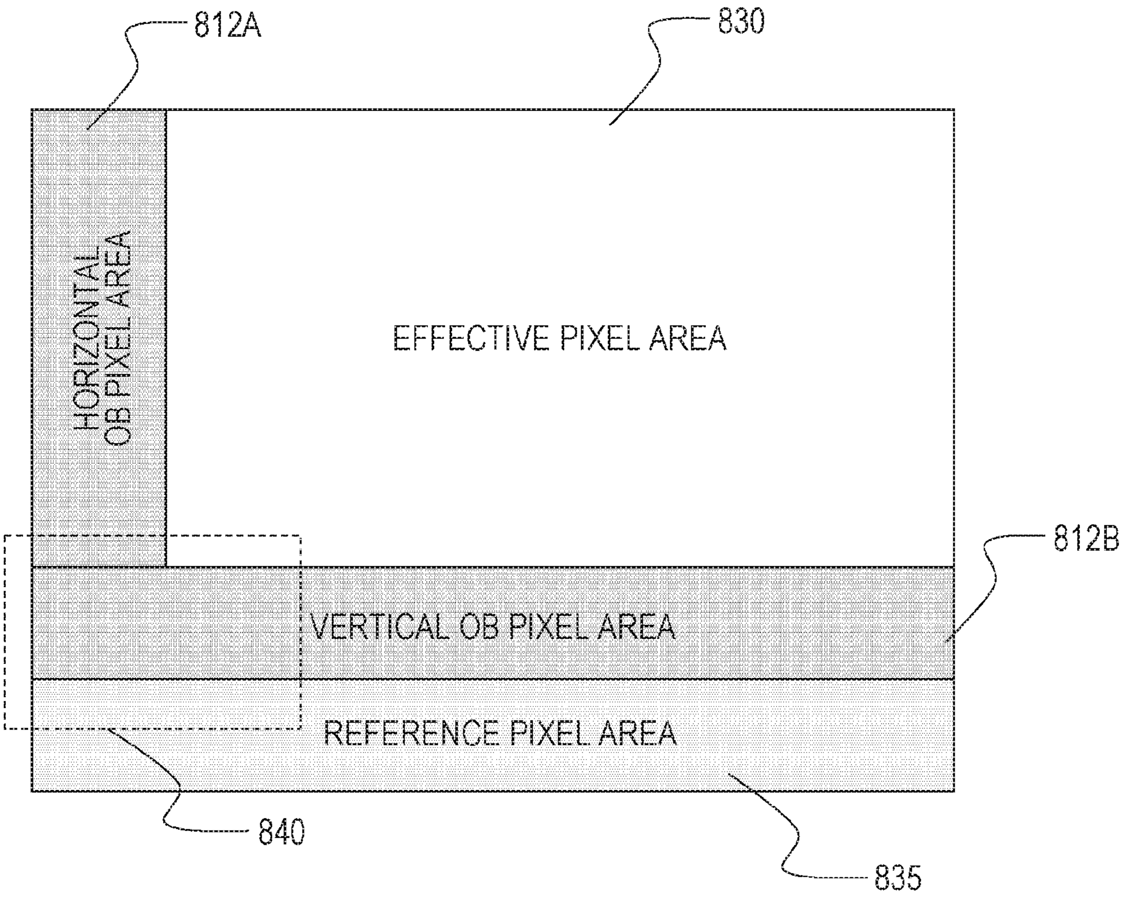
FIG. 2 is a diagram illustrating a layout of pixels of a pixel array.

FIG. 2 is a diagram illustrating a pixel array disposed on the first chip 1. In the present embodiment, the pixels 11 of the pixel array include effective pixels, optical black pixels (OB pixels), and reference pixels. A configuration of each pixel will be described later. The pixel array includes an effective pixel area 830, a horizontal OB pixel area 812A, a vertical OB pixel area 812B, and a reference pixel area 835.

The vertical OB pixel area 812B is disposed between the reference pixel area 835 and the effective pixel area 830. The horizontal OB pixel area 812A is disposed at an outer side of one end of the effective pixel area 830. In other words, an OB pixel area, which is a combination of the horizontal OB pixel area 812A and the vertical OB pixel area 812B, is disposed in an L-character form along an edge of the effective pixel area 830.

Layout of Pixels and Signal Processing Circuits as Seen in Plan View

Figure 3:
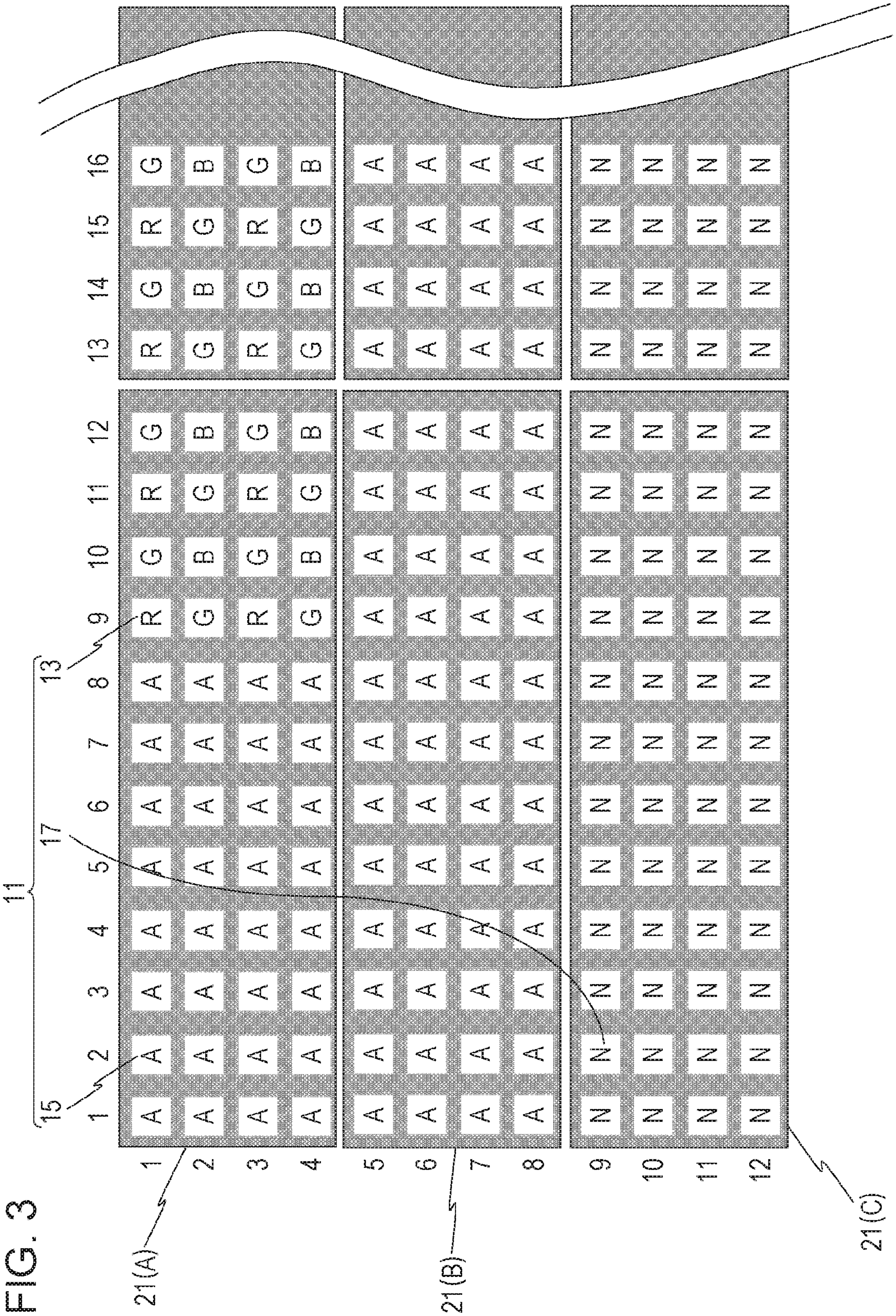
FIG. 3 is a diagram illustrating a layout of pixels and signal processing circuits of an image capturing apparatus as seen in plan view.

FIG. 3 is a diagram illustrating a layout of an area 840 shown in FIG. 2 as seen in plan view, including pixels 11 disposed on the first chip 1, signal processing circuits 21(A) to 21(C) disposed on the second chip 5. Hereinafter, when the signal processing circuits 21(A) to 21(C) are not distinguished from each other, a simple expression such as a signal processing circuit 21 or signal processing circuits 21 will be used.

The pixels 11 include effective pixels 13. FIG. 3 also shows colors of color filters provided on the effective pixels 13. In FIG. 3, R denotes that a corresponding effective pixel 13 has a color filter of red (R). Similarly, G denotes that a corresponding effective pixel 13 has a color filter of green (G), and B denotes that a corresponding effective pixel 13 has a color filter of blue (B).

In other words, there are pixels on which light with a wavelength corresponding to a first color is incident, and pixels on which light with a wavelength corresponding to a second color is incident.

Typically, the wavelength corresponding to the red color is 600 to 830 nm, and the wavelength corresponding to the green color is 500 to 600 nm. The wavelength corresponding to the blue color is 360 to 500 nm.

The color of each color filter may be represented by a peak wavelength at which a transmittance of the color filter has a peak. Typically, the peak wavelength of the transmittance of the blue color filter is about 450 nm. The peak wavelength of the transmittance of the green color filter is about 540 nm. The peak wavelength of the transmittance of the red color filter is about 630 nm.

The color filter provided on one effective pixel 13 may be formed with a single element. Alternatively, the color filter provided on one pixel 11 may include a plurality of color filter elements disposed in different areas in the color filter wherein compositions of the respective color filter elements may be different within a range in which colors of the respective color filter elements are substantially identical to each other.

In FIG. 3, pixels denoted by symbol "A" are optical black pixels 15 (hereinafter, referred to as OB pixels 15) covered with a light blocking film. The effective pixels 13 each include a semiconductor region of a first conductivity type functioning as a charge generation part configured to accumulate a charge generated via a photoelectric conversion. Each OB pixel 15 includes a semiconductor region of the first conductivity type corresponding to the charge generation part of the effective pixel 13. In the OB pixel 15, the semiconductor region of the first conductivity type is shielded from light.

In FIG. 3, pixels labeled with a symbol "N" are reference pixels 17. Unlike the effective pixels 13 and the OB pixels 15, the reference pixels 17 do not have a semiconductor region of the first conductivity type.

The signal processing circuits 21 are disposed such that each signal processing circuit 21 overlaps, as seen in plan view, with pixels 11 arranged along a plurality of rows and a plurality of columns. In this example, each signal processing circuit 21 is disposed such that it overlaps, as seen in plan view, with pixels 11 in four rows and 12 columns. More specifically, one signal processing circuit 21 is disposed such that it overlaps with OB pixels 15, and another signal processing circuit 21 is disposed such that it overlaps with effective pixels 13 and reference pixels 17. As described later, each signal processing circuit 21 includes a multiplex circuit and an AD conversion circuit. Thus, in this layout, one of or both of the multiplex circuit and the AD conversion circuit of the one signal processing circuit 21 overlap with pixels 11.

In the present embodiment, as described later, each AD conversion circuit performs an AD conversion on signals output from pixels 11 located in one column. More specifically, the signal processing circuit 21(A) performs a signal conversion such that signals output from pixels 11 in a 1st column, that is, signals output from OB pixels 15 and reference pixels 17 in the 1st column are converted to digital signals, but the signal processing circuit 21(A) does not perform an AD conversion on signals output from effective pixels 13.

The signal processing circuit 21(B) performs a signal conversion such that signals output from pixels 11 in a 2nd column, that is, signals output from effective pixels, 13, OB pixels 15, and reference pixels 17 in the 2nd column are converted to digital signals.

The signal processing circuit 21(C) performs a signal conversion such that signals output from pixels 11 in a 3rd column, that is, signals output from effective pixels 13, OB pixels 15, and reference pixels 17 in the 3rd column are converted to digital signals.

Note that the layout described above is merely an example. In the present embodiment, other layouts may be employed such that pixels 11 are disposed in a plurality of rows and a plurality of columns in correspondence to one signal processing circuit 21.

Equivalent Circuit of Image Capturing Apparatus

Figure 4:
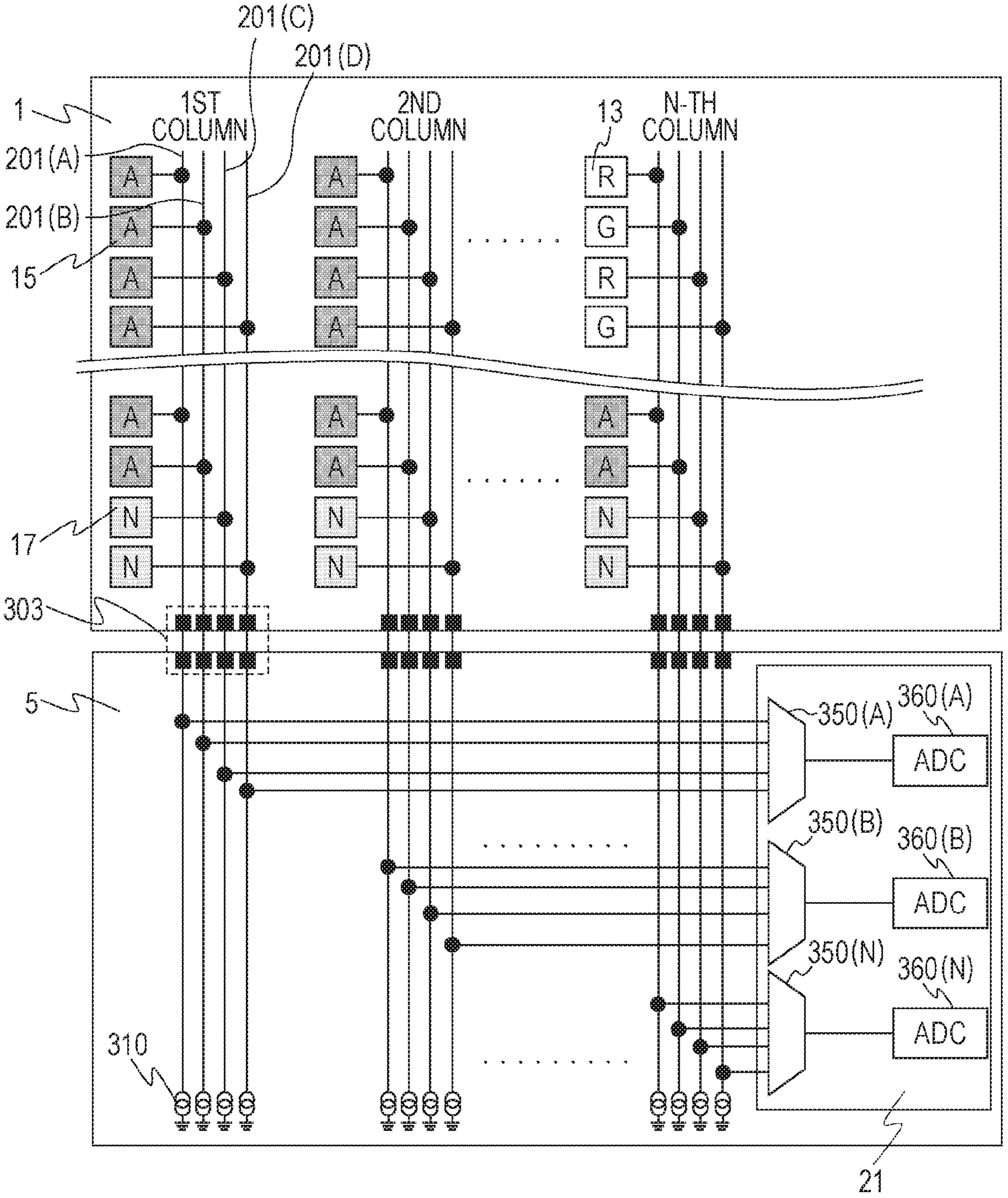
FIG. 4 is a diagram illustrating pixels and an equivalent circuit of a signal processing circuit.

FIG. 4 is a diagram illustrating an equivalent circuit of the image capturing apparatus shown in FIG. 1 or FIG. 3. All pixels shown in FIG. 3 are not shown in FIG. 4, but pixels in the 1st column, the 2nd column, and the N-th column are shown in FIG. 4. Signal lines and pixels 11 are disposed on the first chip 1 such that four signal lines 201(A) to 201(D) are provided for pixels 11 in one column. In the following description, when the signal lines 201(A) to 201(D) are not distinguished from each other, a simple expression such as a signal line 201 or signal lines 201 will be used. In FIG. 4, a pixel 11 in a first row is connected to the signal line 201(A). Similarly, pixels 11 in the second to fourth rows are respectively connected to the signal lines 201(B) to 201(D). In other columns, signal lines 201(A) to 201(D) are disposed such that pixels 11 are connected in a similar manner as in the first column.

The signal lines 201(A) to 201(D) corresponding to the pixels 11 in the 1st column are connected, via a connection unit 303, to a multiplex circuit (hereinafter referred to as an MPX circuit) 350(A) included in the signal processing circuit 21. The signal processing circuit 21 includes AD conversion circuits (hereinafter, in the specification and the drawings, referred to as ADCs) 360(A) and 360(B). The MPX circuit 350(A) functions as a first selection unit including an input part connected to the signal lines 201(A) to 201(D) and an output part connected to the ADC 360(A).

The signal lines 201(A) to 201(D) corresponding to the pixels 11 in another column are connected, via the connection unit 303, to an MPX circuit 350(B) included in the signal processing circuit 21. The MPX circuit 350(B) functions as a second selection unit including an input part connected to the signal lines 201(A) to 201(D) and an output part connected to the ADC 360(B).

As shown in FIG. 4, pixels 11 connected to one ADC 360 are all located in the same column. In the present embodiment, pixels 11 connected to the ADC 360(A) are OB pixels 15 and reference pixels 17 located in the same one column. Similarly, pixels 11 connected to the ADC 360(B) are OB pixels 15 and reference pixels 17 located in the same one column.

The ADCs 360(A) and 360(B) perform an AD conversion on signals output from the OB pixels 15 disposed in the horizontal OB pixel area 812A shown in FIG. 2. Furthermore, the ADCs 360(A) and 360(B) perform an AD conversion on signals output from the OB pixels 15 disposed in the vertical OB pixel area 812B shown in FIG. 2.

Pixels 11 connected to the ADC 360(C) are all located in the same one column. In the present example, pixels 11 connected to the ADC 360(C) are effective pixels 13, OB pixels 15, and reference pixels 17 located in the same one column. The ADC 360(C) does not perform an AD conversion on signals output from the OB pixels 15 disposed in the horizontal OB pixel area 812A shown in FIG. 2. The ADC 360(C) performs an AD conversion on signals output from the effective pixels 13 disposed in the effective pixel area 830, the OB pixels 15 disposed in the vertical OB pixel area 812B, and the reference pixels 17 disposed in the reference pixel area 835.

Furthermore, as shown in FIG. 4, the second chip 5 includes current sources 310. Each current source 310 supplies a current to a signal line 201 in each column via the connection unit 303.

As illustrated in FIG. 4, in the 1st column of the pixel array, OB pixels 15 in the horizontal OB pixel area 812A and reference pixels 17 are disposed. Signals output from the OB pixels 15 in the 1st column are subjected to the AD conversion by the ADC 360(A). Referring to a layout diagram illustrated in FIG. 3 showing a positional relationship among signal processing circuits 21 and pixels as seen in plan view, the signal processing circuit 21(A) includes the ADC 360(A) shown in FIG. 4. That is, the OB pixels 15 in the horizontal OB pixel area 812A and the ADC 360(A) that performs an AD conversion on signals output from these OB pixels 15 are disposed such that they overlap when seen in plan view. Furthermore, the OB pixels 15 in the horizontal OB pixel area 812A and the ADC 360(B) that performs an AD conversion on signals output from these OB pixels 15 are disposed also such that they overlap when seen in plan view. In the present example, the ADCs 360(A) and 360(B) overlap, as seen in plan view, also with effective pixels 13 in 9th to 12th columns.

Layout of ADCs

Figure 5:
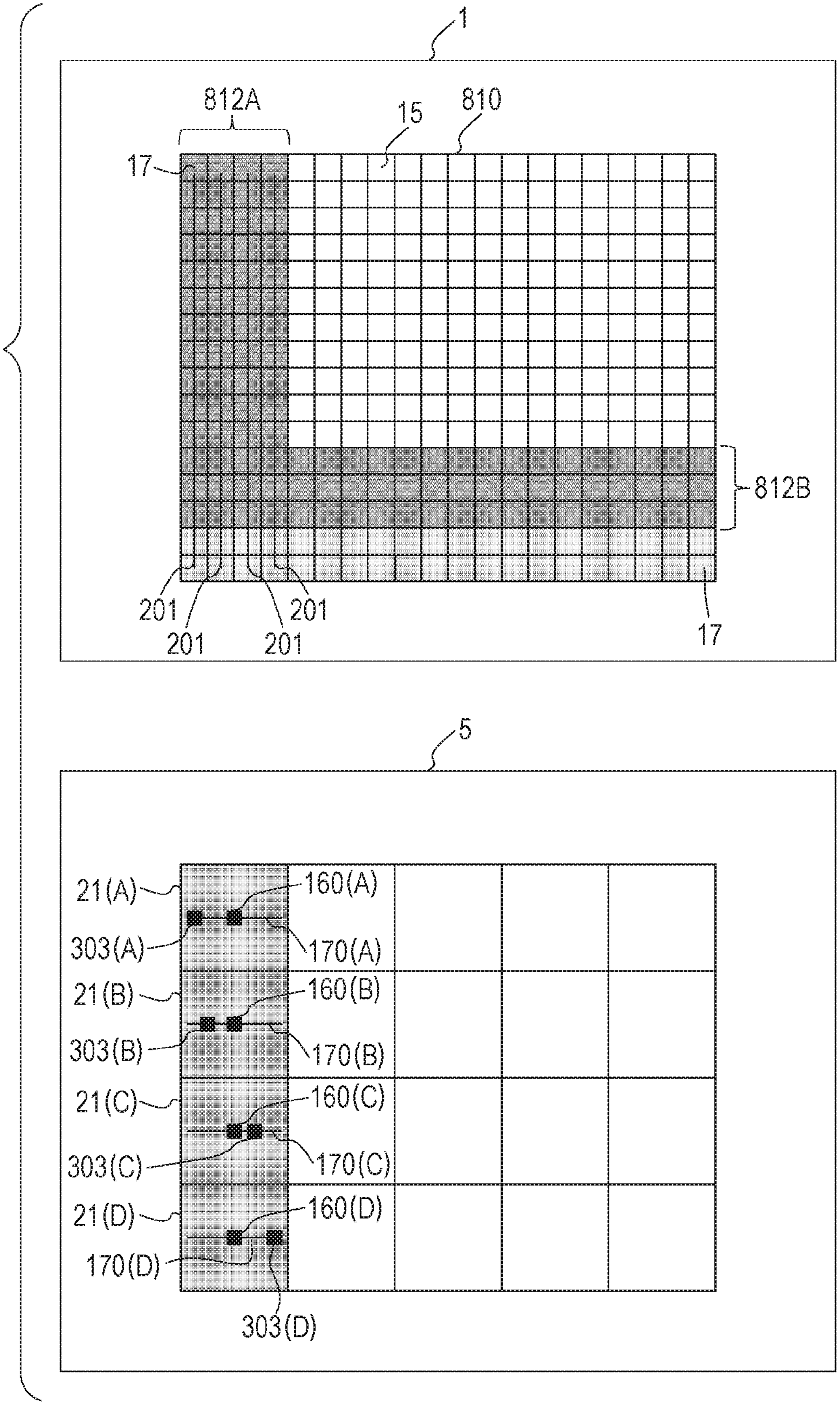
FIG. 5 is a diagram illustrating a manner in which a first chip and a second chip are connected to each other.

FIG. 5 is a diagram illustrating part of the signal processing circuits 21 each including an ADC 360 and also illustrating part of the pixel array. Elements similar to those in FIG. 2 are denoted by reference symbols similar to those used in FIG. 2.

The signal processing circuit 21(A) is connected to the pixels 11 located in the 1st column. More specifically, signal lines 201 connected to pixels 11 located in the 1st column are connected to the connection unit 303(A). This connection unit 303(A) is connected to an input part 160(A) of the signal processing circuit 21 via a connection line 170(A). In this manner, the pixels 11 in the 1st column are connected to the signal processing circuit 21(A).

Similarly, the signal processing circuit 21(B) is connected to pixels 11 in the 2nd column, the signal processing circuit 21(C) is connected to pixels 11 in the 3rd column, and the signal processing circuit 21(D) is connected to pixels 11 in the 4th column.

A first direction is defined by a direction from a first pixel group of pixels 11 in the 1st column to a second pixel group of pixels 11 in the 2nd column. That is, the first direction is a direction in which the column number increases. On the other hand, a second direction crossing the first direction is defined by a direction from the signal processing circuit 21(A) connected to the pixels 11 in the 1st column to the signal processing circuit 21(B) connected to the pixels 11 in the 2nd column. The arranging of the signal processing circuits 21 in the manner described above may be applied to arranging signal processing circuits 21 that perform an AD conversion on signals output from OB pixels 15 in the horizontal OB pixel area 812A, and also to arranging signal processing circuits 21 that perform an AD conversion on signals output from effective pixels 13.

In the present embodiment, the horizontal OB pixel area 812A includes a plurality of columns of OB pixels 15. If the number of columns is denoted by X, signal processing circuits 21 connected to the OB pixels 15 in the horizontal OB pixel area 812A are disposed along as many as X rows. The horizontal OB pixel area 812A includes a plurality of rows of OB pixels 15 as illustrated in FIG. 2 and FIG. 5. Thus, the signal processing circuits 21 connected to the OB pixels 15 in the horizontal OB pixel area 812A overlap, as seen in plan view, with the horizontal OB pixel area 812A. In other words, the MPX circuits 350 connected to the OB pixels 15 in the horizontal OB pixel area 812A overlap, as seen in plan view, with the horizontal OB pixel area 812A. In other words, the ADCs 360 that perform AD conversions on signals output from the OB pixels 15 in the horizontal OB pixel area 812A overlap, as seen in plan view, with the horizontal OB pixel area 812A.

Figure 6:
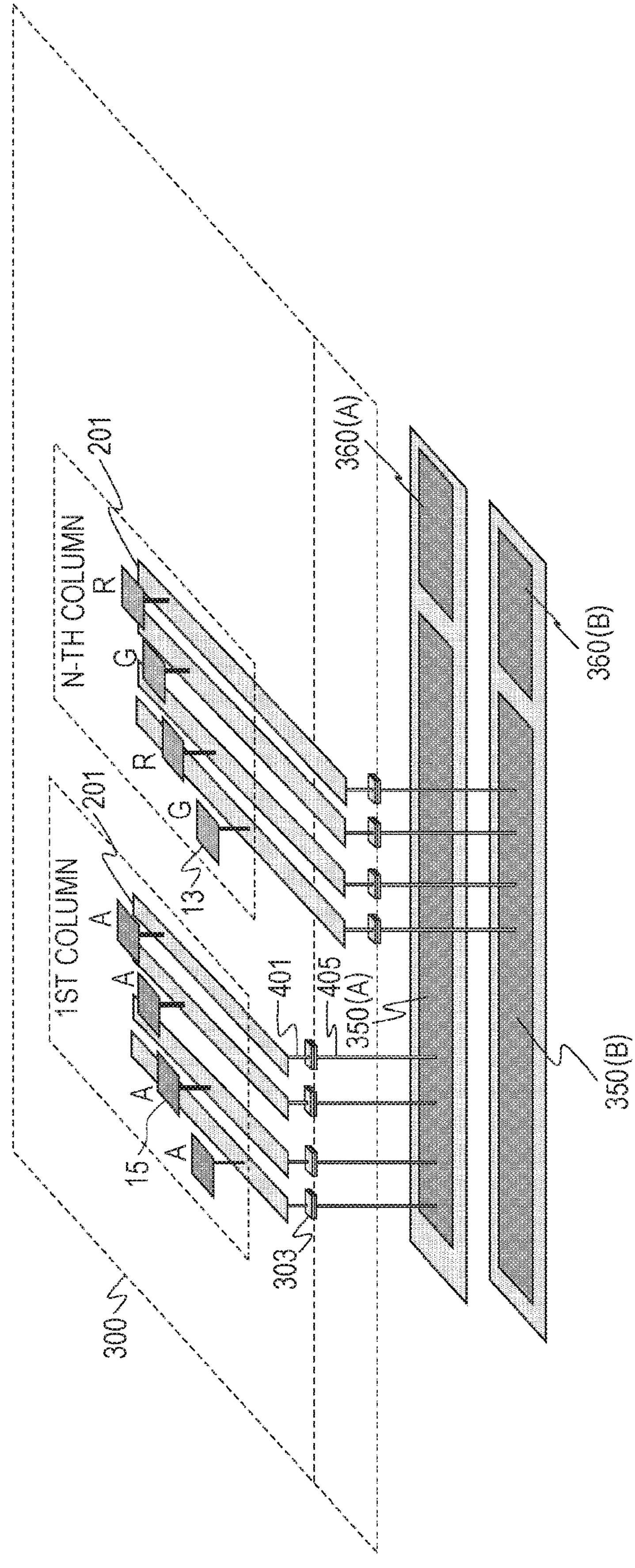
FIG. 6 is a diagram illustrating a manner in which pixels are connected to signal processing circuits.

Cross-Sectional Structure of Connection Unit and Surrounding Elements in Image Capturing Apparatus FIG. 6 is a diagram illustrating a cross-sectional structure of the image capturing apparatus shown in FIG. 4. FIG. 6 mainly illustrates an OB pixel 15 in the 1st column and in the 4th row and a reference pixel 17 in the 5th column and in the 4th row. The first chip 1 and the second chip 5 shown in FIG. 1 are connected to each other via a connection plane 300.

The image capturing apparatus according to the present embodiment is of a back-illuminated type. The OB pixel 15 includes a non-illustrated photoelectric conversion element. A signal line 201 is disposed between the photoelectric conversion element and the connection plane 300. The signal line 201 extends in a predetermined direction (along columns in the example shown in FIG. 4) with respect to the pixels 11. The signal line 201 is connected to the connection unit 303 via a connection line 401. The MPX circuit 350(A) is connected to the connection unit 303 via a connection line 405.

Although the connection lines 170 shown in FIG. 5 are not shown in FIG. 6, the connection line 170 may be included in the MPX circuit 350(A) shown in FIG. 6. In an alternative example, the connection lines 170 may be formed in a wiring layer between the connection lines 405 and the MPX circuit 350(A).

The connection line 401, the connection line 405, and the connection unit 303 are disposed such that they overlap with each other when seen in plan view. In other words, the signal processing circuit 21 and the signal line 201 are connected to each other via the connection line 405 and the connection line 401 formed so as to overlap with the connection line 405 as seen in plan view. By connecting the connection line 401 to the signal line 201 extending in the predetermined direction, the signal line 201 and the MPX circuit 350 are connected to each other. The extending of the signal line 201 in the predetermined direction makes it easy to connect the connection line 401 and the signal line 201 to each other.

Equivalent Circuit of Pixel

Figure 7A:
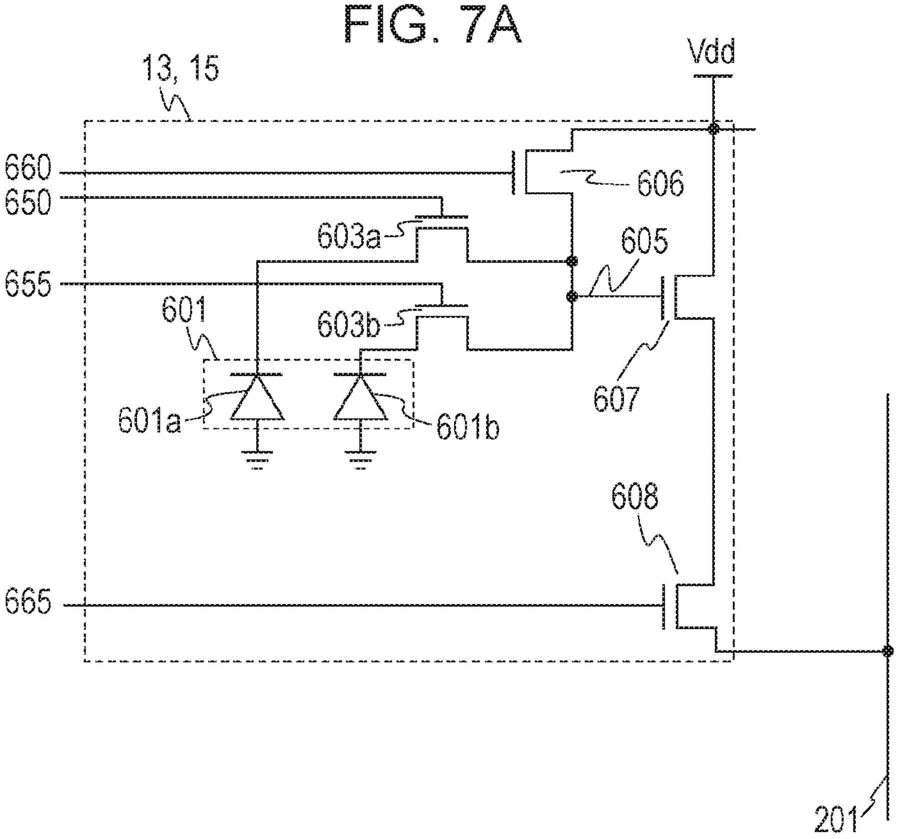
FIGS. 7A and 7B are diagrams each illustrating an equivalent circuit of a pixel.

FIG. 7A is a diagram illustrating an equivalent circuit of an effective pixel 13 (or an OB pixel 15) according to the present embodiment. The effective pixel 13 and the OB pixel 15 each includes photodiodes 601*a* and 601*b* each functioning as a photoelectric conversion element. Light is incident on each of the photodiodes 601*a* and 601*b* of the effective pixel 13 via non-illustrated one microlens and one of color filters arranged in the form of an array as shown in FIG. 3. That is, light incident on the photodiode 601*a* is substantially identical in wavelength to light incident on the photodiode 601*b*. On the other hand, the photodiodes 601*a* and 601*b* in the OB pixel 15 are shielded from light.

The photodiode 601*a* is connected to a floating diffusion part (hereinafter referred to as the FD part) 605 via a transfer transistor 603*a*. A gate of the transfer transistor 603*a* is connected to a non-illustrated vertical scanning circuit via a control line 650.

The photodiode 601*b* is connected to an FD part 605 via a transfer transistor 603*b*. A gate of the transfer transistor 603*b* is connected to the non-illustrated vertical scanning circuit via a control line 655.

The FD part 605 is connected to a reset transistor 606 and a gate of an amplifier transistor 607.

The reset transistor 606 and the amplifier transistor 607 are supplied with a power supply voltage Vdd. A gate of the reset transistor 606 is connected to the non-illustrated vertical scanning circuit via a control line 660.

The amplifier transistor 607 is connected to a selection transistor 608. A gate of the selection transistor 608 is connected to the non-illustrated vertical scanning circuit via a control line 665.

The selection transistor 608 is connected to a signal line 201.

Figure 7B:
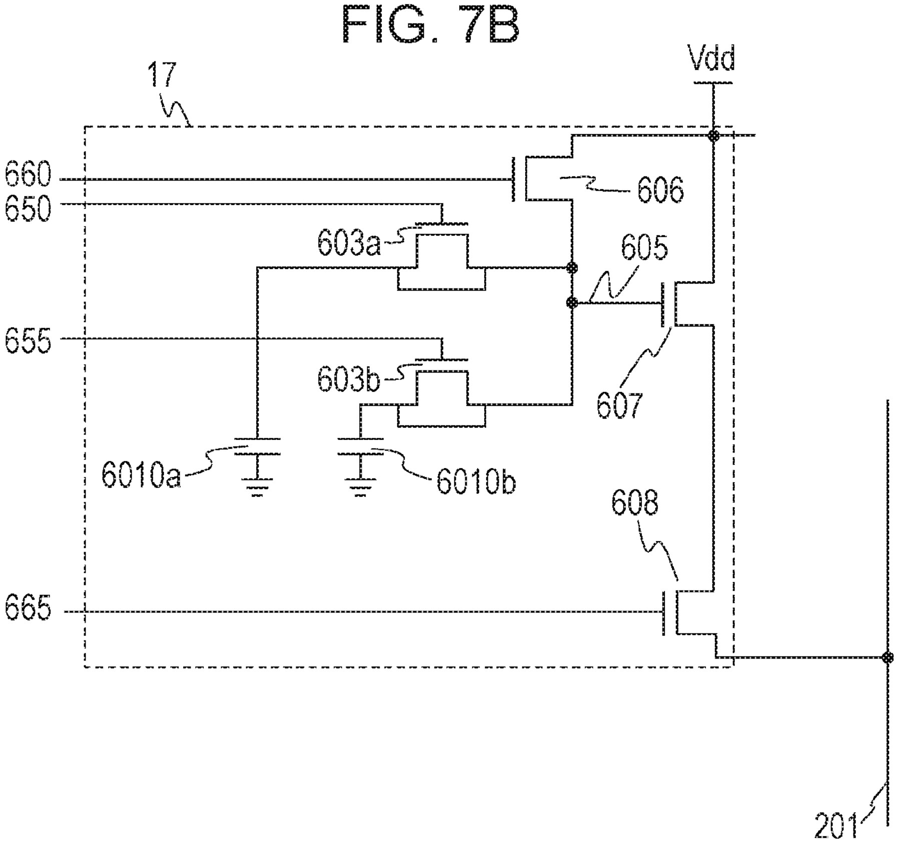

FIG. 7B is a diagram illustrating an equivalent circuit of a reference pixel 17. The equivalent circuit of the reference pixel 17 is similar to the equivalent circuit shown in FIG. 7A except that the photodiodes 601*a* and 601*b* are replaced by capacitors 6010*a* and 6010*b*. That is, the reference pixel 17 includes no photoelectric conversion elements.

Operation of Image Capturing Apparatus

Figure 8A:
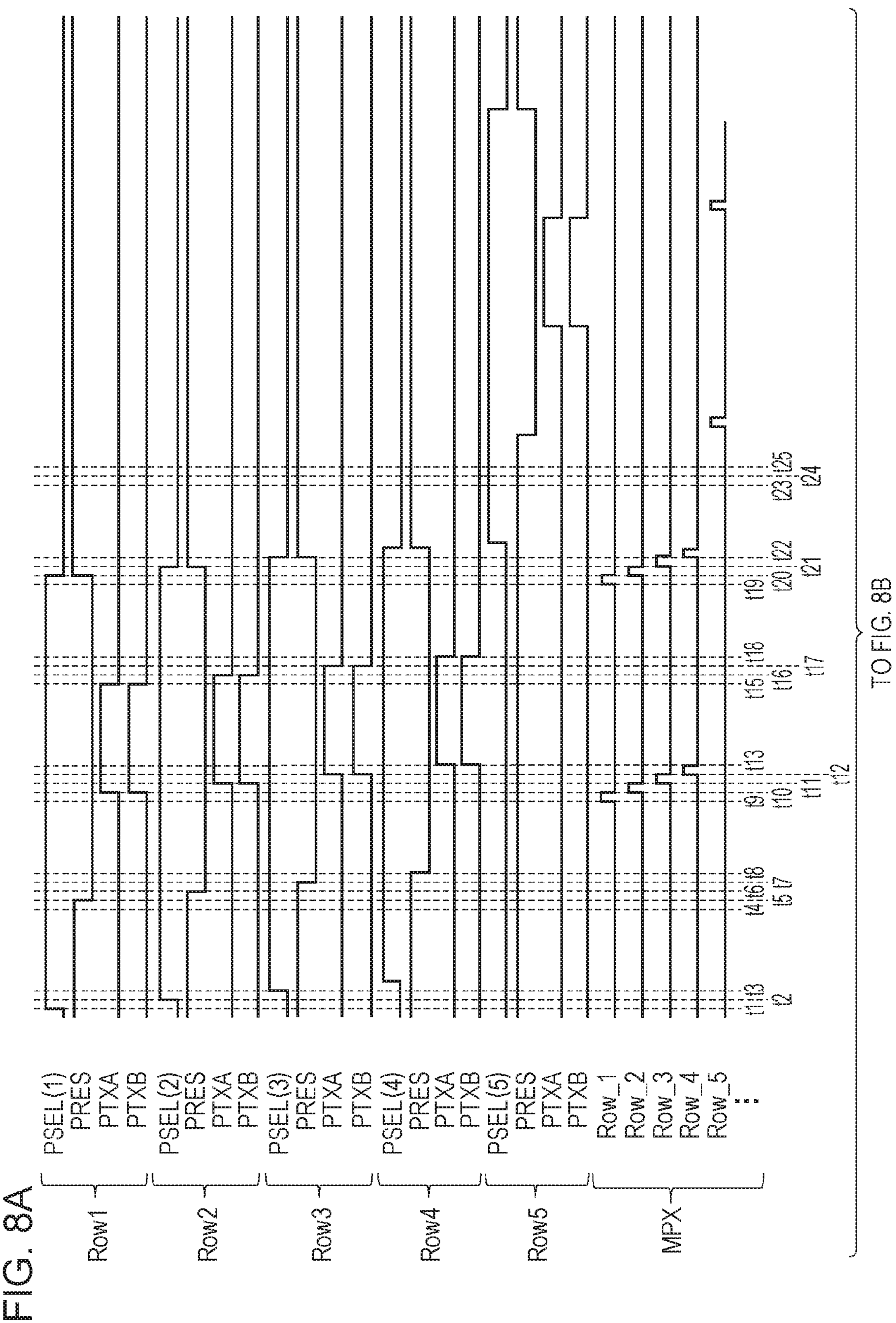
FIGS. 8A and 8B are diagrams illustrating an operation of an image capturing apparatus.
Figure 8B:
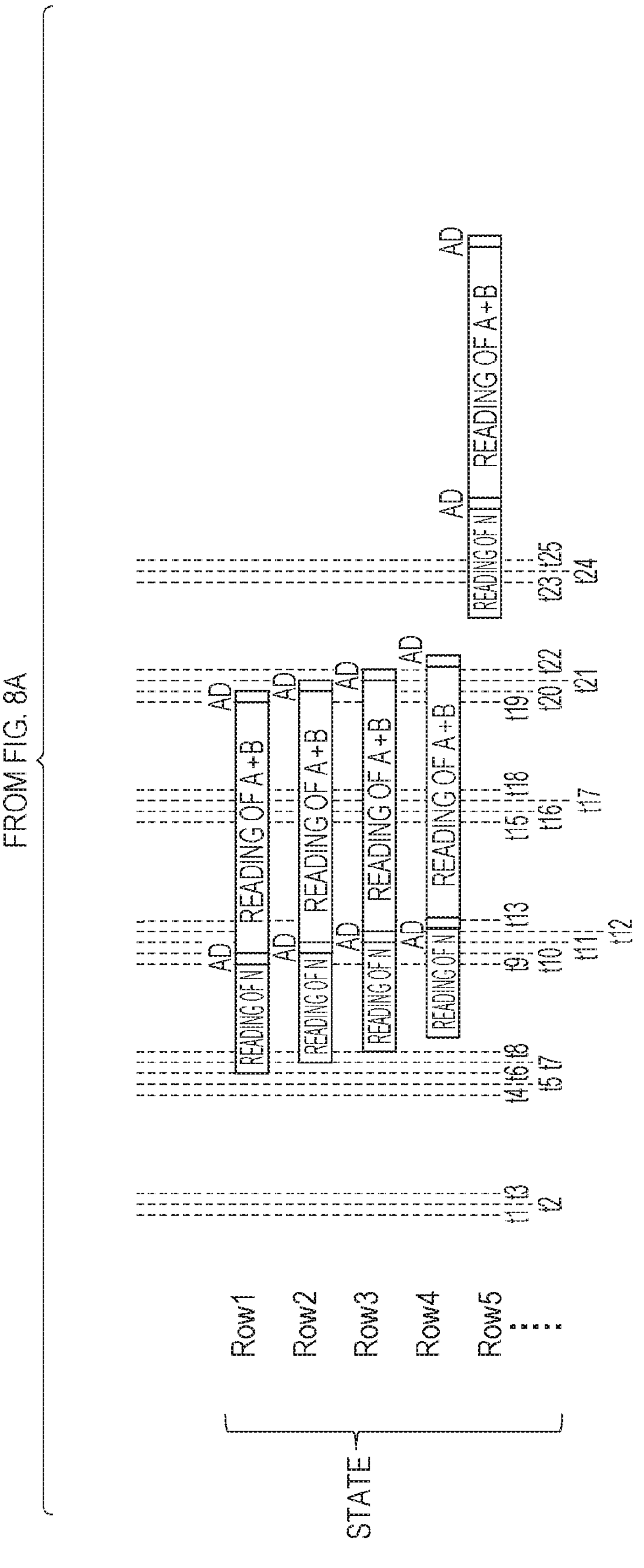

The MPX circuit 350(A) sequentially outputs signals, received via a plurality of signal lines 201(A) to 201(D) disposed corresponding to pixels 11 in one column, to the ADC 360(A). In FIGS. 8A and 8B, the signals output by the MPX circuit 350(A) are denoted by Row_n where n indicates a pixel row number corresponding to a signal output from the MPX circuit 350(A) to the ADC 360(A). That is, when Row_1 is at the high level, a signal output from a pixel 11 in the 1st row to the signal line 201(A) is output by the MPX circuit 350(A) to the ADC 360(A).

Operation: Reading of N Signal from Each Pixel 11

At time t1, the vertical scanning circuit changes the level of a signal PSEL(1) to be output to the pixel 11 in the 1st row to a high level.

At time t2, the vertical scanning circuit changes the level of a signal PSEL(2) to be output to the pixel 11 in the 2nd row to the high level.

At time t3, the vertical scanning circuit changes the level of a signal PSEL(3) to be output to the pixel 11 in the 3rd row to the high level.

Subsequently, in a similar manner, the vertical scanning circuit changes the level of a signal PSEL(4) to be output to the pixel 11 in the 4th row to the high level.

At time t5, the vertical scanning circuit changes the level of a signal PRES output to the pixel 11 in the 1st row from the high level to a low level. As a result, an N signal is output to the signal line 201(A).

At time t6, the vertical scanning circuit changes the level of a signal PRES output to the pixel 11 in the 2nd row from the high level to the low level. As a result, an N signal is output to the signal line 201(B).

At time t7, the vertical scanning circuit changes the level of a signal PRES output to the pixel 11 in the 3rd row from the high level to the low level. As a result, an N signal is output to the signal line 201(C).

At time t8, the vertical scanning circuit changes the level of a signal PRES output to the pixel 11 in the 4th row from the high level to the low level. As a result, an N signal is output to the signal line 201(D).

Operation: AD Conversion of N Signal Corresponding to Pixel 11 in Each Row

At time t9, the MPX circuit 350(A) outputs a signal received from the signal line 201(A), that is, an N signal of the pixel 11 in the 1st row, to the ADC 360(A). The ADC 360(A) converts the N signal of the pixel 11 in the 1st row to a digital signal.

At time t10, the MPX circuit 350(A) outputs a signal received from the signal line 201(B), that is, an N signal of the pixel 11 in the 2nd row, to the ADC 360(A). The ADC 360(A) converts the N signal of the pixel 11 in the 2nd row to a digital signal.

At time t11, the MPX circuit 350(A) outputs a signal received from the signal line 201(C), that is, an N signal of the pixel 11 in the 3rd row, to the ADC 360(A). The ADC 360(A) converts the N signal of the pixel 11 in the 3rd row to a digital signal.

At time t12, the MPX circuit 350(A) outputs a signal received from the signal line 201(D), that is, an N signal of the pixel 11 in the 4th row, to the ADC 360(A). The ADC 360(A) converts the N signal of the pixel 11 in the 4th row to a digital signal.

Operation: Reading of A+B Signal Corresponding to Pixel 11 in Each Row

At time t10, the vertical scanning circuit changes the levels of the signals PTXA and PTXB to be output to the pixel 11 in the 1st row to the high level. As a result, charges accumulated in the photodiodes 601*a* and 601*b* are transferred to the FD part 605 via the transfer transistors 603*a* and 603*b*. In the FD part 605, charges transferred from the photodiodes 601*a* and 601*b* are added together. As a result, the electric potential of the FD part 605 becomes equal to an electric potential corresponding to the sum of the charges transferred from the photodiodes 601*a* and 601*b*. Let an A signal denote a signal that would be output from the amplifier transistor 607 based on the electric potential of the FD part 605 if the electric potential of the FD part 605 is given only by the charge from the photodiode 601*a*. Furthermore, let a B signal denote a signal that would be output from the amplifier transistor 607 based on the electric potential of the FD part 605 if the electric potential of the FD part 605 is given only by the charge from the photodiode 601*b*. Using these notations, the signal output from the amplifier transistor 607 based on the electric potential of the FD part 605 corresponding to the sum of the charges transferred from the photodiodes 601*a* and 601*b* is equal to the sum of the A signal and the B signal, which can be denoted as an A+B signal. To the signal line 201(A) in each column, the A+B signal from the pixel 11 in the 1st row is output.

At time t11, the vertical scanning circuit changes the levels of the signals PTXA and PTXB to be output to the pixel 11 in the 2nd row to the high level. As a result, charges accumulated in the photodiodes 601*a* and 601*b* are transferred to the FD part 605 via the transfer transistors 603*a* and 603*b*. Thus, to the signal line 201(B), the A+B signal from the pixel 11 in the 2nd row is output.

At time t12, the vertical scanning circuit changes the levels of the signals PTXA and PTXB to be output to the pixel 11 in the 3rd row to the high level. As a result, charges accumulated in the photodiodes 601*a* and 601*b* are transferred to the FD part 605 via the transfer transistors 603*a* and 603*b*. Thus, to the signal line 201(C), the A+B signal from the pixel 11 in the 3rd row is output.

At time t13, the vertical scanning circuit changes the levels of the signals PTXA and PTXB to be output to the pixel 11 in the 4th row to the high level. As a result, charges accumulated in the photodiodes 601*a* and 601*b* are transferred to the FD part 605 via the transfer transistors 603*a* and 603*b*. Thus, to the signal line 201(D), the A+B signal from the pixel 11 in the 4th row is output.

Operation: AD Conversion of A+B Signal Corresponding to Pixel 11 in Each Row At time t19, the MPX circuit 350(A) outputs a signal received from the signal line 201(A), that is, an A+B signal of the pixel 11 in the 1st row, to the ADC 360(A). The ADC 360(A) converts the A+B signal of the pixel 11 in the 1st row to a digital signal.

At time t20, the MPX circuit 350(A) outputs a signal received from the signal line 201(B), that is, an A+B signal of the pixel 11 in the 2nd row, to the ADC 360(A). The ADC 360(A) converts the A+B signal of the pixel 11 in the 2nd row to a digital signal.

At time t21, the MPX circuit 350(A) outputs a signal received from the signal line 201(C), that is, an A+B signal of the pixel 11 in the 3rd row, to the ADC 360(A). The ADC 360(A) converts the A+B signal of the pixel 11 in the 3rd row to a digital signal.

At time t22, the MPX circuit 350(A) outputs a signal received from the signal line 201(D), that is, an A+B signal of the pixel 11 in the 4th row, to the ADC 360(A). The ADC 360(A) converts the A+B signal of the pixel 11 in the 4th row to a digital signal.

Thereafter, the vertical scanning circuit changes the level of the signal PSEL(5) supplied to the pixel 11 in the 5th row to the high level. Subsequently, the operation is repeated in a similar manner.

In this way, the image capturing apparatus according to the present embodiment is capable of acquiring the digital signal based on the N signal of each pixel and the digital signal based on the A+B signal of each pixel. That is, the digital signal based on the N signal of the effective pixel 13 and the digital signal based on the A+B signal of the effective pixel 13 are obtained. Furthermore, the digital signal based on the N signal of the effective pixel 13 and the digital signal based on the A+B signal of the effective pixel 13 are obtained. Note that the A+B signal of the OB pixel 15 is a signal based on a dark current component of the FD part 605 and charges (mainly dark current components) of the photodiodes 601*a* and 601*b* shielded from light. The A+B signal of the reference pixel 17 is a signal mainly based on a dark current component of the FD part 605.

Thereafter, the digital signals generated by the respective ADCs 360 are output to the digital signal processing circuit via transfer lines (not shown). The digital signal processing circuit performs a correction process based on the digital signals based on the signals output from the OB pixels 15 and the digital signals based on the signal output from the reference pixels 17 to reduce noise components included the digital signals based on the signals output from the effective pixels 13.

Effects of the Present Embodiment

In the image capturing apparatus according to the present embodiment, as described above with reference to FIG. 5, the signal processing circuits 21 connected to the horizontal OB pixel area 812A overlap, when seen in plan view, with the horizontal OB pixel area 812A.

If, hypothetically, a signal processing circuit 21 connected to the horizontal OB pixel area 812A does not have an area overlapping, as seen in plan view, with the horizontal OB pixel area 812A but the signal processing circuit 21 overlaps with the effective pixel area 830. In this case, a signal line 201 that transmits a signal output from an effective pixel 13 overlaps with the signal processing circuit 21 to which the signal from the horizontal OB pixel area 812A is input. This results in a possibility that a crosstalk can occur between the connection line 170 (see FIG. 5) to which the signal from the OB pixel 15 is input and the signal line 201 to which the signal from the effective pixel 13 is input. This may result in a reduction in signal accuracy of the signal of the OB pixel 15 and the signal of the effective pixel 13.

In view of the above, in the present embodiment, the signal processing circuits 21 connected to the horizontal OB pixel area 812A have an area overlapping, as seen in plan view, with the horizontal OB pixel area 812A. This makes it possible to prevent a crosstalk from easily occurring between the connection line 170 to which the signal from the OB pixel 15 is input and the signal line 201 to which the signal from the effective pixel 13 is input. Thus, it becomes possible to prevent a reduction from easily occurring in signal accuracy of the signal of the OB pixel 15 and the signal of the effective pixel 13.

Other Embodiments

In the embodiment described above, the signal processing circuits 21 connected to the horizontal OB pixel area 812A partially overlap with the effective pixel area 830. Other examples of layouts are described below with reference to drawings.

FIGS. 10A to 10D illustrate examples of manners in which the first chip 1 is laid out with respect to the second chip 5. In FIGS. 10A to 10D, elements similar in function to elements shown in FIG. 5 are denoted by similar reference symbols.

Figure 10D:
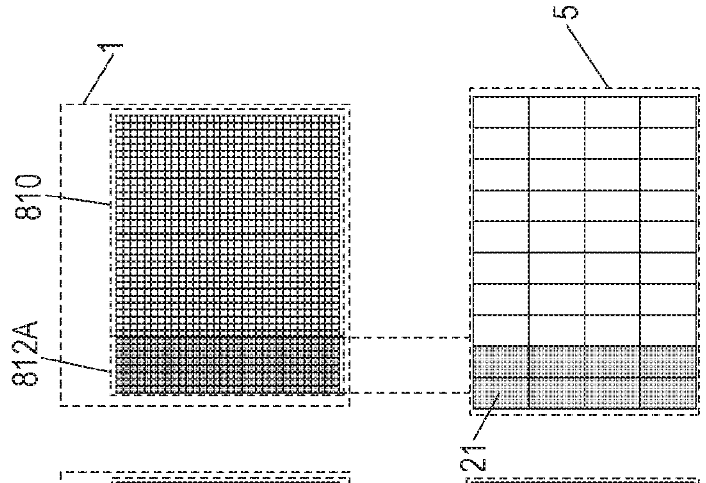
FIGS. 10A to 10D are diagrams each illustrating a layout of signal processing units and pixels.
Figure 10C:
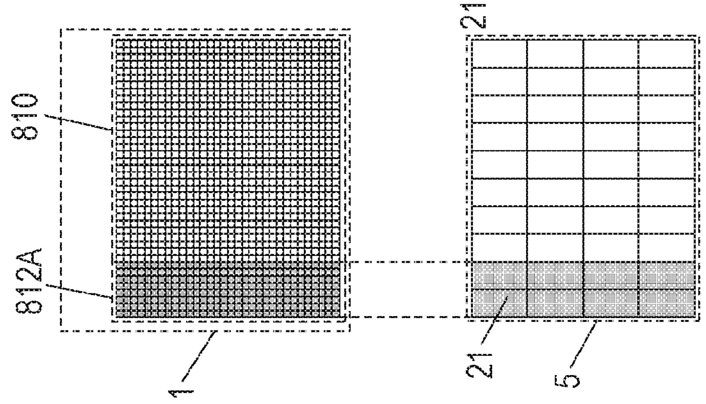
Figure 10B:
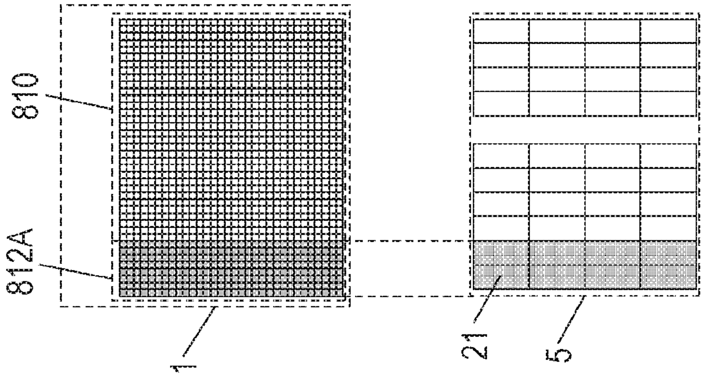
Figure 10A:
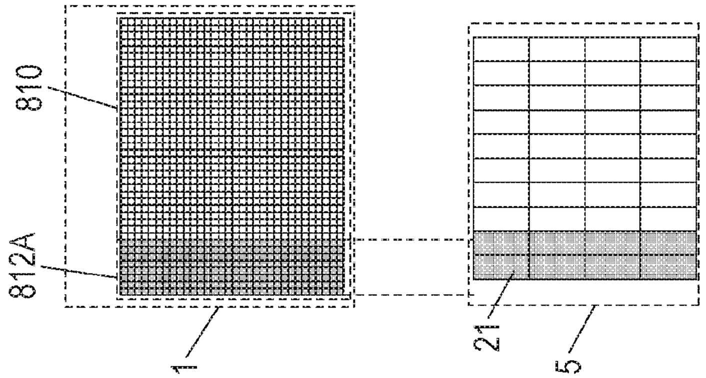

The example shown in FIG. 10A corresponds to the layout according to the embodiment shown in FIG. 3. That is, in this example, the signal processing circuits 21 that perform AD conversions on signals output from the OB pixels 15 are disposed over the horizontal OB pixel area 812A and the effective pixel area 830. In this example, the signal processing circuits 21, which perform the AD conversion on the signals output from the OB pixels 15 located in 8 columns, are disposed over 4 rows and 2 columns. One signal processing circuit 21 performs an AD conversion on signals output from OB pixels 15 located in one column as shown in FIG. 4. Thus, signal processing circuits 21 disposed over 4 rows and one column perform AD conversions on signals output from OB pixels 15 located in 4 columns.

In the example shown in FIG. 10A, the horizontal width of signal processing circuit 21 in one column is smaller than the total width of corresponding OB pixels 15 located over 4 columns. In other words, in the example shown in FIG. 10A, when OB pixels 15 located over 4 columns are grouped into one pixel set, the horizontal pitch of the signal processing circuits 21 located over a plurality of columns is smaller than the horizontal pitch of a plurality of pixel set. Thus, in the example shown in FIG. 10A, the signal processing circuits 21 that perform AD conversions on signals output from the OB pixels 15 are located across the horizontal OB pixel area 812A and the effective pixel area 830.

In the example shown in FIG. 10B, as in the example shown in FIG. 10A, the horizontal width of signal processing circuit 21 in one column is smaller than the total width of corresponding OB pixels 15 located over 4 columns. However, in the example shown in FIG. 10B, the signal processing circuits 21, which perform AD conversions on signals output from the OB pixels 15, do not overlap with the effective pixel area 830 but overlap with the horizontal OB pixel area 812A. Thus, on the second chip 5, gap is formed between adjacent signal processing circuits 21 such that there is no signal processing circuit 21 in the gap. In this gap, it is allowed to dispose a circuit (such as horizontal scanning circuit, a power supply voltage generation circuit, a timing generator, etc.) other than signal processing circuits 21. A process of producing the second chip 5 may include an exposure process in which the second chip 5 is divided in a plurality of subareas and the exposure is performed on a subarea-by-subarea basis. The gap described above may be formed at a boundary between adjacent subareas. The exposure process in producing the second chip 5 may be performed such that the second chip 5 is divided into a plurality of subareas, the exposure is performed on a subarea-by-subarea basis such that each adjacent subareas are connected together. In this case, the gap described above may be formed at a boundary at which adjacent subareas are connected together.

FIG. 10C illustrates an example in which the horizontal width of the signal processing circuit 21 in one column is equal to the total width of four columns of the OB pixels 15. In other words, if four columns of OB pixels 15 are grouped in one pixel set, then in the example shown in FIG. 10C, the horizontal pitch of signal processing circuits 21 across a plurality of columns is equal to the horizontal pitch of a plurality of pixel sets. In this case, it is possible to increase the horizontal width of one signal processing circuit 21 without increasing the chip size of the second chip 5 so as to be greater than the chip size of the first chip 1. Therefore, in the example shown in FIG. 10C, it is easy to realize large circuit area sizes for the ADC 360 and the MPX circuit 350.

In the example shown in FIG. 10D, the horizontal width of the signal processing circuit 21 located in one column is greater than the width of corresponding four columns of OB pixels 15. In other words, in the example shown in FIG. 10D, if OB pixels 15 located over 4 columns are grouped into one pixel set, then in the example shown in FIG. 10D, the horizontal pitch of the signal processing circuits 21 located over a plurality of columns is greater than the horizontal pitch of a plurality of pixel sets. In this example, the chip area size of the second chip 5 can determine the sensor size of the laminated-type image capturing apparatus. However, in this example, it is possible to have a greater horizontal width of one signal processing circuit 21 than can be achieved in the example shown in FIG. 10C. Therefore, in this example shown in FIG. 10D, it is further easier to realize large circuit area sizes for the ADC 360 and the MPX circuit 350 than is in the example shown in FIG. 10C.

Referring to FIGS. 10A to 10D, examples of manners of laying out the signal processing circuits 21 and the OB pixels 15 have been described. It may be preferable that the signal processing circuits 21 connected to the horizontal OB pixel area 812A do not overlap with the effective pixel area 830. This is achieved in the examples shown in FIGS. 10B, 10C, and 10D. In these examples, it may be possible to make a layout in a more preferable manner such that crosstalk is prevented from easily occurring between the connection line 170 to which the signal of the OB pixel 15 is input and the signal line 201 to which the signal of the effective pixel 13 is input.

In other words, it is possible to prevent the connection line 170 connected to the OB pixel 15 in the horizontal OB pixel area 812A from overlapping, as seen in plan view, with the signal line 201 connected to the effective pixel 13 in the effective pixel area 830 thereby achieving low crosstalk between the connection line 170 to which the signal of the OB pixel 15 is input and the signal line 201 to which the signal of the effective pixel 13 is input.

Further Advantageous Effect of the Present Embodiment: Enhancement of Operation Speed of Image Capturing Apparatus by Parallel Operations Shown in FIGS. 8A and 8B.

In the operation shown in FIGS. 8A and 8B, a plurality of operations are performed in parallel as described below.

(1) Reading of an N signal corresponding to the pixel 11 in the 1st row and reading of an N signal corresponding to the pixel 11 in the 2nd row are performed in parallel.

(2) AD conversion of the N signal corresponding to the pixel 11 in the 1st row and reading of an N signal corresponding to the pixel 11 in the 2nd row are performed in parallel.

(3) AD conversion of the N signal corresponding to the pixel 11 in the 4th row and reading of an A+B signal corresponding to the pixel 11 in the 1st row are performed in parallel.

(4) AD conversion of the A+B signal corresponding to the pixel 11 in the 1st row and reading of an A+B signal corresponding to the pixel 11 in the 2nd row are performed in parallel.

(5) AD conversion of the A+B signal corresponding to the pixel 11 in the 1st row and reading of an A+B signal corresponding to the pixel 11 in the 2nd row are performed in parallel.

Performing operations in parallel as described above makes it possible to reduce a waiting time until the ADC 360(A) starts a next AD conversion after the ADC 360(A) ends a previous AD conversion. Thus, it is possible to reduce the total time for performing the AD conversion on signals output from all pixels 11. This makes it possible to increase the frame rate of the image capturing apparatus.

Figure 9A:
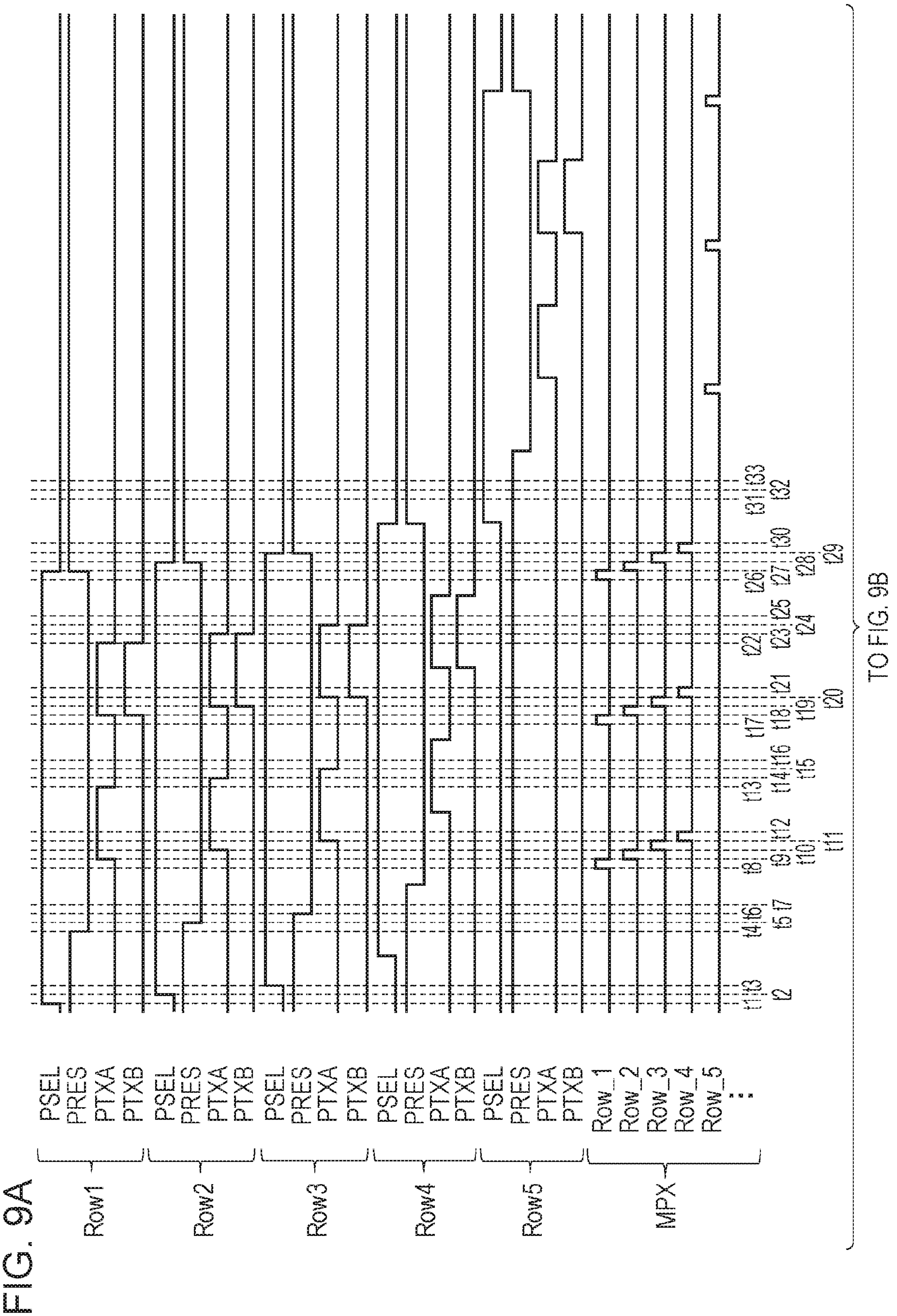
FIGS. 9A and 9B are diagrams illustrating an operation of an image capturing apparatus.
Figure 9B:
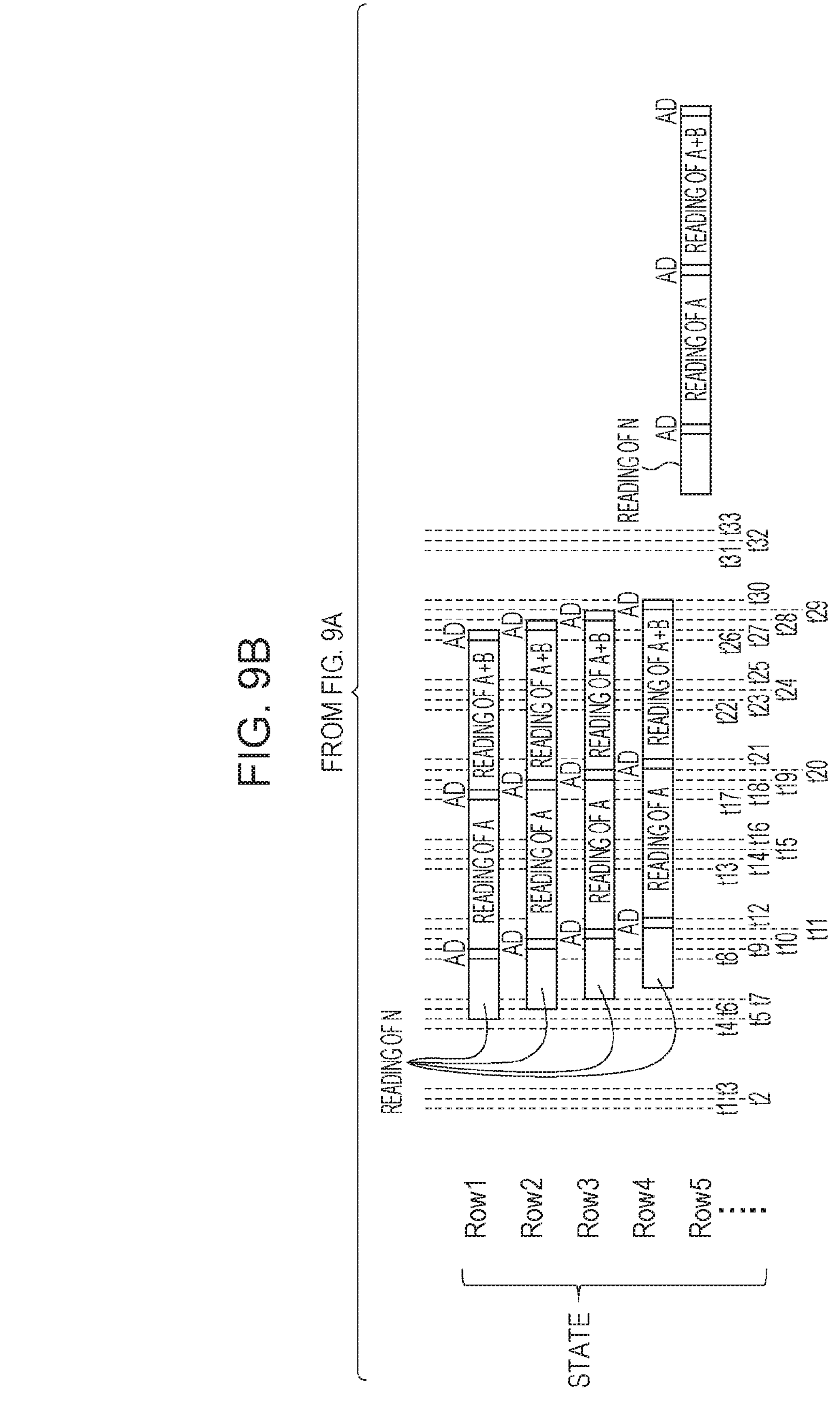

Operation of Image Capturing Apparatus: Focus Detection and Image Capturing Mode FIGS. 9A and 9B illustrate an operation performed by the image capturing apparatus to output a focus detection signal and a captured image signal.

The operation is described below focusing differences from the operation shown in FIGS. 8A and 8B.

Operation: Reading N Signal from Pixel 11 in Each Row

This operation is performed in a similar manner to the operation shown in FIGS. 8A and 8B.

Operation: AD Conversion of N Signal from Pixel 11 in Each Row

This operation is performed in a similar manner to the operation shown in FIGS. 8A and 8B.

Operation: Reading of A Signal from Pixel 11 in Each Row

At time t9, the vertical scanning circuit changes the level of the signal PTXA to be output to the pixel 11 in the 1st row to the high level. As a result, a charge accumulated in the photodiode 601*a* is transferred to the FD part 605 via the transfer transistor 603*a*. As a result, the electric potential of the FD part 605 becomes equal to an electric potential corresponding to the charge transferred from the photodiode 601*a*. An A signal from the pixel 11 in the 1st row is output to the signal line 201(A) in each column. This A signal is a first signal based only on a signal generated in part of a plurality of photodiodes. This first signal may be used as a signal for use in detecting a focus.

At time t10, the vertical scanning circuit changes the level of the signal PTXA to be output to the pixel 11 in the 2nd row to the high level. Thus, to the signal line 201(B) in each column, the A signal from the pixel 11 in the 2nd row is output.

At time t11, the vertical scanning circuit changes the level of the signal PTXA to be output to the pixel 11 in the 3rd row to the high level. Thus, to the signal line 201(C) in each column, the A signal from the pixel 11 in the 3rd row is output.

At time t12, the vertical scanning circuit changes the level of the signal PTXA to be output to the pixel 11 in the 4th row to the high level. Thus, to the signal line 201(D) in each column, the A signal from the pixel 11 in the 4th row is output.

Operation: AD Conversion of A Signal Corresponding to Pixel 11 in Each Row.

At time t17, the MPX circuit 350(A) outputs a signal received from the signal line 201(A), that is, an A signal of the pixel 11 in the 1st row, to the ADC 360(A). The ADC 360(A) converts the A signal of the pixel 11 in the 1st row to a digital signal.

At time t18, the MPX circuit 350(A) outputs a signal received from the signal line 201(B), that is, an A signal of the pixel 11 in the 2nd row, to the ADC 360(A). The ADC 360(A) converts the A signal of the pixel 11 in the 2nd row to a digital signal.

At time t19, the MPX circuit 350(A) outputs a signal received from the signal line 201(C), that is, an A signal of the pixel 11 in the 3rd row, to the ADC 360(A). The ADC 360(A) converts the A signal of the pixel 11 in the 3rd row to a digital signal.

At time t20, the MPX circuit 350(A) outputs a signal received from the signal line 201(D), that is, an A signal of the pixel 11 in the 4th row, to the ADC 360(A). The ADC 360(A) converts the A signal of the pixel 11 in the 4th row to a digital signal.

Operation: Reading of A+B Signal from Pixel 11 in Each Row

At time t18, the vertical scanning circuit changes the levels of the signals PTXA and PTXB to be output to the pixel 11 in the 1st row to the high level. As a result, charges accumulated in the photodiodes 601*a* and 601*b* are transferred to the FD part 605 via the transfer transistors 603*a* and 603*b*. Thus, to the signal line 201(A), the A+B signal from the pixel 11 in the 1st row is output.

At time t19, the vertical scanning circuit changes the levels of the signals PTXA and PTXB to be output to the pixel 11 in the 2nd row to the high level. As a result, charges accumulated in the photodiodes 601*a* and 601*b* are transferred to the FD part 605 via the transfer transistors 603*a* and 603*b*. Thus, to the signal line 201(B), the A+B signal from the pixel 11 in the 2nd row is output.

At time t20, the vertical scanning circuit changes the levels of the signals PTXA and PTXB to be output to the pixel 11 in the 3rd row to the high level. As a result, charges accumulated in the photodiodes 601*a* and 601*b* are transferred to the FD part 605 via the transfer transistors 603*a* and 603*b*. Thus, to the signal line 201(C), the A+B signal from the pixel 11 in the 3rd row is output.

At time t21, the vertical scanning circuit changes the levels of the signals PTXA and PTXB to be output to the pixel 11 in the 4th row to the high level. As a result, charges accumulated in the photodiodes 601*a* and 601*b* are transferred to the FD part 605 via the transfer transistors 603*a* and 603*b*. Thus, to the signal line 201(D), the A+B signal from the pixel 11 in the 4th row is output.

Operation: AD Conversion of A+B Signal from Pixel 11 in Each Row

At time t26, the MPX circuit 350(A) outputs a signal received from the signal line 201(A), that is, an A+B signal of the pixel 11 in the 1st row, to the ADC 360(A). The ADC 360(A) converts the A+B signal of the pixel 11 in the 1st row to a digital signal.

At time t27, the MPX circuit 350(A) outputs a signal received from the signal line 201(B), that is, an A+B signal of the pixel 11 in the 2nd row, to the ADC 360(A). The ADC 360(A) converts the A+B signal of the pixel 11 in the 2nd row to a digital signal.

At time t28, the MPX circuit 350(A) outputs a signal received from the signal line 201(C), that is, an A+B signal of the pixel 11 in the 3rd row, to the ADC 360(A). The ADC 360(A) converts the A+B signal of the pixel 11 in the 3rd row to a digital signal.

At time t29, the MPX circuit 350(A) outputs a signal received from the signal line 201(D), that is, an A+B signal of the pixel 11 in the 4th row, to the ADC 360(A). The ADC 360(A) converts the A+B signal of the pixel 11 in the 4th row to a digital signal.

Thereafter, the vertical scanning circuit changes the level of the signal PSEL(5) supplied to the pixel 11 in the 5th row to the high level. Subsequently, the operation is repeated in a similar manner.

In this way, the image capturing apparatus according to the present embodiment is capable of acquiring the digital signal based on the N signal of each pixel, the digital signal based on the A signal of each pixel, and the digital signal based on the A+B signal of each pixel.

Further Advantageous Effect of the Present Embodiment: Enhancement of Operation Speed of Image Capturing Apparatus by Parallel Operations Shown in FIGS. 9A and 9B.

In operations shown in FIGS. 9A and 9B, a plurality of operations are performed in parallel as described below.

(1) Reading of an N signal corresponding to the pixel 11 in the 1st row and reading of an N signal from the pixel 11 in the 2nd row are performed in parallel.

(2) AD conversion of the N signal corresponding to the pixel 11 in the 1st row and reading of an N signal corresponding to the pixel 11 in the 2nd row are performed in parallel.

(3) AD conversion of the N signal corresponding to the pixel 11 in the 4th row and reading of an A signal corresponding to the pixel 11 in the 1st row are performed in parallel.

(4) Reading of the A signal corresponding to the pixel 11 in the 1st row and reading of an A signal from the pixel 11 in the 2nd row are performed in parallel.

(5) AD conversion of the A signal corresponding to the pixel 11 in the 1st row and reading of the A signal corresponding to the pixel 11 in the 2nd row are performed in parallel.

(6) AD conversion of an A signal corresponding to the pixel 11 in the 4th row and reading of an A+B signal corresponding to the pixel 11 in the 1st row are performed in parallel.

(7) AD conversion of the A+B signal corresponding to the pixel 11 in the 1st row and reading of an A+B signal corresponding to the pixel 11 in the 2nd row.

(8) AD conversion of the A+B signal corresponding to the pixel 11 in the 1st row and reading of an A signal corresponding to the pixel 11 in the 2nd row.

Performing the parallel operations described above makes it possible to reduce a waiting time until the ADC 360(A) starts a next AD conversion after the ADC 360(A) ends a previous AD conversion. Thus, it is possible to reduce the total time for performing the AD conversion on signals output from all pixels 11. This makes it possible to increase the frame rate of the image capturing apparatus.

Note that the present embodiment is not limited to the examples described above. For example, the MPX circuit 350 may operate such that for one frame period, an effective pixel 13 having a color filter of the first color is connected to the ADC 360 but an effective pixel 13 having a color filter of the second color is not connected to the ADC 360. More specifically, for example, for effective pixels 13 having color filters of R and G and located in one column, the MPX circuit 350 may operate such that for one frame period, the signal lines 201(A) and 201(C) connected to effective pixels 13 having color filters of the first color, that is, the R color, are connected to the ADC 360 but, for this one frame period, the signal lines 201(B) and 201(D) connected to effective pixels 13 having color filters of the second color, that is, the G color, are not connected to the ADC 360. In this example, only signals of effective pixels 13 of one color are input to the ADC 360. As a result, it is possible to simplify the correction process performed by the ADC 360 during or after the AD conversion.

In the present embodiment, one signal processing circuit 21 is provided for each set of pixels 11 located in one column. However, the configuration is not limited to this example. A plurality of signal processing circuits 21 may be provided for each set of pixels 11 located in one column. For example, one signal processing circuit 21 may be provided for being connected to the signal lines 201(A) and 201(B) and another signal processing circuit 21 may be provided for being connected to the signal lines 201(C) and 201(D). Alternatively, for example, one signal processing circuit 21 may be shared by a plurality of pixel columns.

Second Embodiment

A second embodiment is described below focusing on differences from the first embodiment. In the second embodiment, an image capturing apparatus uses a successive approximation AD converter as the ADC 360 used in the first embodiment. The other elements in the configuration may be identical to those of the image capturing apparatus according to the first embodiment.

Equivalent Circuit of Successive Approximation ADC

Figure 11:
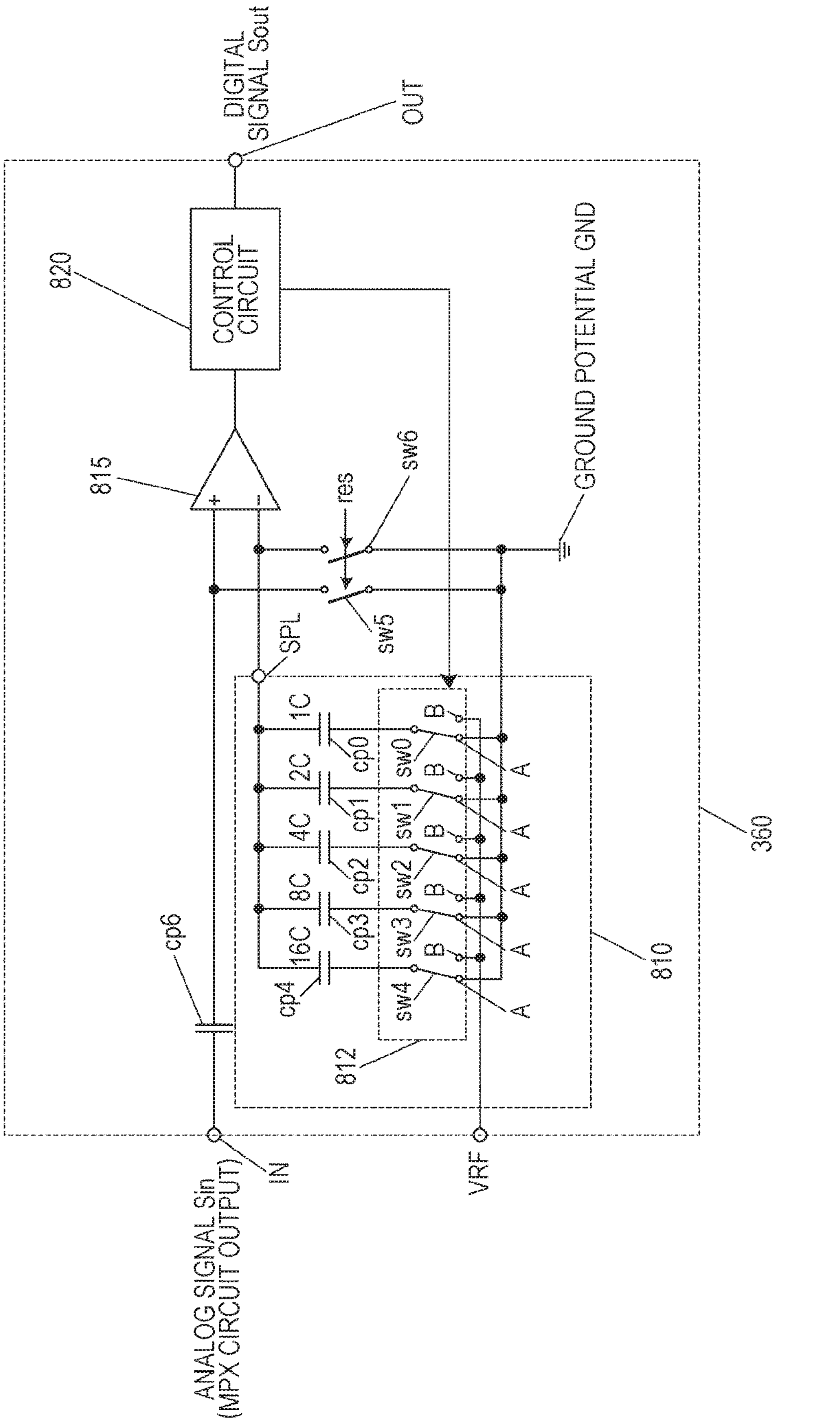
FIG. 11 is a diagram illustrating an equivalent circuit of an AD conversion circuit.

FIG. 11 is a diagram illustrating an equivalent circuit of the ADC 360 according to the present embodiment.

The ADC 360 has an input node IN and an output node OUT. An analog signal Sin (output from the MPX circuit 350) input to the input node IN is converted to a digital signal Sout and output from the output node OUT. This analog signal Sin may be one or both of the N signal and the S signal described in the first embodiment. The ADC 360 converts the output from the MPX circuit output into the digital signal Sout with a resolution of 5 bits.

The ADC 360 further includes a generation circuit 810 configured to generate a comparison signal for use in comparison with the analog signal Sin. The generation circuit 810 includes a plurality of capacitive elements cp0 to cp4 having binary weighted capacitance values, and a plurality of switches sw0 to sw4 respectively connected to the capacitive elements cp0 to cp4. The plurality of switches sw0 to sw4 form a switch circuit for selecting one or more of the capacitive elements cp0 to cp4. The binary weights refer to a set of weights (capacitance values) given by a geometric progression with a geometric ratio of 2. In the example shown in FIG. 11, the capacitive elements cp0 to cp4 respectively have capacitance values of 1 C, 2 C, 4 C, 8 C, and 16 C. One of electrodes of each of the capacitive elements cp0 to cp4 is connected to a supply node SPL of the generation circuit 810, and the other one is connected to corresponding one of the switches sw0 to sw4. One of terminals of each of the switches sw0 to sw4 is connected to corresponding one of the capacitive elements cp0 to cp4, and the other one toggles between nodes A and B. The node A is supplied with a ground potential GND, and the node B is supplied with a reference voltage VRF. The reference voltage VRF is a constant voltage supplied from the outside of the ADC 360 and having a value higher than the ground potential GND. When the switch sw0 toggles to the node A, the ground potential GND is supplied to the capacitive element cp0. When the switch sw0 toggles to the node B, the reference voltage VRF is supplied to the capacitive element cp0. The other switches sw1 to sw4 are also supplied with voltages in a similar manner. Changing over of the switches sw0 to sw4 results in a change in the combined capacitance value of capacitive elements connected between the supply node SPL and the reference voltage VRF, which in turn causes a change in the value of the comparison signal Vcmp output from the supply node SPL.

The ADC 360 further includes a comparator 815. The comparator 815 compares the value of the analog signal Sin with the value of the comparison signal Vcmp and outputs a signal corresponding to a comparison result. A non-inverting node of the comparator 815 is input with the analog signal Sin via a capacitive element cp6, while an inverting node of the comparator 815 is input with the comparison signal Vcmp from the supply node SPL of the generation circuit 810. Thus, when the value of the analog signal Sin is higher than or equal to the value of the comparison signal Vcmp, the comparator 815 outputs a high-level signal, while when the value of the analog signal Sin is lower than the value of the comparison signal Vcmp, the comparator 815 outputs a low-level signal. Although in the present example, the high-level signal is output when the value of the analog signal Sin is equal to the value of the comparison signal Vcmp, alternatively the low-level signal may be output. The capacitive element cp6 is adjusted within a range in which it is allowed to compare the value of the analog signal Sin with the value of the comparison signal Vcmp. In the present embodiment, for simplicity of explanation, it is assumed that the value of the analog signal Sin is in a range from ground potential GND to the reference voltage VRF, and a signal with the same value as the value of the analog signal Sin is supplied to the non-inverting node of the comparator 815.

In the example shown in FIG. 11, the analog signal Sin is supplied to the non-inverting node of the comparator 815, and the comparison signal Vcmp is supplied to the inverting node of the comparator 815. However, other configurations are allowed as long as it is possible to judge which is larger or smaller between the value of the analog signal Sin and the value of the comparison signal Vcmp. For example, a difference between the analog signal Sin and the comparison signal Vcmp may be supplied to the non-inverting node of the comparator 815, and the ground potential GND may be supplied to the inverting node of the comparator 815.

The ADC 360 further includes switches sw5 and sw6. When these switches sw5 and sw6 turn on, the ground potential GND is supplied to the non-inverting node and the inverting node of the comparator 815, and thus the comparator 815 is reset.

The ADC 360 further includes a control circuit 820. A comparison result is supplied from the comparator 815 to the control circuit 820, and the control circuit 820 generates a digital signal Sout based on the received comparison result and outputs the resultant digital signal Sout from an output node OUT. The control circuit 820 transmits control signals to the respective switches sw0 to sw6 thereby switching the states thereof. The ADC 360(A) includes a comparator 815 and a generation circuit 810 which are different from the comparator 815 and the generation circuit 810 disposed in the ADC 360(B). That is, the first AD conversion unit and the second AD conversion unit respectively include different comparators and different generation circuits.

Operation of Successive Approximation ADC

Figure 12:
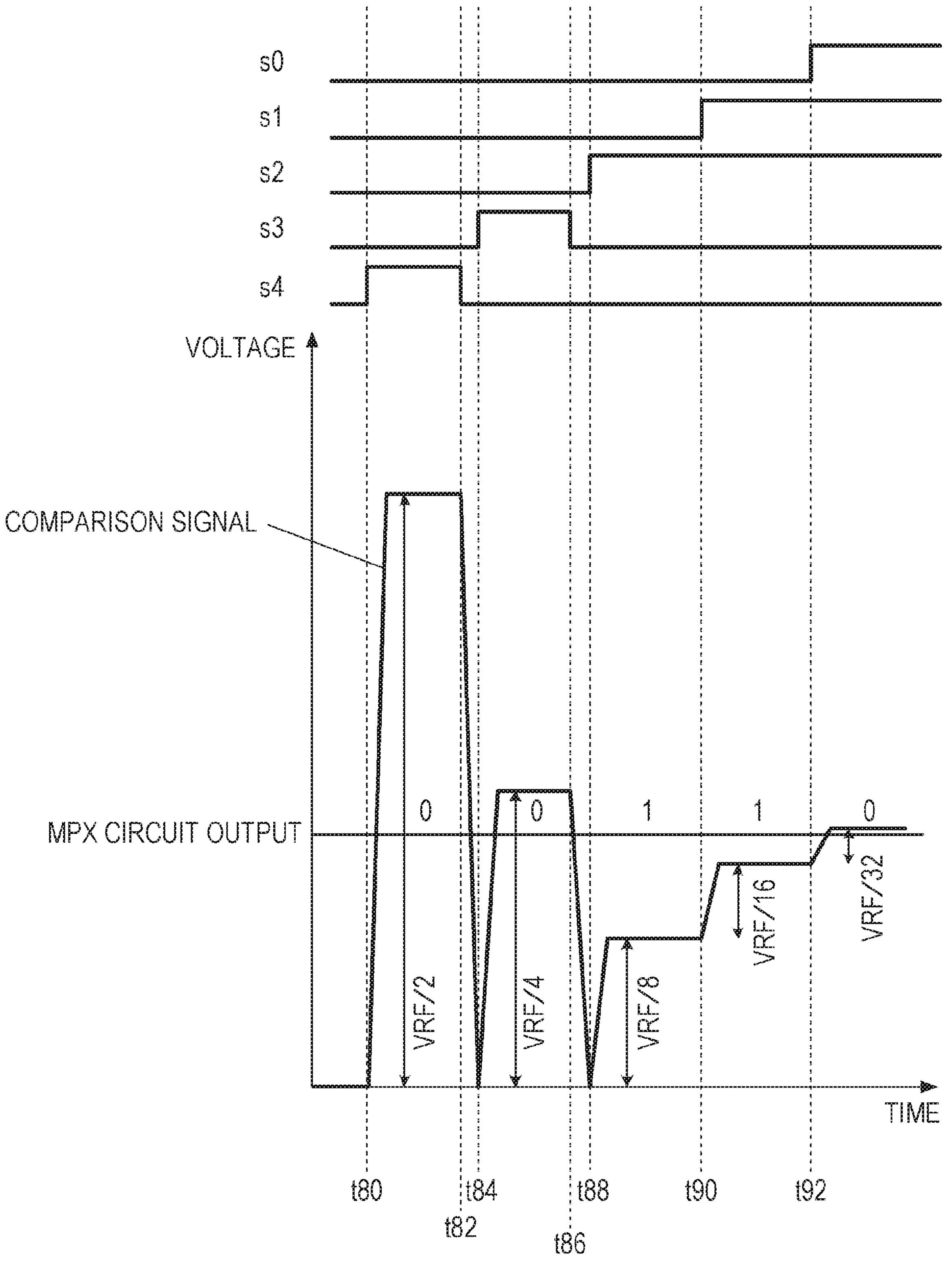
FIG. 12 is a diagram illustrating an operation of an AD conversion circuit.

In FIG. 12, sw0 to sw6 respectively indicate values of the control signals supplied from the control circuit 820 to the switches sw0 to sw6. Each of the switches sw0 to sw4 toggles to the node B when the supplied control signal is at the high level, while each of the switches sw0 to sw4 toggles to the node A when the control signals at the low level. Each of the switches sw5 and sw6 turns on when the supplied control signal is at the high level, while each of the switches sw5 and sw6 turns off when the control signal is at the low level. In a lower part of FIG. 12, the analog signal Sin and the comparison signal Vcmp are shown. In FIG. 12, by way of example, the analog signal Sin has a value corresponding to a binary number 00110.

Next, a time-series AD conversion operation of the AD converter 100 is described below. In a preparation period, the control circuit 820 supplies the control signal at the low level to the switches sw0 to sw4, and supplies the control signal at the high level to the switches sw5 and sw6. As a result, the non-inverting node and the inverting node of the comparator 815 are reset to the ground potential GND, and the value of the comparison signal Vcmp becomes equal to the ground potential GND. Thereafter, the control circuit 820 changes the level of the control signal supplied to the switches sw5 and sw6 to the low level. In the following operation, the analog signal Sin is continuously supplied to the non-inverting node of the comparator 815.

Next, when a successive approximation period starts, the control circuit 820 changes the level of the control signal supplied to the switch sw4 to the high level. As a result, the switch sw4 toggles to the node B, and thus the reference voltage VRF is applied to the supply node SPL of the generation circuit 810 via the capacitor cp4 having the largest capacitance value of the binary weights. As a result, the comparison signal Vcmp increases by VRF/2 and thus the value of the comparison signal Vcmp becomes equal to VRF/2. The control circuit 820 determines, based on the comparison result supplied from the comparator 815, that the value of the analog signal Sin is smaller than the value of the comparison signal Vcmp (VRF/2), and thus the control circuit 820 returns the level of the control signal supplied to the switch sw4 to the low level. As a result, the value of the comparison signal Vcmp returns to the ground potential GND. This comparison result means that the value of the MSB (the fifth bit as counted from the LSB regarded as the first bit) of the digital signal Sout is 0.

Next, the control circuit 820 changes the level of the control signal supplied to the switch sw3 to the high level. As a result, the reference voltage VRF is applied to the supply node SPL of the generation circuit 810 via the capacitor cp3 having a next largest capacitance of the binary weights. As a result, the comparison signal Vcmp increases by VRF/4, and thus the value of the comparison signal Vcmp becomes equal to VRF/4. The control circuit 820 determines, based on the comparison result given from the comparator 815, that the value of the analog signal Sin is smaller than the value (VRF/4) of the comparison signal Vcmp, and thus the control circuit 820 returns the level of the control signal supplied to the switch sw3 to the low level. As a result, the value of the comparison signal Vcmp returns to the ground potential GND. The comparison result means that the fourth bit of the value of the digital signal Sout is equal to 0.

Next, the control circuit 820 changes the level of the control signal supplied to the switch sw2 to the high level. As a result, the reference voltage VRF is applied to the supply node SPL of the generation circuit 810 via the capacitor cp2 having a third largest capacitance of the binary weights. As a result, the comparison signal Vcmp increases by VRF/8, and thus the value of the comparison signal Vcmp becomes equal to VRF/8. The control circuit 820 determines, based on the comparison result given from the comparator 815, that the value of the analog signal Sin is larger than the value (VRF/8) of the comparison signal Vcmp, and thus the control circuit 820 maintains the level of the control signal supplied to the switch sw2 at the high level. As a result, the value of the comparison signal Vcmp is maintained at VRF/8. The comparison result means that the third bit of the value of the digital signal Sout is equal to 1.

Next, the control circuit 820 changes the level of the control signal supplied to the switch sw1 to the high level. As a result, the reference voltage VRF is applied to the supply node SPL of the generation circuit 810 via the capacitor cp1 having a fourth largest capacitance of the binary weights and via the capacitor cp2. As a result, the comparison signal Vcmp increases by VRF/16, and thus the value of the comparison Vcmp becomes equal to VRF*$\frac{3}{16}$. Note that in the present specification, a symbol * is used to denote multiplication. The control circuit 820 determines, based on the comparison result given from the comparator 815, that the value of the analog signal Sin is larger than the value (VRF*$\frac{3}{16}$) of the comparison signal Vcmp, and thus the control circuit 820 maintains the level of the control signal supplied to the switch sw1 at the high level. As a result, the value of the comparison signal Vcmp is maintained at VRF*$\frac{3}{16}$. The comparison result means that the second bit of the value of the digital signal Sout is equal to 1.

Finally, the control circuit 820 changes the level of the control signal supplied to the switch sw0 to the high level. As a result, the reference voltage VRF is applied to the supply node SPL of the generation circuit 810 via the capacitor cp0 having a fifth largest capacitance of the binary weights and via the capacitors cp1 and cp2. As a result, the comparison signal Vcmp increases by VRF/32, and thus the value of the comparison signal Vcmp becomes equal to VRF*$\frac{7}{32}$. The control circuit 820 determines, based on the comparison result given from the comparator 815, that the value of the analog signal Sin is smaller than the value (VRF*7/32) of the comparison signal Vcmp, and thus the control circuit 820 returns the level of the control signal supplied to the switch sw0 to the low level. As a result, the value of the comparison signal Vcmp returns to VRF*3/16. The comparison result means that the first bit of the value of the digital signal Sout is equal to 0.

Based on the result of the successive approximation performed in the above-described manner, the control circuit 820 determines that the digital signal Sout corresponding to the analog signal is 00110.

As described above, the ADC 360 capable of generating a digital signal corresponding to the input analog signal by performing the AD conversion.

Other AD Conversion Methods

In the second embodiment, as an example, the ADC 360 using the successive approximation AD converter has been described. However, the ADC 360 is not limited to the successive approximation AD converter. Other types of AD converters, such as a ramp-compare ADC, a delta-sigma ADC, a pipeline ADC, a flash ADC, or the like may be employed.

Third Embodiment

An image capturing apparatus according to a third embodiment is described below focusing on differences from the first embodiment. In this third embodiment, signals from different pixel columns are input to one ADC 360 via one MPX circuit 350.

Equivalent Circuit of Image Capturing Apparatus

Figure 13:
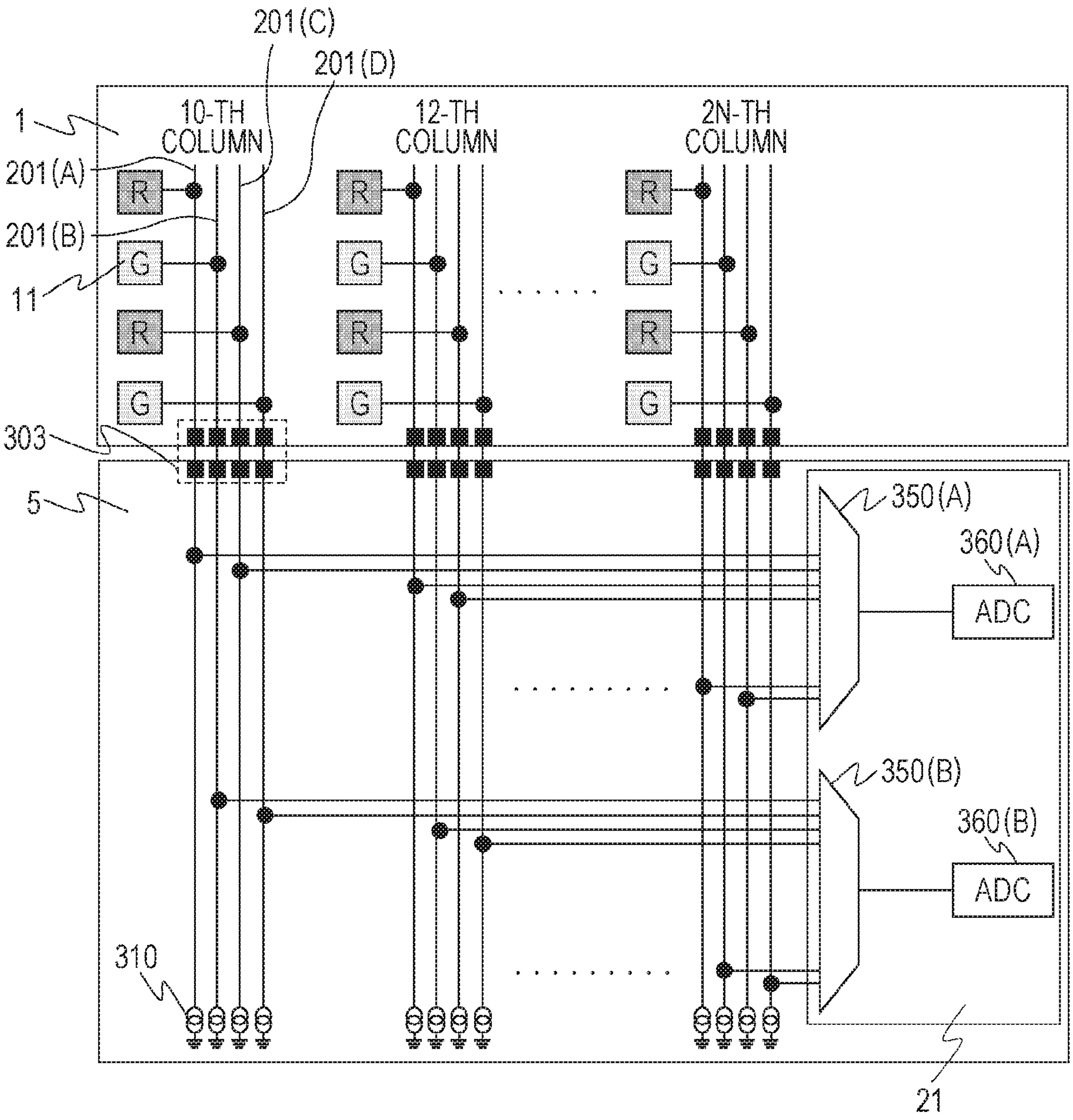
FIG. 13 is a diagram illustrating a manner in which pixels are connected to signal processing circuits.

FIG. 13 is a diagram illustrating an equivalent circuit of the image capturing apparatus. In FIG. 13, all pixels 11 shown in FIG. 3 are not shown here, but only pixels 11 in some columns in the effective pixel area 830 are shown. Signal lines and pixels 11 are disposed on the first chip 1 such that four signal lines 201(A) to 201(D) are provided for pixels 11 in one column. In the following description, when the signal lines 201(A) to 201(D) are not distinguished from each other, a simple expression such as a signal line 201 or signal lines 201 will be used. A pixel 11 in the first row is connected to the signal line 201(A). Similarly, pixels 11 in the second to fourth rows are respectively connected to the signal lines 201(B) to 201(D). In other columns, signal lines 201(A) to 201(D) are disposed such that pixels 11 are connected in a similar manner as in the first column.

The signal lines 201(A) and 201(C) are each connected, via a connection unit 303, to a multiplex circuit (hereinafter referred to as an MPX circuit) 350(A) included in the signal processing circuit 21. The signal processing circuit 21 includes AD conversion circuits (hereinafter, in the specification and the drawings, referred to as ADCs) 360(A) and 360(B). The MPX circuit 350(A) is a first selection unit including an input part connected to the signal lines 201(A) and 201(C) and an output part connected to the ADC 360(A).

The signal lines 201(B) and 201(D) are each connected to an MPX circuit 350(B) disposed in a signal processing circuit 21 via the connection unit 303. The MPX circuit 350(B) is a second selection unit including an input part connected to the signal lines 201(B) and 201(D) and an output part connected to the ADC 360(B).

As shown in FIG. 13, each of all pixels 11 connected to the ADC 360(A) has an R color filter. On the other hand, any pixel 11 connected to the ADC 360(B) has a G color filter. As described above, any one of the plurality of first pixels 11 each having a color filter of a first color (R) is connected to the ADC 360(A) functioning as a first AD conversion unit without being connected to the ADC 360(B) functioning as a second AD conversion unit. As for the plurality of first pixels 11 each having a color filter of a second color (G), each first pixel 11 is connected to the ADC 360(B) functioning as the second AD conversion unit without being connected to the ADC 360(A) functioning as the first AD conversion unit.

Furthermore, as shown in FIG. 13, the second chip 5 includes current sources 310. Each current source 310 supplies a current to a signal line 201 in each column via the connection unit 303.

Figure 14:
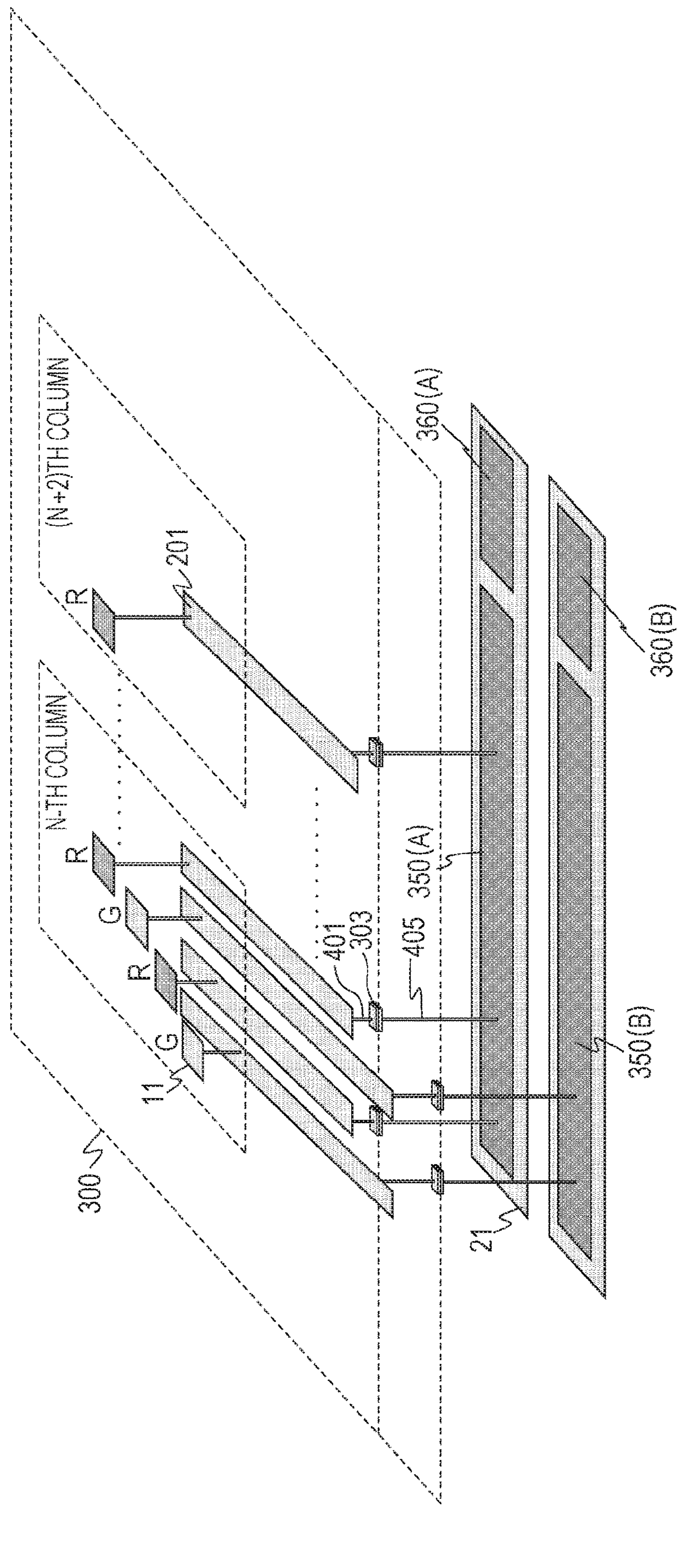
FIG. 14 is a diagram illustrating a manner in which pixels are connected to signal processing circuits.

Cross-Sectional Structure of Connection Unit and Surrounding Elements in Image Capturing Apparatus FIG. 14 is a diagram illustrating a cross-sectional structure of the image capturing apparatus shown in FIG. 13. FIG. 14 mainly illustrates pixels 11 disposed in four rows and in one column and a pixel disposed in the 1st row and in the 11th column. The first chip 1 and the second chip 5 shown in FIG. 1 are connected to each other via a connection plane 300.

Figure 15:
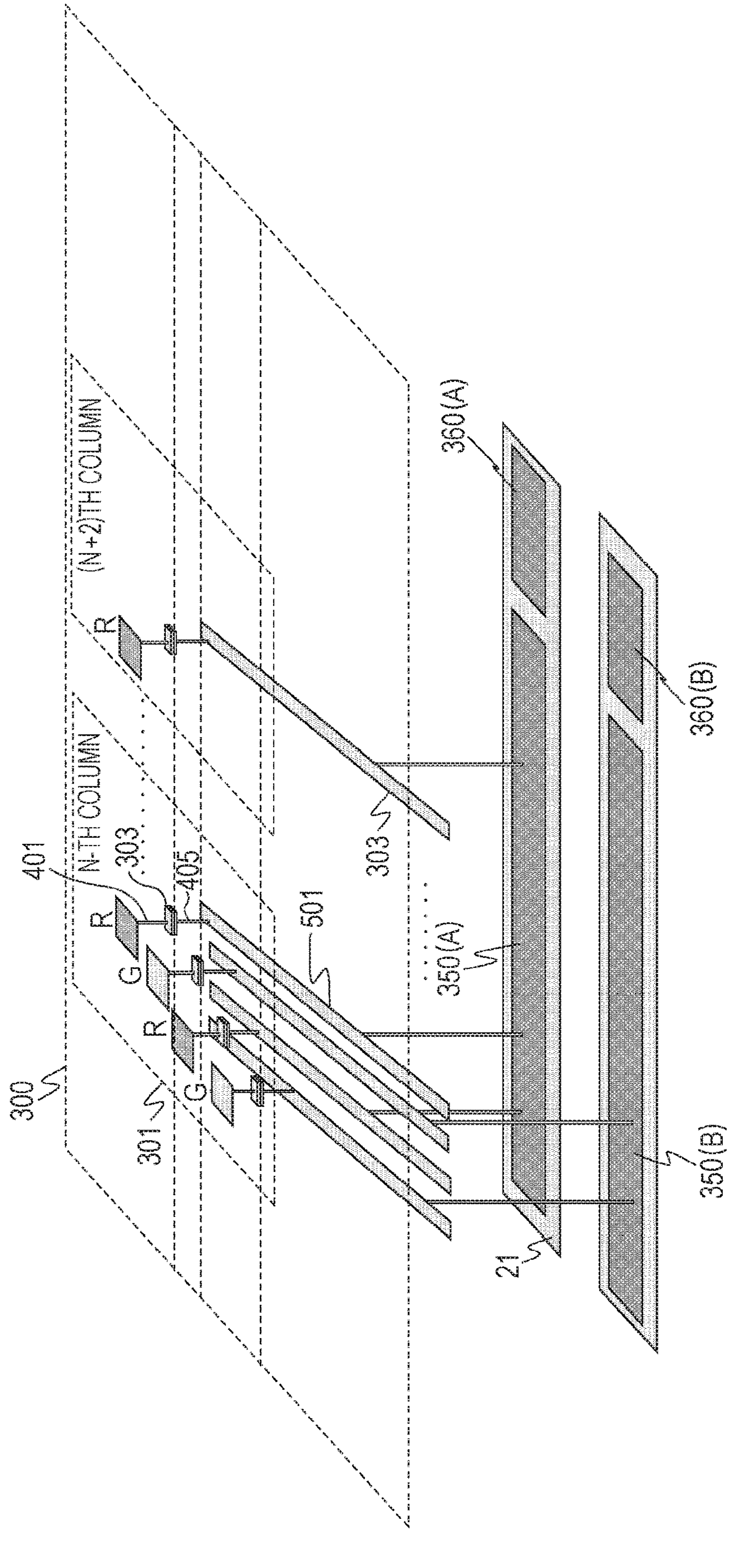
FIG. 15 is a diagram illustrating a manner in which pixels are connected to signal processing circuits.

The image capturing apparatus according to the present embodiment is of a back-illuminated type. Each pixel 11 includes a non-illustrated photoelectric conversion element. A signal line 201 is disposed between the photoelectric conversion element and the connection plane 300. The signal line 201 extends in a predetermined direction (along columns in the example shown n FIG. 4) with respect to the pixels 11. The signal line 201 is connected to the connection unit 303 via a connection line 401. The MPX circuit 350(A) is connected to the connection unit 303 via a connection line 405. The connection line 401, the connection line 405, and the connection unit 303 are disposed such that they overlap with each other when seen in plan view. In other words, the signal processing circuit 21 and the signal line 201 are connected to each other via the connection line 405 and the connection line 401 formed so as to overlap with the connection line 405 as seen in plan view. By connecting the connection line 401 to the signal line 201 extending in the predetermined direction, the signal line 201 and the MPX circuit 350 are connected to each other. The extending of the signal line 201 in the predetermined direction makes it easy to connect the connection line 401 and the signal line 201 to each other. In an alternative example, as shown in FIG. 15, signal lines 501 extending in the predetermined direction may be disposed not on the first chip 1 but on the second chip 5. Also in this configuration, it is possible to connect pixels 11 to the MPX circuit 350(A). However, it is more preferable to dispose the signal lines extending in the predetermined direction on the first chip 1 as shown in FIG. 14 than disposing the signal lines on the second chip 5 as shown in FIG. 15. This is because the second chip 5 including the signal processing circuits 21 has a greater number of wiring layers than the number of wiring layers included in the first chip 1 including the pixels 11. Disposing the signal lines 201 on the first chip 1 having a small number of wiring layers as shown in FIG. 14 can provide a higher design flexibility than can be achieved by disposing the signal lines 501 on the second chip 5 having a large number of wiring layers as shown in FIG. 15.

Operation of Image Capturing Apparatus

Figure 16:
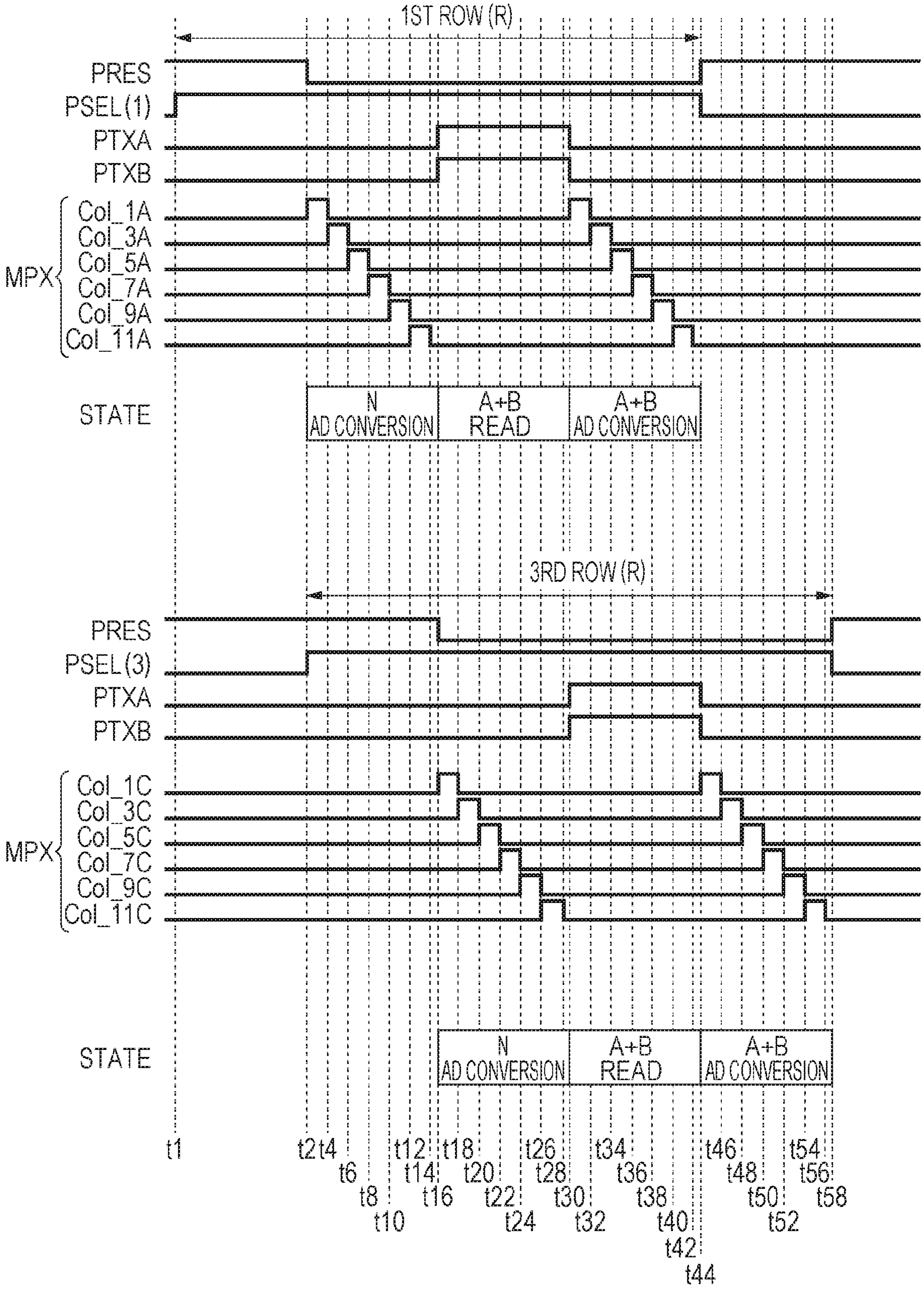
FIG. 16 is a diagram illustrating an operation of an image capturing apparatus.

FIG. 16 is a diagram illustrating an operation of an image capturing apparatus.

A signal PRES shown in FIG. 16 denotes a signal supplied from the vertical scanning circuit to the gate of the reset transistor 606 via the control line 660. Similarly, a signal PSEL denotes a signal supplied from the vertical scanning circuit to the gate of the selection transistor 608 of the pixel 11 in a N-th row via the control line 665. As for the signal PSEL, a numeral described between parentheses following PSEL indicates the row location of the pixel 11 to which the signal PSEL is supplied. That is, for example, the signal PSEL(1) denotes a signal PSEL supplied to the pixel 11 in the 1st row. A signal PTXA denotes a signal supplied from the vertical scanning circuit to the gate of the transfer transistor 603*a* via the control line 650. A signal PTXB denotes a signal supplied from the vertical scanning circuit to the gate of the transfer transistor 603*b* via the control line 655.

In FIG. 16, operations associated with the MPX circuit 350(A) and the ADC 360(A) are shown. As shown in FIG. 13, the MPX circuit 350(A) and the ADC 360(A) are input with signals output from pixels 11 each having the R color filter and located in the 1st row and the 3rd row and in odd-numbered columns of the 1st to 12th columns. Thus, FIG. 16 shows operations associated with pixels 11 located in the 1st row and the 3rd row and in odd-numbered columns of the 1st to 12th columns.

A signal MPX shown in FIG. 16 denotes a signal output from a non-illustrated timing generator to the MPX circuit 350(A). In response to a change in the signal value of the signal MPX, the MPX circuit 350(A) switches the signal to be output to the ADC 360(A) sequentially one to another among the signal lines 201 corresponding to pixels 11 in the odd-numbered columns of the 1st to 12th columns.

In FIG. 16, Col_nm denotes a specific column which is selected as a column for which a signal is output by the MPX circuit 350(A) to the ADC 360(A). More specifically, n of Col_nm denotes a column number of pixels 11 and m of Col_nm denotes an alphabet (A to D) described at a suffix of the signal lines 201(A) to (D) corresponding to one column of pixels 11. For example, Col_1A indicates a signal line 201(A) corresponding to a pixel 11 in the 1st column.

At time t1, the signal PRES at a high level is output from the vertical scanning circuit to pixels 11 in the 1st row and the 3rd row. As a result, the reset transistor 606 of the pixel 11 in the 1st row is in an ON-state. Thus, the FD part 605 is reset to an electric potential corresponding to the power supply voltage Vdd. Furthermore, at time t1, the signal PSEL(1) output from the vertical scanning circuit is at the high level. As a result, the selection transistor 608 of the pixel 11 in the 1st row turns on. As a result, a current output from the current source 310 shown in FIG. 13 is supplied to the amplifier transistor 607 via the selection transistor 608 of the pixel 11 in the 1st row. As a result, a source follower circuit is formed by the power supply voltage Vdd, the amplifier transistor 607, and the current source 310. That is, a source follower operation is performed such that the amplifier transistor 607 outputs a signal corresponding to the electric potential of the FD part 605 to the signal line 201 via the selection transistor 608.

Operation: Reading of N Signal Corresponding to Pixel 11 in 1st Row

At time t2, the vertical scanning circuit changes the signal PRES output to the pixel 11 in the 1st row to a low level. As a result, the reset transistor 606 of the pixel 11 in the 1st row turns off. Thus, the reset state of the FD part 605 is released. The amplifier transistor 607 outputs a signal based on the electric potential of the FD part 605, whose reset state has been released, to the signal line 201(A) shown in FIG. 13. This signal denoted as an N signal (a noise signal). As a result, N signals are output from pixels 11 to the signal lines 201(A) in the respective columns.

Operation: AD Conversion of N Signal Corresponding to Pixel 11 in 1st Row

In a period following time t2, in response to the signal MPX supplied from the timing generator, the MPX circuit 350(A) sequentially connects the signal lines 201(A), corresponding to the pixels 11 in odd-numbered columns of the 1st to 12th columns, to the ADC 360(A).

The ADC 360(A) performs AD conversion on the noise signal output from the MPX circuit 350(A) via the signal line 201(A) in the 1st column. Thereafter, the ADC 360(A) performs AD conversion sequentially on the noise signals output to the signal lines 201(A) corresponding to the pixels 11 in the odd-numbered columns of the 1st to 12th columns.

Operation: Reading of N Signal Corresponding to Pixel 11 in 3rd Row

At time t16, the vertical scanning circuit changes the level of the signal output to the pixel 11 in the 3rd row to the low level. As a result, the reset transistor 606 of the pixel 11 in the 3rd row turns off. Thus, the reset state of the FD part 605 is released. The amplifier transistor 607 outputs an N signal, that is, a signal based on the electric potential of the FD part 605 whose reset state has been released to the signal line 201(C) shown in FIG. 13. Thus, noise signals are output from pixels 11 to signal lines 201(C) in the respective columns.

Operation: AD Conversion of N Signal Corresponding to Pixel 11 in 3rd Row

In a period following time t16, in response to the signal MPX supplied from the timing generator, the MPX circuit 350(A) sequentially connects the signal lines 201(C) corresponding to the pixels 11 in odd-numbered columns of the 1st to 12th columns to the ADC 360(A).

The ADC 360(A) performs AD conversion on the N signal output from the MPX circuit 350(A) via the signal line 201(C) in the 1st column thereby generation a digital signal corresponding to the N signals. Thereafter, the ADC 360(A) performs AD conversion sequentially on the noise signals output to the signal lines 201(C) corresponding to the pixels 11 in the odd-numbered columns of the 1st to 12th columns thereby generating digital signals of the N signals.

Operation: Reading of A+B Signal Corresponding to Pixel 11 in 1st Row

At time t16, the vertical scanning circuit changes the levels of the signals PTXA and PTXB to be output to the pixel 11 in the 1st row to the high level. As a result, charges (electrons in the present embodiment) accumulated in the photodiodes 601*a* and 601*b* are transferred to the FD part 605 via the transfer transistors 603*a* and 603*b*. In the FD part 605, charges transferred from the photodiodes 601*a* and 601*b* are added together. As a result, the electric potential of the FD part 605 becomes equal to an electric potential corresponding to the sum of the charges transferred from the photodiodes 601*a* and 601*b*. Let an A signal denote a signal that would be output from the amplifier transistor 607 based on the electric potential of the FD part 605 if the electric potential of the FD part 605 is given only by the charge from the photodiode 601*a*. Furthermore, let a B signal denote a signal that would be output from the amplifier transistor 607 based on the electric potential of the FD part 605 if the electric potential of the FD part 605 is given only by the charge from the photodiode 601*b*. Using these notations, the signal output from the amplifier transistor 607 based on the electric potential of the FD part 605 corresponding to the sum of the charges transferred from the photodiodes 601*a* and 601*b* is equal to the sum of the A signal and the B signal, which can be denoted as an A+B signal. To the signal line 201(A) in each column, the A+B signal from the pixel 11 in the 1st row is output.

AD Conversion of A+B Signal Corresponding to Pixel 11 in 1st Row

In a period following time t30, in response to the signal MPX supplied from the timing generator, the MPX circuit 350(A) sequentially connects the signal lines 201(A) corresponding to the pixels 11 in odd-numbered columns of the 1st to 12th columns to the ADC 360(A).

The ADC 360(A) perform AD conversion on the A+B signal output from the MPX circuit 350(A) via the signal line 201(A) in the 1st column thereby generating a digital signal corresponding to the A+B signal. Thereafter, the ABC 360(A) sequentially performs AD conversion on the A+B signals output to the signal lines 201(A) corresponding to the pixels 11 in the odd-numbered columns of the 1st to 12th columns thereby generating digital signals corresponding to the A+B signals.

Operation: Reading of A+B Signal Corresponding to Pixel 11 in 3rd Row

At time t30, the vertical scanning circuit changes the levels of the signals PTXA and PTXB to be output to the pixel 11 in the 3rd row to the high level. As a result, the A+B signal from the pixel 11 in the 3rd row is output to the signal line 201(C) in each column.

Operation: AD Conversion of A+B Signal Corresponding to Pixel 11 in 3rd Row

In a period following time t44, in response to the signal MPX supplied from the timing generator, the MPX circuit 350(A) sequentially connects the signal lines 201(C), corresponding to the pixels 11 in odd-numbered columns of the 1st to 12th columns, to the ADC 360(A).

The ADC 360(A) performs AD conversion on the A+B signal output from the MPX circuit 350(A) via the signal line 201(C) in the 1st column thereby generating a digital signal corresponding to the A+B signal. Thereafter, the ADC 360(A) sequentially performs AD conversion on the A+B signals output to the signal lines 201(C) corresponding to the pixels 11 in the odd-numbered columns of the 1st to 12th columns thereby generating digital signals corresponding to the A+B signals.

Parallel Operations Performed by Image Capturing Apparatus

In the operation shown in FIG. 16, a plurality of operations are performed in parallel as described below.

(1) AD conversion of an N signal corresponding to a pixel 11 in the 1st row and reading of an N signal corresponding to a pixel 11 in the 3rd row are performed in parallel.

(2) AD conversion of the N signal corresponding to the pixel 11 in the 3rd row and reading of an A+B signal corresponding to the pixel 11 in the 1st row are performed in parallel.

(3) AD conversion of the A+B signal corresponding to the pixel 11 in the 1st row and reading of an A+B signal corresponding to the pixel 11 in the 3rd row are performed in parallel.

Performing the operations in parallel as described above makes it possible to reduce a waiting time until the ADC 360(A) starts a next AD conversion after the ADC 360(A) ends a previous AD conversion. Thus, it is possible to reduce the total time for performing the AD conversion on signals output from all pixels 11. This makes it possible to increase the frame rate of the image capturing apparatus.

Effects of the Present Embodiment

In the image capturing apparatus according to the present embodiment, as described above, pixels 11 connected to one ADC 360(A) are all such pixels having an R color filter. On the other hand, each of all pixels 11 connected to the ADC 360(B) has a G color filter. As described above, any one of the plurality of first pixels 11 each having a color filter of a first color (R) is connected to the ADC 360(A) functioning as a first AD conversion unit without being connected to the ADC 360(B) functioning as a second AD conversion unit. As for the plurality of first pixels 11 each having a color filter of a second color (G), each first pixel 11 is connected to the ADC 360(B) functioning as the second AD conversion unit without being connected to the ADC 360(A) functioning as the first AD conversion unit.

In the configuration described above, the color of light corresponding to a signal subjected to the AD conversion performed by any ADC is limited to one color. In an image capturing apparatus including a plurality of ADCs, to handle a variation in AD conversion characteristics among the ADCs, it may be necessary to perform a correction process during or after the AD conversion. An example of a correction process performed during the AD conversion is to adjust a reference signal used by the ADCs. An example of a correction process performed after the AD conversion is to correct digital signals. In a case where a plurality of colors are included in light corresponding to a signal subjected to the AD conversion by one ADC, it may be necessary to prepare correction parameters individually for the respective colors. This may result in an increase in complexity in the correction performed during or after the AD conversion.

In view of the above, in the image capturing apparatus according to the present embodiment, only one color is included in light corresponding to a signal subjected to the AD conversion by one ADC. This provides an advantageous effect to the image capturing apparatus according to the present embodiment n that the correction during or after the AD conversion is simplified.

That is, in the image capturing apparatus according to the present embodiment, a color filter if the first color is disposed on each of a plurality of first pixels, and a color filter of the second color is disposed on each of a plurality of second pixels, and pixels and AD conversion units are connected in an optimum manner.

In the present embodiment, by way of example, the image capturing system operates in an image capturing mode. However, in the present embodiment, the image capturing apparatus is capable of operating also in a focus detection+ image capturing mode described in the first embodiment. In this case, an A signal may be read from a pixel 11 and the ADC 360 may generate a digital signal from the A signal.

Fourth Embodiment

An image capturing apparatus according to a fourth embodiment is described below focusing on differences from the first embodiment.

In this fourth embodiment, a reading operation and handling of horizontal streak noise are discussed.

A possible cause of horizontal streak noise is a fluctuation of a power supply voltage. In the driving of the image capturing apparatus according to the first embodiment, as described above with reference to FIGS. 8A and 8B, the timing of reading an N signal from a pixel 11 is different from the timing of reading an A+B signal. When these signals are read, noise is superimposed on the power supply voltage Vdd shown in FIG. 7A or 7B, and thus the value of the power supply voltage Vdd can be different depending on whether the N signal or the A+B signal is read. The fluctuation of the power supply voltage Vdd propagates to the FD part 605 via parasitic capacitance between the drain and the gate of the amplifier transistor 605. This can produce a difference in noise component between the N signal and the A+B signal, and thus there can be a residual noise component after the N signal is subtracted from the A+B signal. The pixels 11 are driven by the vertical scanning circuit on a row-by-row basis, and the influence of the fluctuation of the power supply voltage Vdd on the N signal and the A+B signal can vary from one row to another row. Thus, noise appears in units of rows and this causes horizontal streak noise to appear in an image generated based on the A+B signal.

To reduce shading appearing in an image, Japanese Patent Laid-Open No. 2017-11492 discloses a technique in which a correction process is performed using a signal output from an OB pixel disposed in a vertical OB pixel area. However, in this technique, there is a difference between the timing of reading an OB pixel in the vertical OB pixel area and the timing of reading a signal from an effective pixel, and this timing difference makes it difficult to sufficiently reduce horizontal streak noise caused by the above-described fluctuation of the power supply voltage Vdd.

In the present embodiment, to handle the situation described above, when a selection transistor 608 of an effective pixel 13 is in an on-state period, a selection transistor 608 of an OB pixel 15 in the vertical OB pixel area 812B is also turned on over this period. Thus, in a period in which an N signal is read from the effective pixel 13, an N signal is read from the OB pixel 15 in the vertical OB pixel area 812B. Furthermore, in a period in which an A+B signal is read from the effective pixel 13, an A+B signal is read from the OB pixel 15 in the vertical OB pixel area 812B.

More specifically, in the driving operation shown in FIGS. 8A and 8B, Row1 drives a row in which the effective pixel 13 is located, while Row2 drives a row in which the OB pixel 15 is located in the vertical OB pixel area 812B. This makes it possible to shorten an interval between the timing of reading the N signal from the effective pixel 13 and the timing of reading the N signal from the OB pixel 15 in the vertical OB pixel area 812B. More specifically, the interval between timings is shortened by setting the timing of reading the N signal from the OB pixel 15 in the vertical OB pixel area 812B in a period from a time at which an N signal is read from an effective pixel 13 in a certain row to a time at which an N signal is read from an effective pixel in a following different row. Furthermore, it is possible to shorten an interval between the timing of reading the A+B signal from the effective pixel 13 and the timing of reading the A+B signal from the OB pixel 15 in the vertical OB pixel area 812B. Also in this case, more specifically, the interval between timings is shortened by setting the timing of reading the A+B signal from the OB pixel 15 in the vertical OB pixel area 812B in a period from a time at which an A+B signal is read from an effective pixel 13 in a certain row to a time at which an A+B signal is read from an effective pixel in a following different row.

After the ADC 360 performs an AD conversion on an N signal output from the effective pixel 13 selected by the control signal Row1 shown in FIGS. 8A and 8B, the ADC 360 performs an AD conversion on an N signal output from the OB pixel 15 selected by the control signal Row2. Furthermore, the ADC 360 performs an AD conversion on an A+B signal output from the effective pixel 13 selected by the control signal Row1 shown in FIGS. 8A and 8B, and the ADC 360 performs an AD conversion on an A+B signal output from the OB pixel 15 selected by the control signal Row2.

When a correction is performed using the signal output from the OB pixel 15, an average value of N signals output from a plurality of OB pixels 15 and/or an average value of A+B signals may be calculated.

According to the present embodiment, as described above, it is possible to prevent horizontal streak noise from easily occurring in an image.

In the above-described image capturing apparatus according to the present embodiment, it is assumed by way of example that the AD conversion is performed once for each of signals output from the effective pixel 13 and the OB pixel 15.

Alternatively, the AD conversion may be performed a plurality of times for one N signal in the vertical OB pixel area 812B. By averaging the digital signals obtained as a result of performing the AD conversion the plurality of times, it is possible to obtain a correction digital signal for correcting the signal of the effective pixel 13. The averaging of the plurality of digital signals makes it possible to reduce random noise. Thus, by correcting the signal of the effective pixel 13 using the correction digital signal obtained by averaging the plurality of digital signals, it is possible to effectively reduce noise. Note that an AD conversion may be performed a plurality of times also for each A+B signal in the vertical OB pixel area 812B.

The averaging of signal data of a plurality of OB pixels 15 may be performed for adjacent OB pixels 15 located in different columns (that is, signals may be horizontally averaged). Thus, it is possible to obtain correction values for effective pixels 13 in respective rows. Note that the manner of averaging signals is not limited to the example described above. For example, the averaging may be performed for OB pixels 15 adjacent in different rows (that is, signals may be vertically averaged). This also results in a reduction in horizontal streak noise.

Fifth Embodiment

Figure 17A:
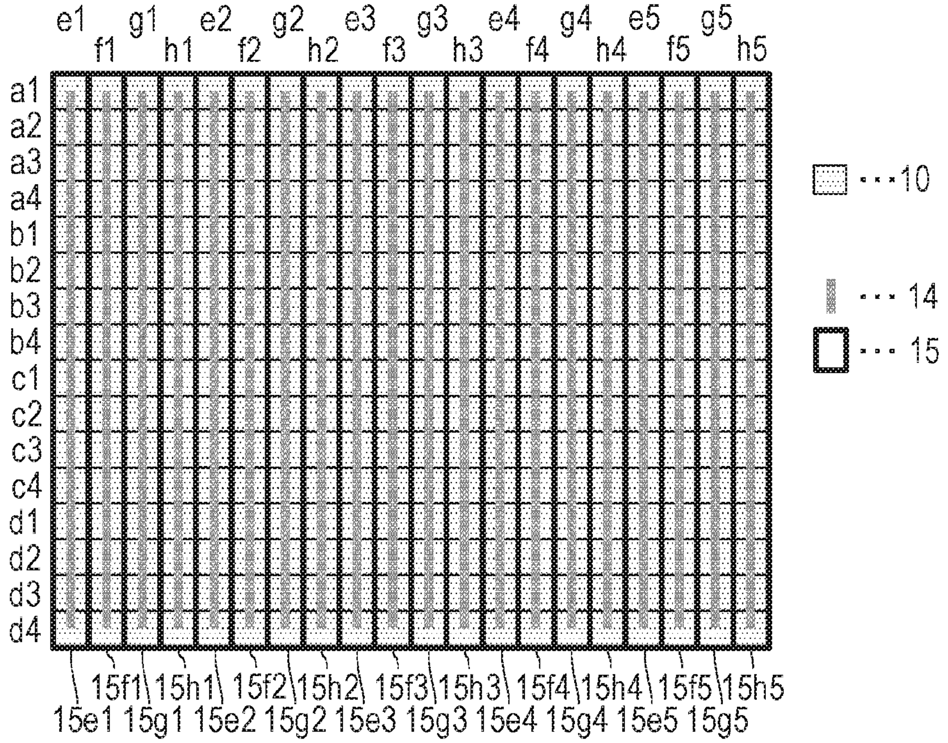
FIGS. 17A and 17B are plan views each illustrating a configuration of an image capturing apparatus.

A fifth embodiment is described with reference to FIGS. 17A and 17B. FIG. 17A illustrates a layout of a plurality of pixel circuits 10 arranged in the form of a matrix having J rows and K columns. In the present embodiment, the pixel circuit 10 may be one of the effective pixel 11, the OB pixel 15, and the reference pixel 17 according to one of the previous embodiments described above. In practice, it may be preferable that J≥100 and K≥100, and it may be more preferable that J≥1000 and K≥1000. The J rows of the pixel circuit 10 includes a1-th to a4-th rows, b1-th to b4-th rows, c1-th to c4-th rows, and cd-th to d4-th rows, in this order. The a1-th to a4-th rows (including, more specifically, a1-th row, a2-th row, a3-th row, and a4-th row at this order) are generically referred to an a-th row. The b1-th to b4-th rows (including, more specifically, b1-th row, b2-th row, b3-th row, and b4-th row in this order) are generically referred to a b-th row. a, b, c, and d are positive integers satisfying a<b<c<d. a1, a2, a3, and a4 are positive integers satisfying a1<a2<a3<a4. For example, in a case where all pixel circuits 10 are shown in FIG. 17A, a1=1, a2=2, a3=3, a4=4, b1=5, b4=8, c1=9, c4=12, d1=13, and d4J=16. For convenience of explanation, it is assumed that a1-th to d4-th rows are adjacent to each other. In a case where rows are adjacent to each other, a2=1+a1, a3=1+a2, a4=1+a3, and b1=1+a4, c1=1+b4, and d1=1+c4. Note that there can be another row that is not shown in FIG. 17A between two rows.

The K columns of pixel circuits 10 include an ne1-th column, an f1-th column, a g1-th column, an h1-th column, an e2-th column, an f2-th column, a g2-th column, and an h2-th column in this order. That is, e1, f1, g1, h1, e2, f2, g2, and h2 are positive integers satisfying e1<f1<g1<h1<e2<f2<g2<h2. Similarly, h2<e3<f3<g3<h3<e4<f4<g4<h4. For example, in a case where all pixel circuits 10 are shown in FIG. 17A, e1=1, f1=2, g1=3, h1=4, e2=5, f2=6, g2=7, h2=8, and h5=K=20. For convenience of explanation, it is assumed that e1-th to h5-th columns are adjacent to each other. In a case where columns are adjacent to each other, f1=1+e1, g1=1+f1, h1=1+g1, and e2=1+h4, e3=1+h2, e4=1+h3, and e5=1+h4. Note that there can be another column that is not shown in FIG. 17A between two columns.

Hereinafter, a pixel circuit 10 located in an α-th row and in a β-th column is denoted as a pixel circuit 10(α, β).

Two or more pixel circuits 10 of pixel circuits 10 existing in the same column are connected in common to a signal line 14. As for this signal line 14, a signal line 201 according to one of the previous embodiments may be employed. The signal line 14 extends in a direction in which pixel circuits 10 are arranged in the same column. For example, pixel circuits 10(a1, e1), 10(b1, e1), 10(c1, e1), and 10(d1, e1), which are all located in the e1-th column, are connected in common to the signal line 14. Note that all pixel circuits 10 located in the same column may be connected in common to one signal line 14, or alternatively there may be a plurality of signal lines 14 in the same column, and two or more pixel circuits 10 of the pixel circuits 10 located in the same column may be connected in common to one of the plurality of signal lines 14 and other two or more pixel circuits 10 in this column may be connected in common to another of the plurality of signal lines 14, and so on. For example, pixel circuits 10(a2, e1), 10(b2, e1), 10(c2, e1), and 10(d2, e1) located in the e1-th column may be connected in common to a signal line 14 different from a signal line 14 to which a pixel circuit 10(a1, e1) is connected. A plurality of pixel circuits 10 connected to a plurality of signal lines 14 are sequentially selected such that signals are sequentially read from the selected pixel circuits 10. By reading signals from a plurality of pixel circuits 10 via a plurality of signal lines 14 in parallel, it becomes possible to increase the signal reading speed.

Figure 17B:
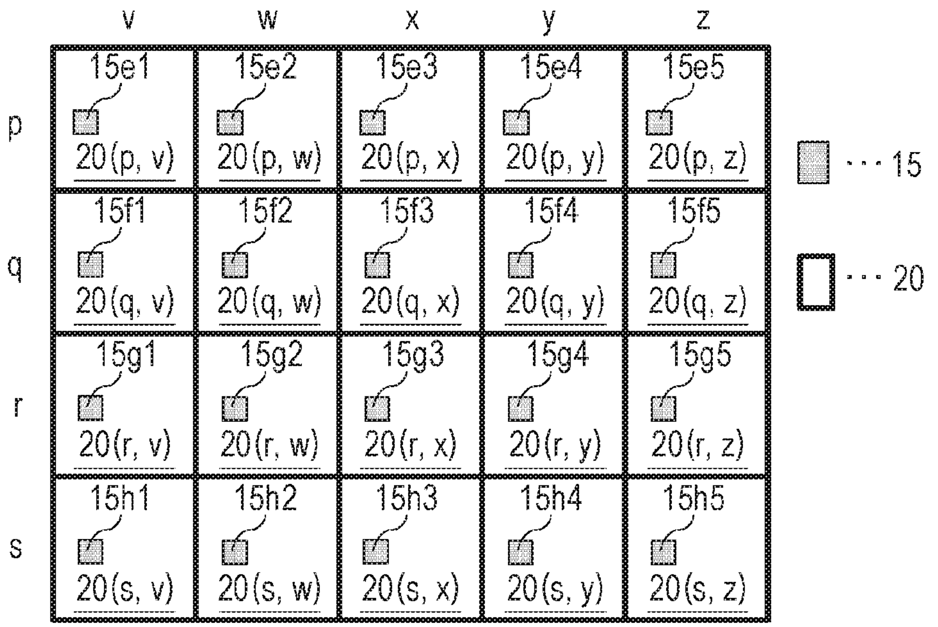

FIG. 17B illustrates a layout of a plurality of peripheral circuits 20 arranged in a matrix having T rows and U columns. As for each peripheral circuit 20, a signal processing circuit 21 according to one of previous embodiments may be employed. Herein, T<J and U<K. In practice, it may be preferable that T≥10 and U≥10, and it may be more preferable that T≤1000 and U≤1000. The T rows of peripheral circuits 20 include a p-th row, a q-th row, an r-th row, and an s-th row in this order. That is, p, q, r, and s are positive integers satisfying p<q<r<s. For example, in a case where all peripheral circuits 20 are shown FIG. 17B, p=1, q=2, r=3, and s=T=4. For convenience of explanation, it is assumed that p-th to s-th rows are adjacent to each other. In a case where rows are adjacent to each other, q=1+p, r=1+q, and s=1+r. Note that there can be another row that is not shown in FIG. 17B between two rows.

The U columns of peripheral circuits 20 include a v-th column, a w-th column, an x-th column, and a z-th column in this order. That is, v, w, x, y, and z are positive integers satisfying v<w<x<y<z. For example, in a case where all peripheral circuits 20 are shown in FIG. 17B, v=1, w=2, x=3, y=4, z=U=5. For convenience of explanation, it is assumed that v-th to z-th columns are adjacent to each other. In a case where columns are adjacent to each other, w=1+v, x=1+w, y=1+x, z=1+y. Note that there can be another column that is not shown in FIG. 17B between two columns.

Hereinafter, a peripheral circuit 20 located in a γ-th row and in a δ-th column is denoted as a peripheral circuit 20(γ, δ).

Peripheral circuits 20 in the v-th column include a peripheral circuit 20(p, v) in the p-th row, a peripheral circuit 20(q, v) in the q-th row, a peripheral circuit 20(r, v in the r-th row, and a peripheral circuit 20(s, v) in the s-th row. Peripheral circuits 20 in the w-th column include a peripheral circuit 20(p, w) in the p-th row, a peripheral circuit 20(q, w) in the q-th row, a peripheral circuit 20(r, w) in the r-th row, and a peripheral circuit 20(s, v) in the s-th row.

A set of pixel circuits 10 connected to the same peripheral circuit 20 is denoted as a pixel group 15. In this example, each pixel group 15 includes J pixel circuits 10. In each pixel group 15, all pixel circuits 10 included in this one pixel group 15 are connected to the same one peripheral circuit 20. Note that this peripheral circuit 20 is not connected to any pixel circuit 10 belonging to a pixel group 15 other than the above-described pixel group 15. In the present embodiment, a pixel group 15 is formed by a plurality of pixel circuits 10 included in the pixel circuits 10 located in the same column. In the present example, one pixel group 15 includes all pixel circuits 10 located in the same column. For example, all pixel circuits 10 located in an e1-th column belong to a pixel group 15e1. In FIG. 17A, a pixel group 15 formed by pixel circuits 10 located in an α-th column is denoted as a pixel group 15α (where α is e1, f1, e2, etc.).

FIG. 17B shows which peripheral circuit 20 is connected to which pixel group 15 of a plurality of pixel blocks 15. For example, a peripheral circuit 20(p, v) is connected to a pixel group 15e1, and a peripheral circuit 20(q, v) is connected to a pixel group 15f1. A peripheral circuit 20(r, v) is connected to a pixel group 15f1, and a peripheral circuit 20(s, v) is connected to a pixel group 15g1. For example, a peripheral circuit 20(p, w) is connected to a pixel group 15e2, and a peripheral circuit 20(q, w) is connected to a pixel group 15f2. A peripheral circuit 20(r, w) is connected to a pixel group 15g2, and a peripheral circuit 20(s, w) is connected to a pixel group 15h2. For example, a peripheral circuit 20(p, x) is connected to a pixel group 15e3, and a peripheral circuit 20(q, x) is connected to a pixel group 15f3. A peripheral circuit 20(r, x) is connected to a pixel group 15g3, and a peripheral circuit 20(s, x) is connected to a pixel group 15h3.

In the example shown in FIGS. 17A and 17B, all pixel circuits 10 existing in the same one column belong to the same one of the pixel groups 15. Thus, all pixel circuits 10 in the e1-th column are connected to the peripheral circuit 20(p, v), and all pixel circuits 10 in the f1-th column are connected to the peripheral circuit 20(q, v). All pixel circuits 10 in the g1-th column are connected to the peripheral circuit 20(r, v), and all pixel circuits 10 in the h1-th column are connected to the peripheral circuit 20(s, v). All pixel circuits 10 in the e2-th column are connected to the peripheral circuit 20(p, w), and all pixel circuits 10 in the f2-th column are connected to the peripheral circuit 20(q, w). All pixel circuits 10 in the g2-th column are connected to the peripheral circuit 20(r, w), and all pixel circuits 10 in the h2-th column are connected to the peripheral circuit 20(s, w). All pixel circuits 10 in the e3-th column are connected to the peripheral circuit 20(p, x), and all pixel circuits 10 in the f3-th column are connected to the peripheral circuit 20(q, x). All pixel circuits 10 in the g3-th column are connected to the peripheral circuit 20(r, x), and all pixel circuits 10 in the h3-th column are connected to the peripheral circuit 20(s, x).

A further explanation is given below focusing pixel circuits 10 located in a certain same row (for example, an a-th row) three different columns (for example, e1-th, f1-th, and g1-th columns), and peripheral circuits 20 located in a certain same column (for example a v-th column) and in different three rows (for example, p-th, q-th, and r-th row) and connected to the pixel circuits 10 in the three columns described above. A pixel circuit 10 located in a middle column (the f1-th column) of the three columns, in which the pixel circuits 10 of interest are located, is connected to a peripheral circuit 20 located in a middle row (the q-th row) of the three rows in which the peripheral circuits 20 of interest are located. In this configuration, the order of arranging pixel circuits 10 across the three columns corresponds to the order of arranging peripheral circuits 20, across the three rows, respectively connected to the pixel circuits 10 in the three columns. This makes it possible to reduce an influence of a difference in characteristics of signal processing among peripheral circuits 20. As for a characteristic difference among the peripheral circuits 20 in the three rows, let a first characteristic difference denote a characteristic difference between the peripheral circuit 20 in the middle row and the peripheral circuit 20 in one of the two outside rows or a characteristic difference between the peripheral circuit 20 in the middle row and the peripheral circuit 20 in the other one of the two outside rows. Let a second characteristic difference denote a characteristic difference between the peripheral circuit 20 in one of the two outside rows and the peripheral circuit 20 in the other one of the two outside rows. The characteristic difference between two peripheral circuits 20 tends to increase with a distance between the peripheral circuits 20, and thus the first characteristic difference tends to be smaller than the second characteristic difference. As for signals output from the pixel circuits 10 in the three columns, a difference between an output signal from the pixel circuit 10 in the middle column and an output signal from the pixel circuit 10 in one of the two outside columns, and a difference between an output signal from the pixel circuit 10 in the middle column and an output signal from the pixel circuit 10 in the other one of the two outside columns correspond to the first characteristic difference. Therefore, to reduce the difference in output signal between two pixel circuits 10, it is effective to reduce the distance between the two pixel circuits 10 as possible and reduce the distance between the two corresponding peripheral circuits 20.

This corresponds to achieving the layout such that f1 is between e1 and g1 and q is between p and r (fa, e1, g1, q, p, and r are integers), and such that f1 is between e1 and h1 and q is between p and s (f1, e1, h1, q, p, and s are integers), and such that g1 is between e1 and h1 and r is between q and s (a1, e1, h1, r, q, and s are integers), and such that g1 is between f1 and h1 and r is between q and s (g1, f1, h1, r, q, and s are integers). The explanation given above by way of example for the a-th row and the v-th column, the situation is similar in the b-th row, the c-th row, and the d-th row and also in the w-th column, the x-th column, the y-th column, and the z-th column.

In the present embodiment, $e1<f1<g1<h1$ and $p<q<r<s$, and thus for peripheral circuits 20 located in the same column, the row number of the peripheral circuit 20 increases as the column number of the pixel circuit 10 connected to the peripheral circuit 20 increases.

Next, a manner of connecting a plurality of pixel circuits 10 to a plurality of peripheral circuits 20 is described below.

In the example shown in FIGS. 17A and 17B, all pixel circuits 10 in the a-th column are connected to the peripheral circuit 20(i, j), all pixel circuits 10 in the b-th column are connected to the peripheral circuit 20(k, j), all pixel circuits 10 in the c-th column are connected to the peripheral circuit 20(s, j), all pixel circuits 10 in the d-th column are connected to the peripheral circuit 20(i, r), all pixel circuits 10 in the e-th column are connected to the peripheral circuit 20(k, r), all pixel circuits 10 in the f-th column are connected to the peripheral circuit 20(s, r), all pixel circuits 10 in the g-th column are connected to the peripheral circuit 20(i, t), all pixel circuits 10 in the h-th column are connected to the peripheral circuit 20(k, t), and all pixel circuits 10 in the q-th column are connected to the peripheral circuit 20(s, t).

In the present embodiment, $e1<f1<g1<h1$, and thus for peripheral circuits 20 located in the same column, the row number of the peripheral circuit 20 increases as the column number of the pixel circuit 10 connected to the peripheral circuit 20 increases.

Because $h1<e2$, as the column number of the pixel circuit 10 increases (from the h1-th column to the e2-th column), a change occurs in the column number (from the v-th column to the w-th column) of the peripheral circuit 20 to which the pixel circuit 10 is connected. The number of columns of pixel circuits 10 assigned to the peripheral circuits 20 in the same column is equal to $e2-h1+1$, which is equal to the number of rows, T, of the peripheral circuits 20 included in the same column. In other words, every T columns of pixel circuits 10, a change occurs in the column of the peripheral circuit 20 to which pixel circuits 10 are connected.

In the present embodiment, there are pixel circuits 10 across $T-1$ columns between two pixel circuits 10 (for example, pixel circuits 10 in e1-th and e2-th columns) connected to respective peripheral circuits 20 which are located in the same row (for example, p-th row) and in close columns (for example, v-th and w-th columns).

Pixel circuits 10 in K columns are assigned to peripheral circuits 20 such that pixel circuits 10 located in the same one column are assigned to one peripheral circuit 20. Thus, $T\times U=K$. To increase the number of operations performed in parallel in the signal processing, it may be preferable that $J\leq K$, and thus $J\leq T\times U$. Furthermore, $T<J$ and $U<K$, and thus $T\times U<J\times K$. Therefore, $T\times U-K<J\times K-T\times U$ is satisfied. This can be rewritten as $T\times U<(J+1)\times K/2$. $J+1\approx J$, and thus $T\times U<J\times K/2$. Thus, in the connection method according to the present embodiment, it is desirable to satisfy $J\leq T\times U<J\times K/2$.

Figure 18:
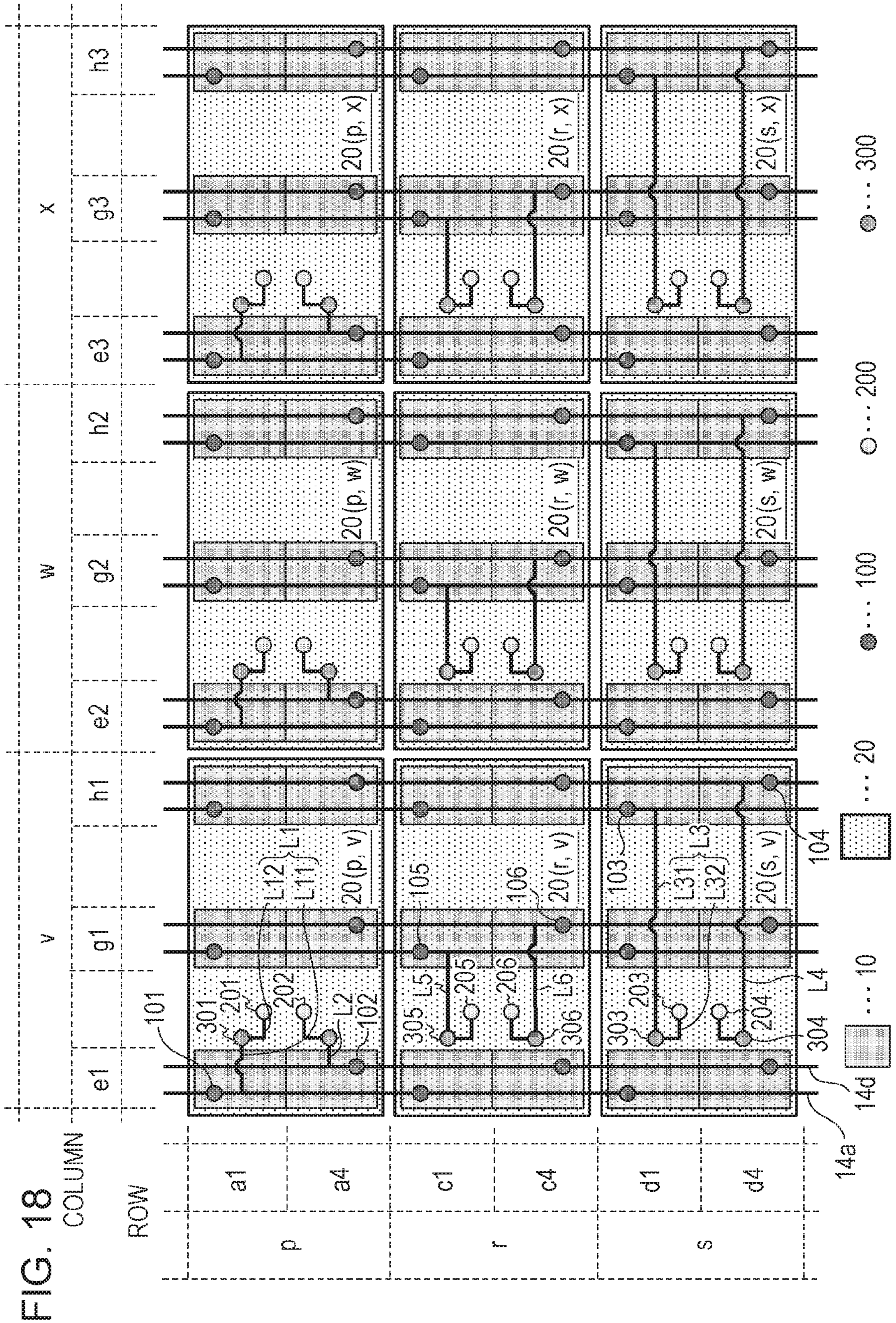
FIG. 18 is a plan view illustrating a configuration of an image capturing apparatus.

FIG. 18 illustrates positional relationships as seen in plan view between pixel circuits 10 and peripheral circuits 20. More specifically, FIG. 18 shows a plurality of semiconductor devices 100 forming a plurality of pixel circuits 10, and a plurality of semiconductor devices 200 forming a plurality of peripheral circuits 20. Particular semiconductor devices of the semiconductor devices 100 are denoted as semiconductor devices 101 to 106. Particular semiconductor devices of the semiconductor devices 200 are denoted as semiconductor devices 201 to 206. One of the plurality of semiconductor devices 100 is electrically connected to one of the plurality of semiconductor devices 200 via a connection unit 300. Connection units 301 to 306 denote particular connection units via which the semiconductor devices 101 to 106 are respectively connected to the semiconductor devices 201 to 206.

In FIG. 18, bold lines represent interconnection paths between semiconductor devices 100 and semiconductor devices 200. Each interconnection path between one semiconductor device 100 and one semiconductor device 200 include an interconnection path from the semiconductor device 100 to one connection unit 300 and an interconnection path from the connection unit 300 to the semiconductor device 200.

In FIG. 18, interconnection paths between semiconductor devices 100 and semiconductor devices 200 via connection units 300 are schematically illustrated to show magnitude correlations among actual interconnection path lengths. A further discussion of interconnections is given below taking, as an example, specific interconnection paths from peripheral circuits 20(p, v), 20(r, v), and 20(s, v) in the v-th column to pixel circuits 10 respectively connected to these peripheral circuits 20(p, v), 20(r, v), and 20(s, v) in the v-th column. The length of a shortest interconnection path between one semiconductor device 100 and one semiconductor device 200 varies depending on a specific pixel circuit 10 and/or a specific peripheral circuit 20. In FIG. 18, L1 denotes a length of a shortest interconnection path between the semiconductor device 101 in the pixel circuit 10(a1, e1) and the semiconductor device 201 in the peripheral circuit 20(p, v).

The semiconductor device 201 is also connected to a semiconductor device 100 of the pixel circuit 10(c1, e1) via a signal line 14*a*. However, the interconnection path between the semiconductor device 201 and the semiconductor device 100 in the pixel circuit 10(a1, e1) is longer than the interconnection path between the semiconductor device 201 in the peripheral circuit 20(p, v) and the semiconductor device 101 in the pixel circuit 10(a1, e1). That is, the interconnection path between the semiconductor device 201 and the semiconductor device 100 in the pixel circuit 10(c1, e1) is not the shortest one between the semiconductor device 201 and a semiconductor device 100 in a pixel circuit 10. For other interconnection paths, a shortest interconnection path can be determined in a similar manner.

In FIG. 18, L2 indicates a length of a shortest interconnection path between the semiconductor device 102 in the pixel circuit 10(a4, e1) and the semiconductor device 202 in the peripheral circuit 20(p, v). L3 indicates a length of a shortest interconnection path between the semiconductor device 103 in the pixel circuit 10(d1, h1) and the semiconductor device 203 in the peripheral circuit 20(s, v). L4 indicates a length of a shortest interconnection path between the semiconductor device 104 in the pixel circuit 10(d4, h1) and the semiconductor device 204 in the peripheral circuit 20(s, v).

The length L3 and the length L4 are greater than the length L1 and the length L2 (L1, L2<L3, L4). By allowing the length of the interconnection path between a pixel circuit 10 and a peripheral circuit 20 to vary depending on a specific peripheral circuit 20, it becomes possible to achieve high flexibility in the layout of the pixel circuits 10 and the layout of the peripheral circuits 20. In particular, employing a longer interconnection path makes it possible to dispose a semiconductor device 200 of a peripheral circuit 20 at a location apart from a semiconductor device 100 of a pixel circuit 10. This can make a great contribution to increasing flexibility in the layout of the pixel circuits 10 and the layout of the peripheral circuits 20.

The length L2 is smaller than the length L1 (L2<L1). The length L4 is greater than the length L3 (L3<L4). By varying the length of an interconnection path between a pixel circuit 10 and a peripheral circuit 20 for each specific pixel circuit 10 in the above-described manner, it becomes possible to increase the flexibility in the layout of the pixel circuits 10 and the layout of the peripheral circuits 20. In particular, employing a longer interconnection path makes it possible to dispose a semiconductor device 200 of a peripheral circuit 20 at a location apart from a semiconductor device 100 of a pixel circuit 10. This can make a great contribution to increasing flexibility in the layout of the pixel circuits 10 and the layout of the peripheral circuits 20.

In FIG. 18, L5 indicates a length of a shortest interconnection path between the semiconductor device 105 in the pixel circuit 10(c1, g1) and the semiconductor device 205 in the peripheral circuit 20(r, v). L6 indicates a length of a shortest interconnection path between the semiconductor device 106 in the pixel circuit 10(c1, g1) and the semiconductor device 206 in the peripheral circuit 20(r, v). The lengths of L5 and L6 are between the lengths of L1 and L2 and the lengths of L3 and L4 (L1, L2<L5, L6<L3, L4). By setting the length of each interconnection path to one of three values in the manner described above, it becomes possible to reduce a difference in electric characteristic between adjacent peripheral circuits 20 due to a difference in the interconnection path length. In a case where the difference in electric characteristic among peripheral circuits 20 is corrected by performing signal processing, if the interconnection paths are set such that the length of the interconnection path increases with the row position, it becomes possible to simplify a correction algorithm.

The effects of the interconnection paths have been explained taking, as examples, the peripheral circuits 20 in the v-th column. As can be seen from FIG. 18, the interconnection paths can be optimized in a similar a also for the peripheral circuits 20 in the w-th column and the x-th column.

Figure 19:
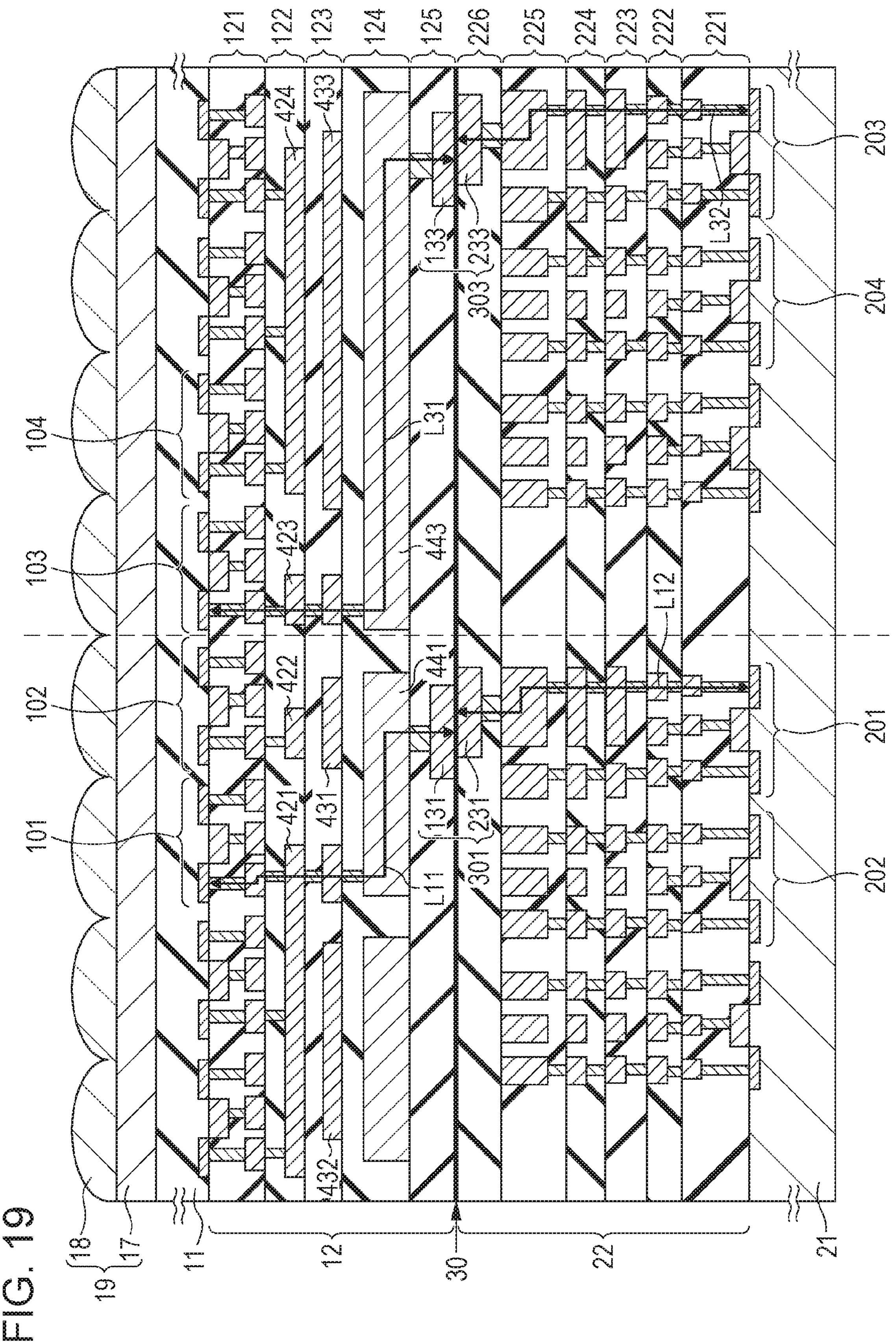
FIG. 19 is a cross-sectional view of an image capturing apparatus.

The interconnection paths are described in further detail below. FIG. 19 is a cross-sectional view of a semiconductor apparatus APR. An interconnection structure 12 includes five (M) wiring layers. More specifically, the five (M) wiring layers include, as counted from a semiconductor layer 11, a first wiring layer 121, a second (m-th) wiring layer 122, a third (m"-th (m<m"<m')) wiring layer 123, a fourth (m'-th (m'>m)) wiring layer 124, and a fifth (M-th) wiring layer 125.

An interconnection structure 22 includes six (N) wiring layers. The six (N) wiring layers include as counted from a semiconductor layer 21, a first wiring layer 221, a second wiring layer 222, a third (n-th) wiring layer 223, a fourth ((N−2)th) wiring layer 224, a fifth ((N−1)-th) wiring layer 225, and a sixth (N-th) wiring layer 226.

The conductive elements 131 and 133 are included in the wiring layer 125 in the interconnection structure 12, wherein the wiring layer 125 is the M-th layer as counted from the semiconductor layer 11. The conductive elements 131 and 133 are connected to specific pixel circuits (α, β) in the plurality of pixel circuits 10 via the interconnection structure 12. The conductive elements 231 and 233 are included in the wiring layer 226 in the interconnection structure 22, wherein the wiring layer 226 is the N-th layer as counted from the semiconductor layer 21. The conductive elements 231 and 233 are connected to specific pixel circuits (γ, δ) in the plurality of pixel circuits 20 via the interconnection structure 22. The conductive element 131 and the conductive element 231 are electrically connected to each other, and the conductive element 133 and the conductive element 233 are electrically connected to each other. A combination of the conductive element 131 and the conductive element 231 forms the connection unit 301, and a combination of the conductive element 133 and the conductive element 233 forms the connection unit 303. Similarly, each of the other connection units 300 is formed by electrically connecting a conductive element of the interconnection structure 12 and a conductive element of the interconnection structure 22 to each other. More specifically, the conductive elements 131 and 133 and the conductive elements 231 and 233 are made chiefly of copper, and the copper of the conductive element 131 and the copper of the conductive element 231 are bonded together, and the copper of the conductive element 133 and the copper of the conductive element 233 are honed together. In an alternative method, a bump may be disposed between the conductive element 131 and the conductive element 231, and a bump may be disposed between the conductive element 133 and the conductive element 233, and the conductive element 131 and the conductive elements 231 and 233 are electrically connected via the bumps. In an alternative method, the conductive elements 131 and 133 are electrically connected to the respective conductive elements 231 and 233 via through-electrodes formed through the semiconductor layer 21. In any method, the conductive element 131 and the conductive element 231 are located between the semiconductor layer 11 and the peripheral circuit 20(p, v), and the conductive element 133 and the conductive element 233 are located between the semiconductor layer 11 and the peripheral circuit 20(s, v).

In a case where the wiring layer 125 in the M-th layer and the wiring layer 226 in the N-th layer are not in contact, a wiring layer that does not involve either the pixel circuits 10 or the peripheral circuits 20 may be disposed between the wiring layer 125 in the M-th layer and the wiring layer 226 in the N-th layer.

The semiconductor devices 100 and 200 each are, for example, a transistor including a source, a drain, and a gate, or each may be a diode. The conductive elements 131 and 133 may be connected to one of the source, the drain, and the gate of the semiconductor devices 100 and 200. Note that the semiconductor devices 100 and 200 each may be a MIS-type capacitive element or a resistive element formed of polycrystalline silicon or single crystal silicon.

As shown in FIG. 19, on a side of the semiconductor layer 11, opposite to the side where the interconnection structure 12 is formed, there is provided an optical structure 19 including a color filter array 17 and/or microlens array 18.

L11 denotes a length of a shortest one of interconnection paths from the conductive element 231 to a plurality of semiconductor devices 100 forming a plurality of pixel circuits 10. More specifically, the shortest interconnection path of all interconnection paths is an interconnection path from the conductive element 231 to the semiconductor device 101. L12 denotes a length of a shortest one of interconnection paths from the conductive element 131 to a plurality of semiconductor devices 200 forming a plurality of peripheral circuits 20. More specifically, the shortest interconnection path of all interconnection paths is an interconnection path from the conductive element 231 to the semiconductor device 201. The length L1 is approximately equal to the sum of L11 and L12 (L1=L11+L12). L31 denotes a length of a shortest one of interconnection paths from the conductive element 233 to a plurality of semiconductor devices 100 forming a plurality of pixel circuits 10. More specifically, the shortest interconnection path of all interconnection paths is an interconnection path from the conductive element 233 to the semiconductor device 103. L32 denotes a length of a shortest interconnection path of interconnection paths from the conductive element 133 to a plurality of semiconductor devices 200 forming a plurality of peripheral circuits 20. More specifically, the shortest interconnection path of all interconnection paths is an interconnection path from the conductive element 133 to the semiconductor device 203. The length L3 is approximately equal to the sum of L31 and L32 (L3=L31+L32).

In a case where the length L11 starts from the conductive element 231 and the length L12 starts from the conductive element 131, the interconnection path length may include a duplicative value of a connection distance between the conductive element 131 and the conductive element 133. However, when interconnection path lengths are compared, the connection distance between the conductive element 131 and the conductive element 133 is cancelled out.

Regarding the length from the conductive element 131 or the conductive element 231 connected to each other, the length L11 of the interconnection path from the conductive element 231 to the semiconductor device 100 is greater than the length L12 of the interconnection path from the conductive element 131 to the semiconductor device 200 (L11>L12). Similarly, regarding the length from the conductive element 133 or the conductive element 233 connected to each other, the length L31 of the interconnection path from the conductive element 233 to the semiconductor device 100 is greater than the length L32 of the interconnection path from the conductive element 133 to the semiconductor device 200 (L31>L32). As for the length L2, the length of the interconnection path from the connection unit 302 to the semiconductor device 102 is equal or smaller than the length of the interconnection path from the connection unit 302 to the semiconductor device 202. Furthermore, in the present embodiment, the length L31 is greater than the length L12 (L12<L31). The length L11 is greater than the length L32 (L32<L11).

It may be desirable to set lengths of interconnection paths from the connection unit 300 such that lengths of interconnection paths from the connection unit 300 in the interconnection structure 12 are greater than lengths of interconnection paths in the interconnection structure 22. More specifically, an interconnection may be disposed in the interconnection structure 12 to increase an interconnection path. The increase in the interconnection path may cause an increase in noise intruding the interconnection. However, in a case where the interconnection for increasing the interconnection path is disposed in the interconnection structure 12 such that the interconnection path is increased in the interconnection structure 12, the increase in the interconnection path occurs apart from the peripheral circuit 20 functioning as a noise source. This makes it possible to reduce the noise that may occur in the interconnection path between the semiconductor device 100 and the semiconductor device 200.

To reduce the difference in characteristics among the peripheral circuits 20, it may be desirable to reduce the difference in positional relationship of semiconductor devices 200 among the peripheral circuits 20. If there is a large difference in positional relationship of semiconductor device 200 among peripheral circuits 20 and thus there is a large difference in internal layout of peripheral circuits 20, there can be a large difference in characteristics. In the present example, there is no difference in the positional relationship of semiconductor devices 200 in the peripheral circuit 20. Furthermore, the interconnection path between the connection unit 300 and the semiconductor device 200 is set to be short as possible. In the present example, the length L31 is greater than the length L12 (L12<L31). The length L11 is greater than the length L32 (L32<L11). Furthermore, the length L12 is approximately equal to the length L32 (L12=L32). This makes it possible to reduce the difference in characteristics among the peripheral circuits 20 due to the difference in interconnection path length between the connection units 300 and the semiconductor devices 200.

It may be desirable that interconnections for increasing interconnection paths are provided in an interconnection structure having a smaller number of wiring layers of the interconnection structures 12 and 22. It may be allowed that as a result of providing the wiring layers for increasing the interconnection paths, the number of wiring layers of the interconnection structure 12 becomes equal to the number of wiring layers of the interconnection structure 22. If the wiring layers for increasing the interconnection paths are included in an interconnection structure having a greater number of wiring layers of the interconnection structures 12 and 22, there is a high probability that a reduction in production yield or an increase in cost occurs. In a case where the wiring layers for increasing the interconnection paths are provided in an interconnection structure having a smaller number of wiring layers of the interconnection structures 12 and 22, the providing of the wiring layers may not result in a significant reduction in production yield or an increase in cost.

Taking into account all factors described above, in a case where L12<L11 and L32<L31, it may be desirable that the number (M) of wiring layers of the interconnection structure 12 is smaller than or equal to the number (N) of wiring layers of the interconnection structure 22 (M≤N). It may be more desirable that the number (M) of wiring layers of the interconnection structure 12 is smaller than the number (N) of wiring layers of the interconnection structure 22 (M<N).

In the example shown in FIG. 19, common lines 421, 422, 423, and 424, to which two or more pixel circuits of the plurality of pixel circuits are connected in common, are included in the second (m-th) wiring layer 122. In FIG. 19, extension lines 441 and 442 are shown which connect the common lines 421 and 423 to the conductive elements 131 and 133. The extension lines 441 and 443 are interconnections provided to increase the interconnection paths between the common lines 421 and 423 and the conductive elements 131 and 133. The lengths of the extension lines 441 and 443 may be major parts of the lengths L11 and L13 and may be major parts of the lengths L1 and L3. In the example shown in FIG. 19, the extension lines 441 and 443 are included in the fourth (m'-th (m'>m)) wiring layer 124. It may be preferable that the extension lines 441 and 442 for increasing the interconnection paths have low resistance. To achieve this, it may be preferable to dispose the extension lines 441 and 443 in a wiring layer at a high level as possible such that it becomes easy to achieve a large wiring width.

Shield lines 431, 432, and 433 are provided between the extension lines 441 and 443 and the common lines 422 and 424. The shield lines 431, 432, and 433 are supplied with a fixed potential such as a ground potential, a power supply potential, or the like. The shield lines 431, 432, and 433 are located between the fourth (m'-th (m'>m)) wiring layer 124 including the extension lines 441 and 443 and the second (m-th) wiring layer 122 including the common lines 422 and 424. That is, the shield lines 431, 432, and 433 are included in the third (m"-th (m<m"<m')) wiring layer 123. The common line 421 and the common line 422 transmit different signals. Therefore, if the extension line 441 connected to the common line 421 has a part close to the common line 422 (for example, if the extension line 441 crosses the common line 422), crosstalk can occur between the signal transmitted via the common line 421 and the signal transmitted via the common line 422. To handle the above situation, the shield line 431 supplied with the fixed potential is disposed between the extension line 441 and the common line 422 thereby suppressing the crosstalk. Similarly, the shield line 433 is disposed between the extension line 443 connected to the common line 423 and the common line 424 to suppress crosstalk of signals between the common line 423 and the common line 424.

Sixth Embodiment

A sixth embodiment is described below using FIG. 19 focusing differences from the fifth embodiment. For example, the sixth embodiment is similar to the fifth embodiment in that the length L3 of the interconnection path between the semiconductor device 103 and the semiconductor device 203 via the connection unit 303 is greater than the length L1 of the interconnection path between the semiconductor device 101 and the semiconductor device 201 via the connection unit 301.

In the fifth embodiment described above, the length (for example, L12, L32) of the interconnection path from the connection unit 300 to the semiconductor device 200 is set to be equal for all peripheral circuits 20. In contrast, in the sixth embodiment, the lengths L12 and L32 are different from one peripheral circuit 20 to another. For example, the length L32 is greater than the length L12 (L12<L32). This makes it possible to dispose the connection units 300 at optimum locations without being limited by the locations of the semiconductor devices 200. Thus, it becomes possible to reduce the difference in characteristic among peripheral circuits 20. Furthermore, the optimization of the locations of the connection units 300 makes it possible to reduce the connection irregularity of the connection units 300, which results in an improvement in connection reliability of the connection units 300.

In the present embodiment, as in the fifth embodiment, in the interconnection path between the semiconductor device 101 and the semiconductor device 201 via the connection unit 301, the length L11 is greater than the length L12 (L12<L11). Therefore, it may be preferable that the extension line 441 is disposed in the interconnection structure 12. However, unlike the fifth embodiment, in the interconnection path between the semiconductor device 103 and the semiconductor device 203 via the connection unit 303, the length L32 is greater than the length L31 (L31<L32). Therefore, in addition to the extension line 443, another extension line is disposed only in the interconnection structure 22.

Seventh Embodiment

Figure 20:
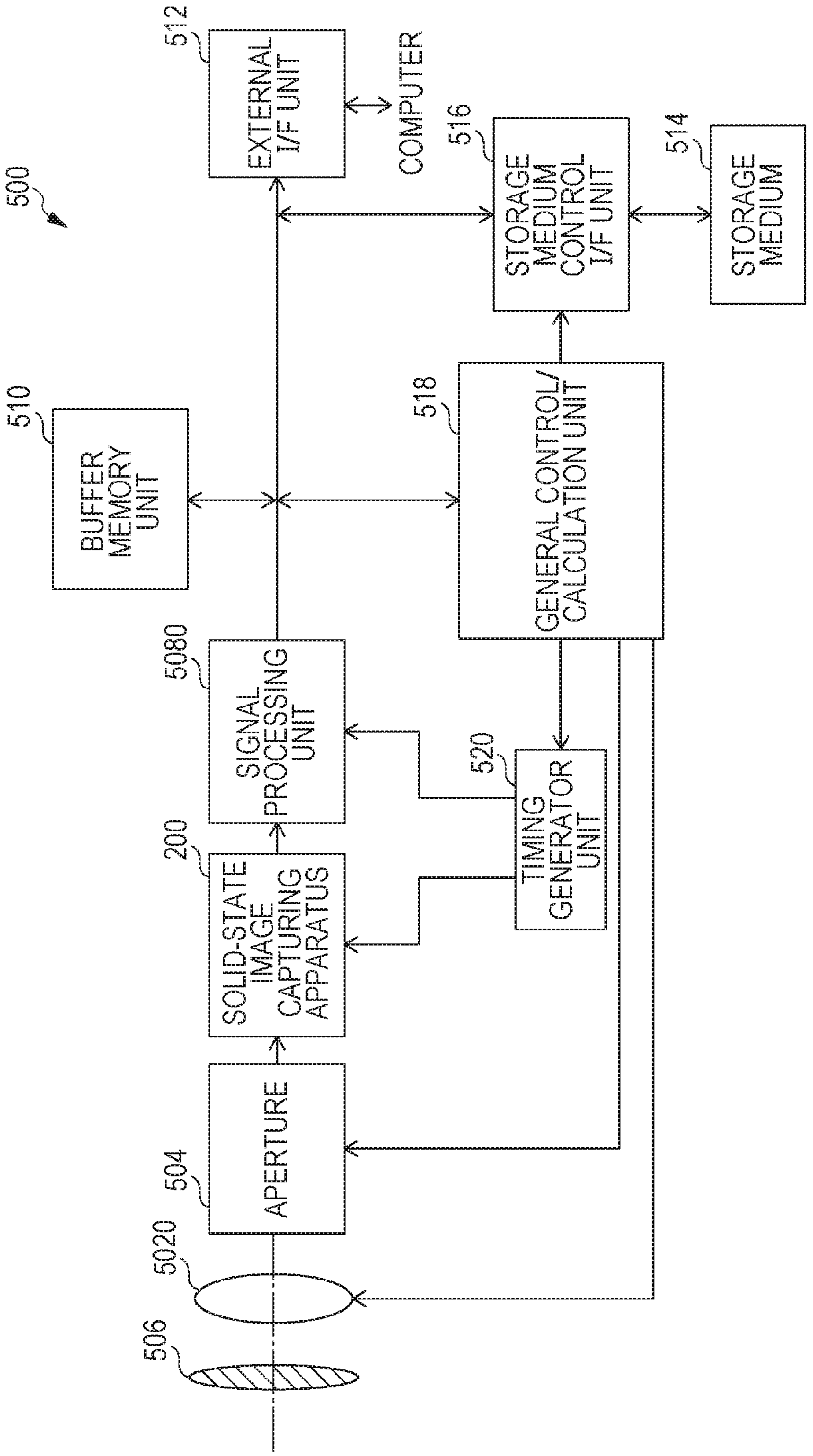
FIG. 20 is a diagram illustrating a configuration of an image capturing system.

FIG. 20 is a block diagram illustrating a configuration of an image capturing system 500 according to a seventh embodiment. The image capturing system 500 according to the present embodiment includes an image capturing apparatus 200 configured according to one of the embodiments described above. Specific examples of image capturing systems 500 include a digital still camera, a digital camcorder, a monitor camera, etc. FIG. 20 illustrates an example of a configuration of a digital still camera in which the image capturing apparatus according to one of the embodiments described above is used as the image capturing apparatus 200.

The image capturing system 500 illustrated by way of example in FIG. 20 includes the image capturing apparatus 200, a lens 5020 for forming an optical image of an object on the image capturing apparatus 200, an aperture 504 for adjusting the amount of light passing through the lens 5020, and a barrier 506 for protecting the lens 5020. The lens 5020 and the aperture 504 form an optical system that focuses light onto the image capturing apparatus 200.

The image capturing system 500 also includes a signal processing unit 5080 configured to perform processing on an output signal output from the image capturing apparatus 200. The signal processing unit 5080 performs signal processing to make various kinds corrections on the input signal as required, and outputs the resultant signal in a compressed format. The signal processing unit 5080 may have a function of performing an AD conversion process on the output signal output from the image capturing apparatus 200. In this case, the image capturing apparatus 200 does not necessarily need to internally include an AD conversion circuit.

The image capturing system 500 further includes a buffer memory unit 510 for temporarily storing image data, and an external interface unit (external I/F unit) 512 for communicating with an external computer or the like. The image capturing system 500 further includes a storage medium 514 such as a semiconductor memory or the like for storing and reading captured image data, and a storage medium control interface unit (storage medium control I/F unit) 516 for storing and reading data to or from the storage medium 514. The storage medium 514 may be installed inside the image capturing system 500 or the storage medium 514 may be removable.

The image capturing system 500 further includes a general control/calculation unit 518 that performs various calculations and controls the whole digital still camera, and a timing generator unit 520 that outputs various timing signals to the image capturing apparatus 200 and the signal processing unit 5080. The timing signals may be input from the outside. That is, the image capturing system 500 may include at least the image capturing apparatus 200, the signal processing unit 5080 for processing the output signal output from the image capturing apparatus 200. The general control/calculation unit 518 and the timing generator unit 520 may perform part or all of control functions of the image capturing apparatus 200.

The image capturing apparatus 200 outputs an image signal to the signal processing unit 5080. The signal processing unit 5080 performs a predetermined signal processing on the image signal output from the image capturing apparatus 200, and outputs the resultant image data. The signal processing unit 5080 generates an image using the image signal.

By configuring the image capturing system using the image capturing apparatus according to one of the embodiments described above, it is possible to realize the image capturing system capable of capturing an image with higher quality.

Eighth Embodiment

An image capturing system and a moving object according to an eighth embodiment are described below with reference to FIGS. 21A to 21D and FIG. 22.

Figure 21A:
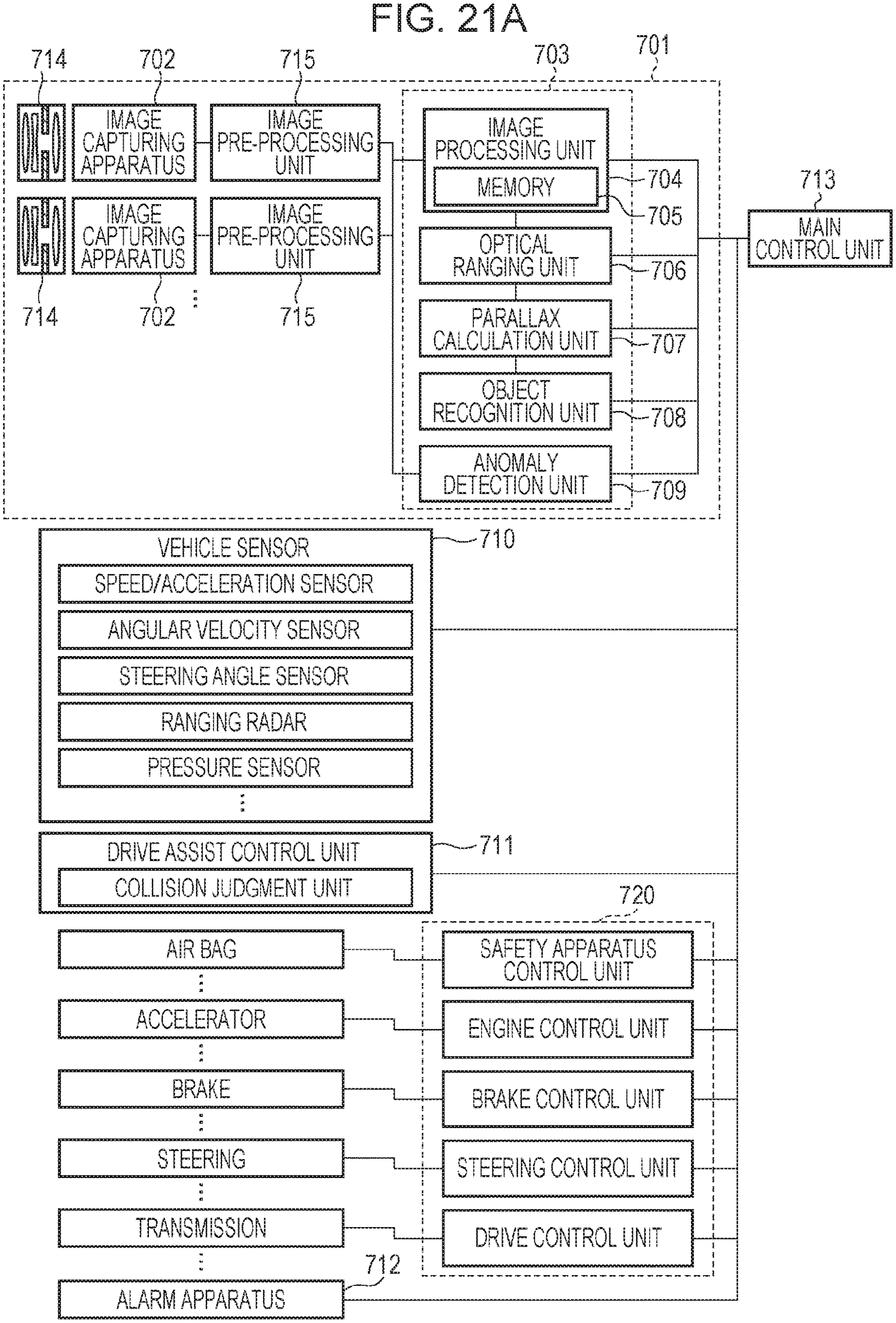
FIGS. 21A to 21D are diagrams illustrating a configuration of a moving object.
Figure 21B:
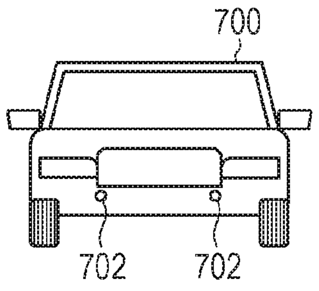
Figure 21C:
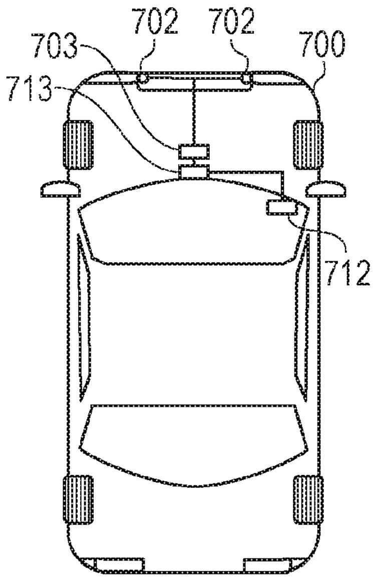
Figure 21D:
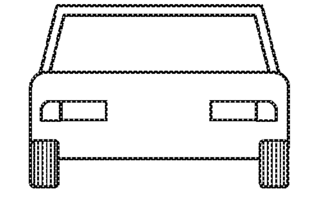
Figure 22:
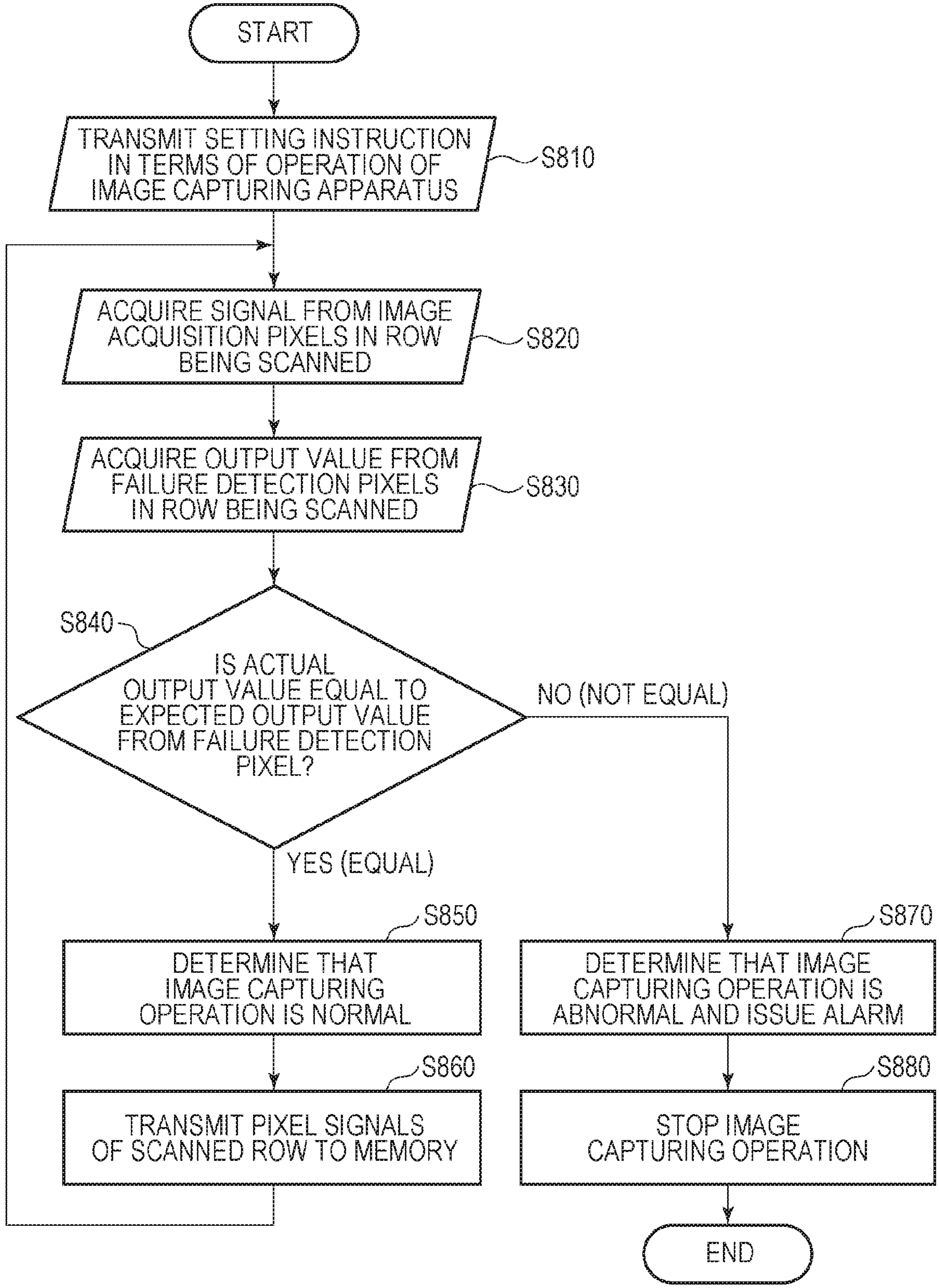
FIG. 22 is a flow chart illustrating an operation of an image capturing system.

FIGS. 21A to 21D are schematic diagrams illustrating a configuration of the image capturing system and the moving object according to the present embodiment. FIG. 22 is a flow diagram illustrating an operation of the image capturing system according to the present embodiment.

In the present embodiment, by way of example, the image capturing system is a vehicle-mounted camera. In FIGS. 21A to 21D, a vehicle system and an image capturing system installed in the vehicle system are shown by way of example. The image capturing system 701 includes an image capturing apparatus 702, an image pre-processing unit 715, an integrated circuit 703, and an optical system 714. The optical system 714 focuses an optical image of an object onto the image capturing apparatus 702. The image capturing apparatus 702 converts the optical image of the object focused via the optical system 714 to an electric signal. The image capturing apparatus 702 is an image capturing apparatus according to one of the embodiments described above. The image pre-processing unit 715 performs particular signal processing on the signal output from the image capturing apparatus 702. The function of the image pre-processing unit 715 may be embedded in the image capturing apparatus 702. The image capturing system 701 includes at least two sets each including the optical system 714, the image capturing apparatus 702, and the image pre-processing unit 715, and the output from the image pre-processing unit 715 of each set is input to the integrated circuit 703.

The integrated circuit 703 is an image capturing system-purpose integrated circuit, and includes an image processing unit 704 including a memory 705, an optical ranging unit 706, a parallax calculation unit 707, an object recognition unit 708, and an anomaly detection unit 709. The image processing unit 704 performs image processing such as a developing process, a defect correction, and/or the like on the output signal output from the image pre-processing unit 715. The memory 705 temporarily stores a captured image and stores a location of a defect image capturing pixel. The optical ranging unit 706 performs focusing of an image of an object and performs distance measurement. The parallax calculation unit 707 calculates a parallax (a phase difference between parallax images) from a plurality of pieces of image data acquired by the plurality of image capturing apparatuses 702. The object recognition unit 708 recognizes an object such as a vehicle, a road, a traffic sign, a person, and/or the like. When the anomaly detection unit 709 detects an anomaly in the image capturing apparatus 702, the anomaly detection unit 709 notifies the main control unit 713 of the anomaly.

The integrated circuit 703 may be realized using hardware designed for dedicated use, or may be realized using software modules, or may be realized by a combination thereof. The integrated circuit 703 may be realized by an FPGA (Field Programmable Gate Array), an ASIC (Application Specific Integrated Circuit), or the like, or by a combination thereof.

The main control unit 713 integrally controls operations of the image capturing system 701, a vehicle sensor 710, a control unit 720, etc. Alternatively, the main control unit 713 may not be provided, and the image capturing system 701, the vehicle sensor 710, and the control unit 720 each may have their own communication interface thereby transmitting/receiving control signals to/from each other via a communication network (according to, for example, the CAN standard).

The integrated circuit 703 has a capability of transmitting a control signal or a setting value to the image capturing apparatus 702 in response to receiving a control signal from the main control unit 713 or a control unit of the integrated circuit 703. For example, the integrated circuit 703 transmits a setting instruction/data for pulse-driving a voltage switch 13 in the image capturing apparatus 702, a setting instruction/data for switching the voltage switch 13 for each frame, or the like.

The image capturing system 701 is connected to the vehicle sensor 710 thereby detecting a vehicle running state in terms of a vehicle speed, a yaw rate, a steering angle, and/or the like, an environment outside the vehicle, and a state of another vehicle or an obstacle. The vehicle sensor 710 also functions as distance information acquisition unit for acquiring distance information indicating a distance to an object from parallax images. The image capturing system 701 is connected to a drive assist control unit 711 that performs various drive assists in terms of automatic steering, an automatic cruising, a collision avoidance function, and/or the like. In particular, in a collision judgment function, based on a detection result provided by the image capturing system 701 or the vehicle sensor 710, a judgment is made as to a prediction/occurrence of a collision with another vehicle or an obstacle. This makes it possible to perform a collision avoidance control when a collision is predicted and activate a safety apparatus when a collision occurs.

The image capturing system 701 is also connected to an alarm apparatus 712 that issues an alarm to a driver based on a judgment result made by a collision judgment unit. For example, in a case where a judgment result made by the collision judgment unit indicates that there is a high possibility that a collision occurs, the main control unit 713 controls a vehicle to prevent a collision or reduce a damage by braking, releasing the accelerator, reducing an engine output, or the like. The alarm apparatus 712 generates a warning sound or the like, displays warning information on a display screen of a car navigation system or a meter panel, or vibrates a sheet belt or a steering wheel thereby issuing an alarm to a user.

In the present embodiment, an image of a view surrounding a vehicle, for example, an image of a view ahead or behind the vehicle is captured by the image capturing system 701. FIGS. 21B to 21D illustrate an example of a manner of disposing the image capturing system 701 for a case where an image of a view ahead of a vehicle is captured by the image capturing system 701.

Two image capturing apparatuses 702 are disposed at font locations of a vehicle 700. More specifically, when a forward/backward running direction of the vehicle 700 or a center line of an external contour (for example, a center line of a vehicle width) of the vehicle 700 is regarded as an axis of symmetry, it is preferable to dispose the two image capturing apparatuses 702 at locations symmetric about the axis of symmetry. This arrangement is preferable in acquiring distance information indicating the distance between the vehicle 700 and a target object to be captured in image, or in judging the possibility of a collision. It is also preferable to dispose the image capturing apparatuses 702 such that the image capturing apparatuses 702 do not interfere with the view of the driver when the drivers views the state outside the vehicle 700 from a driver's seat. It may be preferable to dispose the alarm apparatus 712 at a location that allows a driver to easily view the alarm apparatus 712.

Next, a failure detection operation of the image capturing apparatus 702 in the image capturing system 701 is described below with reference to FIG. 22. The failure detection operation is performed by the image capturing apparatus 702 according to steps S810 to S880 shown in FIG. 22.

In step S810, a start-up setting of the image capturing apparatus 702 is performed. That is, an instruction to make a setting of the operation of the image capturing apparatus 702 is transmitted from the outside (for example, the main control unit 713) of the image capturing system 701 or from the inside of the image capturing system 701, and, in response, the image capturing operation or the failure detection operation is started by the image capturing apparatus 702.

Next, in step S820, a pixel signal is acquired from an effective pixel. In step S830, an output value from a failure detection pixel provided for failure detection is acquired. As with the effective pixel, the failure detection pixel also includes a photoelectric conversion element. A predetermined voltage is written in the photoelectric conversion element. The failure detection pixel outputs a signal corresponding to the voltage written in the photoelectric conversion element. Note that step S820 and step S830 may be performed in a reversed order.

Next, in step S840, it is determined whether an expected output value from the failure detection pixel and an actual output value from the failure detection pixel are identical to each other.

In a case where the determination in step S840 indicates that the expected output value is identical to the actual output value, the process proceeds to step S850 in which it is determined that the image capturing operation is being performed normally, and the process proceeds to step S860. In step S860, pixel signals in a scanning row are transmitted to the memory 705 and temporarily stored therein. Thereafter, the process returns to step S820 and the failure detection operation is continued.

On the other hand, in a case where the determination in step S840 indicates that the actual output value is not identical to the expected output value, the processing flow proceeds to step S870. In step S870, it is determined that there is an abnormality in the image capturing operation, and an alarm is issued to the main control unit 713 or the alarm apparatus 712. The alarm apparatus 712 displays information indicating that the abnormality has been detected on the display unit. Thereafter, in step S880, the image capturing apparatus 702 is stopped, and the operation of the image capturing system 701 is ended.

In the present embodiment, by way of example, the processing flow described above with reference to the flow chart is iterated for each row. Alternatively, the processing flow may be iterated for a plurality of rows, or the failure detection operation may be performed for each frame.

In the issuing of the alarm in step S870, the alarm may be output to the outside of the vehicle via a wireless network.

In the present embodiment, the control is performed such that a collision with another vehicle is avoided. The embodiment is also applied to a control to perform automatic driving such that the vehicle runs following another vehicle, or such that the vehicle does not get off a traffic lane. Furthermore, the image capturing system 701 can be applied to vehicles such as cars, but may also be applied to, for example, moving objects (moving apparatuses) such as ships, aircrafts, industrial robots, etc. Furthermore, the image capturing system 701 may also be applied to a wide variety of apparatuses or devices using object recognition such as an intelligent transport system (ITS), etc.

Modifications

The present disclosure is not limited to the embodiments described above, but many modifications are possible.

For example, any embodiment obtained by combining some part of one of the embodiments with another embodiment or by replacing some part of one of the embodiment with some part of another embodiment also falls within the scope of the present disclosure.

The embodiments and modifications described above are merely examples of implementations of the present disclosure, and it is to be understood that these examples do not limit the technical scope of the present disclosure. That is, it is possible to realize the present discloser in various forms without departing from the scope or the main features of the present disclosure.

The present disclosure provides an image capturing apparatus in which optical black pixels and AD conversion units are disposed at optimized locations.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-192052 filed Sep. 29, 2017, which is hereby incorporated by reference herein in its entirety.

What is claimed is:

1. An image capturing apparatus comprising:

a first chip; and a second chip laminated on the first chip, the first chip including effective pixels disposed in rows and columns, and optical black pixels disposed in the rows, and including an area having the optical black pixels and a part of the effective pixels disposed in a part of the columns, and one of the part of the effective pixels being adjacent to one of the optical black pixels, the second chip including an AD conversion unit configured to perform AD conversion on a signal output from the optical black pixel, the AD conversion unit including a part overlapping, as seen in plan view, with the optical black pixel, the first chip further including a connection unit for connecting the optical black pixel and the AD conversion unit, and the connection unit being disposed at a location overlapping, as seen in plan view, with the AD conversion unit.

2. The image capturing apparatus according to claim 1, wherein optical black pixels are disposed in a second row across a greater number of columns than the number of columns across which all effective pixels are disposed in the first row, a plurality of AD conversion units are disposed, and one of the plurality of AD conversion units includes a part overlapping, as seen in plan view, with the optical black pixels disposed in the second row.

3. The image capturing apparatus according to claim 2, wherein reference pixels are disposed in a third row across a plurality of columns, the second row is located between the first row and the third row, and one of the plurality of AD conversion units includes a part overlapping, as seen in plan view, with the reference pixels disposed in the third row.

4. The image capturing apparatus according to claim 1, wherein the first row includes an area in which the plurality of optical black pixels are disposed, and a width of the plurality of AD conversion units as seen in a direction along a row of the first row is smaller than a width of the area as seen in the direction.

5. The image capturing apparatus according to claim 1, wherein the first row includes an area in which the plurality of optical black pixels are disposed, and a width of the plurality of AD conversion units as seen in a direction along a row of the first row is greater than a width of the area as seen in the direction.

6. The image capturing apparatus according to claim 1, wherein the first row includes an area in which the plurality of optical black pixels are disposed, and a width of the plurality of AD conversion units as seen in a direction along a row of the first row is equal to a width of the area as seen in the direction.

7. The image capturing apparatus according to claim 1, wherein the AD conversion unit includes a comparator configured to compare a signal output from the optical black pixel with a reference signal.

8. The image capturing apparatus according to claim 1, wherein the optical black pixels are disposed in the first row across a plurality of columns, and the second chip further includes a multiplex circuit configured to select a signal to be output to the AD converter from signals output from the optical black pixels disposed across the plurality of columns.

9. The image capturing apparatus according to claim 8, wherein the multiplex circuit including a part overlapping, as seen in plan view, with the optical black pixels.

10. The image capturing apparatus according to claim 1, wherein a plurality of pixel circuits including the effective pixels and the optical black pixels are disposed in a form of a matrix having J rows and K columns on the first chip, a plurality of electric circuits each including an AD converter are disposed in a form of a matrix having T rows and U columns on the second chip, the first chip includes a first semiconductor layer, in which a plurality of semiconductor devices forming the plurality of pixel circuits are disposed, and a first interconnection structure including wiring layers having an M layer forming the plurality of pixel circuits, the second chip includes a second semiconductor layer, in which a plurality of semiconductor devices forming the plurality of electric circuits are disposed, and a second interconnection structure including wiring layers having an N layer forming the plurality of electric circuits, the first interconnection structure is disposed between the first semiconductor layer and the second interconnection structure, the second interconnection structure is disposed between the first interconnection structure and the second semiconductor layer, a first conductive element, which is included in an M-th wiring layer, as counted from the first semiconductor layer, in the first interconnection structure and which is connected to a first circuit of the plurality of pixel circuits, is electrically connected to a second conductive element which is included in an N-th interconnection layer, as counted from the second semiconductor layer, in the second interconnection structure and which is connected to a second circuit of the plurality of electric circuit, a third conductive element, which is included in the M-th wiring layer and which is connected to a third circuit of the plurality of pixel circuits, is electrically connected to a fourth conductive element which is included in the N-th interconnection layer and which is connected to a fourth circuit of the plurality of electric circuit, a shortest interconnection path of interconnection paths from the second conductive element to the plurality of semiconductor devices forming the plurality of pixel circuits has a first length, and a shortest interconnection path of interconnection paths from the first conductive element to the plurality of semiconductor devices forming the plurality of electric circuits has a second length, a shortest interconnection path of interconnection paths from the fourth conductive element to the plurality of semiconductor devices forming the plurality of pixel circuits has a third length, and a shortest interconnection path of interconnection paths from the third conductive element to the plurality of semiconductor devices forming the plurality of electric circuits has a fourth length, and the sum of the third length and the fourth length is greater than the sum of the first length and the second length, wherein J, K, T and U, each is an integer larger than or equal to 2, and wherein M and N, each is an integer larger than or equal to 1.

11. The image capturing apparatus according to claim 10, wherein the third length is greater than the first length.

12. The image capturing apparatus according to claim 10, wherein the first length is greater than the fourth length.

13. The image capturing apparatus according to claim 1, wherein a plurality of pixel circuits including the effective pixels and the optical black pixels are disposed in a form of a matrix having J rows and K columns on the first chip, a plurality of electric circuits each including an AD converter are disposed in a form of a matrix having T rows and U columns on the second chip, the first chip includes a first semiconductor layer, in which a plurality of semiconductor devices forming the plurality of pixel circuits are disposed, and a first interconnection structure including wiring layers having a M layers forming the plurality of pixel circuits, the second chip includes a second semiconductor layer, in which a plurality of semiconductor devices forming the plurality of electric circuits are disposed, and a second interconnection structure including wiring layers having an N layers forming the plurality of electric circuits, the first interconnection structure is disposed between the first semiconductor layer and the second semiconductor layer, the second interconnection structure is disposed between the second interconnection structure and the second semiconductor layer, a first conductive element, which is included in an M-th wiring layer, as counted from the first semiconductor layer, in the first interconnection structure and which is connected to a first circuit of the plurality of pixel circuits, is electrically connected to a second conductive element which is included in an N-th interconnection layer, as counted from the second semiconductor layer, in the second interconnection structure and which is connected to a second circuit of the plurality of electric circuit, a shortest interconnection path of interconnection paths from the second conductive element to the plurality of semiconductor devices forming the plurality of pixel circuits has a first length, and a shortest interconnection path of interconnection paths from the first conductive element to the plurality of semiconductor devices forming the plurality of electric circuits has a second length, and the first length is greater than the second length.

14. An image capturing system comprising:

the image capturing apparatus according to claim 1; and a signal processing unit configured to generate an image by processing a signal output by the image capturing apparatus.

15. A moving object comprising:

the image capturing apparatus according to claim 1;

a distance information acquisition unit configured to acquire distance information indicating a distance to an object from parallax images based on a signal supplied from the image capturing apparatus; and a control unit configured to control the moving object based on the distance information.

16. The image capturing apparatus according to claim 1 further comprising:

a first signal processing circuit and a second signal processing circuit arranged along a direction of one of the plurality of columns, and each including an input part and the AD conversion unit; and a first connection unit and a second connection unit each being the connection unit, wherein the input part of the first signal processing circuit is connected to the first connection unit, and the input part of the second signal processing circuit is connected to the second connection unit, and wherein, as seen in a plan view, a length between the input part of the first signal processing circuit and the first connection unit is different from a length between the input part of the second signal processing circuit and the second connection unit.

17. The image capturing apparatus according to claim 16, further comprising an optical black pixel area arranged along the direction and including a plurality of optical black pixels arranged in a plurality of rows including the first row, wherein the input part of the first signal processing circuit overlaps, as seen in plan view, with the optical black pixel area.

18. The image capturing apparatus according to claim 17, wherein the input part of the second signal processing circuit overlaps, as seen in plan view, with the optical black pixel area.

19. The image capturing apparatus according to claim 17, further comprising a plurality of signal processing circuits including the first signal processing circuit and the second signal processing circuit, each including the AD conversion unit, wherein the optical black pixel area includes a part area which does not overlap with any one of the plurality of signal processing circuits.

20. The circuit chip according to claim 1 further comprising a plurality of areas each of which is the area, wherein the plurality of areas are disposed in a plurality of rows.

21. The image capturing apparatus according to claim 1, further comprising:

a signal line configured to transfer an output signal from the optical black pixels, wherein the signal line is disposed at a location overlapping with the area.

22. The image capturing apparatus according to claim 21 further comprising a plurality of signal lines arranged corresponding to one column of the optical black pixels.

23. The image capturing apparatus according to claim 22, wherein the plurality of signal lines is disposed at a location overlapping with the one column.

24. The image capturing apparatus according to claim 8, wherein the multiplex circuit includes a part overlapping, as seen in plan view, with the connection unit.

* * * * *